(12) United States Patent
Jung et al.

(10) Patent No.: US 10,490,566 B2
(45) Date of Patent: Nov. 26, 2019

(54) MEMORY DEVICES INCLUDING BLOCKING LAYERS

(71) Applicant: Samsung Electronics Co., Ltd., Suwon-Si, Gyeonggi-do (KR)

(72) Inventors: Won Seok Jung, Anyang-si (KR); Brad H. Lee, Seongnam-si (KR); Sang Woo Jin, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 49 days.

(21) Appl. No.: 15/042,799

(22) Filed: Feb. 12, 2016

(65) Prior Publication Data
US 2016/0343725 A1    Nov. 24, 2016

(30) Foreign Application Priority Data

May 22, 2015 (KR) .................. 10-2015-0072074

(51) Int. Cl.
| | |
|---|---|
| *H01L 27/11573* | (2017.01) |
| *H01L 27/1157* | (2017.01) |
| *H01L 27/11582* | (2017.01) |
| *H01L 27/11575* | (2017.01) |

(52) U.S. Cl.
CPC .... *H01L 27/11573* (2013.01); *H01L 27/1157* (2013.01); *H01L 27/11575* (2013.01); *H01L 27/11582* (2013.01)

(58) Field of Classification Search
CPC ......... H01L 27/11548; H01L 27/11573; H01L 27/11575; H01L 27/11551–11556; H01L 27/11582; H01L 27/11568; H01L 27/11514; H01L 27/11578; H01L 27/11595; H01L 27/11502; H01L 27/11526; H01L 27/11509
See application file for complete search history.

(56) References Cited

U.S. PATENT DOCUMENTS

| | | |
|---|---|---|
| 7,936,004 B2 | 5/2011 | Kito et al. |
| 9,230,979 B1* | 1/2016 | Pachamuthu ..... H01L 27/11575 |
| 2009/0212350 A1 | 8/2009 | Kidoh et al. |

(Continued)

FOREIGN PATENT DOCUMENTS

| | | |
|---|---|---|
| KR | 10-0520609 | 10/2005 |
| KR | 10-2012-0047325 | 5/2012 |

(Continued)

*Primary Examiner* — Monica D Harrison
*Assistant Examiner* — John Lin
(74) *Attorney, Agent, or Firm* — Sughrue Mion, PLLC

(57) ABSTRACT

A memory device includes a cell region and a peripheral circuit region adjacent the cell region. A plurality of gate electrode layers and insulating layers are stacked on the substrate in the cell region, and a plurality of circuit devices are in the peripheral circuit region. A first interlayer insulating layer is on the substrate in the peripheral circuit region and covers the plurality of circuit devices, and a second interlayer insulating layer is on the substrate in the cell region and the peripheral circuit region. A blocking layer is on the plurality of circuit devices between the first and second interlayer insulating layers. The blocking layer is on an upper surface, of the first interlayer insulating layer, and a side surface of the blocking layer is covered by the second interlayer insulating layer.

20 Claims, 51 Drawing Sheets

(56) References Cited

U.S. PATENT DOCUMENTS

| | | | |
|---|---|---|---|
| 2012/0108048 A1* | 5/2012 | Lim | H01L 27/11529 |
| | | | 438/586 |
| 2012/0231619 A1 | 9/2012 | Park et al. | |
| 2013/0017629 A1* | 1/2013 | Pyo | H01L 21/306 |
| | | | 438/16 |
| 2013/0065386 A1* | 3/2013 | Kim | H01L 29/7926 |
| | | | 438/591 |
| 2013/0095635 A1 | 4/2013 | Lee | |
| 2014/0061748 A1 | 3/2014 | Lee | |
| 2014/0131786 A1 | 5/2014 | Ryu et al. | |

FOREIGN PATENT DOCUMENTS

| | | |
|---|---|---|
| KR | 10-2012-0102449 | 9/2012 |
| KR | 10-2013-0042352 | 4/2013 |
| KR | 10-2014-0029703 | 3/2014 |
| KR | 10-2014-0062601 | 5/2014 |

\* cited by examiner

MEMORY DEVICES INCLUDING BLOCKING LAYERS

CROSS-REFERENCE TO RELATED APPLICATION

This application claims the priority and benefit of Korean Patent Application No. 10-2015-0072074 filed on May 22, 2015, with the Korean Intellectual Property Office, the disclosure of which is incorporated herein by reference.

BACKGROUND

The present inventive concept relates to memory devices including blocking layers and methods of fabricating memory devices including blocking layers.

Electronic products are continually being miniaturized, and at the same time are being required to process ever greater amounts of data. Accordingly, it is desirable to increase the integration of semiconductor memory devices used in such electronic products, To further the integration of semiconductor memory devices, memory devices having a vertical transistor structure, as opposed to a planar transistor structure, have been proposed.

SUMMARY

A memory device according to some embodiments of the inventive concepts includes a blocking layer that can both act as an etch stop during device fabrication and that can also reduce or prevent mobile charges from flowing into circuit devices that are disposed in a peripheral circuit region.

According to some embodiments of the present inventive concepts, a memory device may include a cell region including a channel area extending in a direction perpendicular to an upper surface of a substrate, and a plurality of gate electrode layers and insulating layers stacked on the substrate to be adjacent to the channel area, a peripheral circuit region being adjacent to the cell region, and including a plurality of circuit devices disposed on the substrate and a blocking layer disposed on the plurality of circuit devices, and an interlayer insulating layer including a first interlayer insulating layer disposed on the substrate in the peripheral circuit region and covering the plurality of circuit devices, and a second interlayer insulating layer disposed on the substrate in the cell region and the peripheral circuit region. The blocking layer is disposed on an upper surface of the first interlayer insulating layer, and a side surface of the blocking layer is covered by the second interlayer insulating layer in the peripheral circuit region.

According to further embodiments of the present inventive concepts, a memory device may include a substrate, a channel area extending in a direction perpendicular to an upper surface Of the substrate, a plurality of gate electrode layers stacked on the substrate to be adjacent to the channel area, a plurality of circuit devices disposed to be adjacent to the plurality of gate electrode layers on the substrate, a first interlayer insulating layer cove mg the plurality of circuit devices and including a first surface substantially parallel to the upper surface of the substrate and a second surface connecting the first surface and the upper surface of the substrate, a blocking layer disposed on the first surface and the second surface, and a second interlayer insulating layer disposed on the blocking layer and the plurality of gate electrode layer.

The plurality of gate electrode layers may include a first gate electrode layer, and the memory device may include a first insulating layer between the first gate electrode layer and the substrate. The second blocking layer may include a portion of the first gate electrode layer.

A portion of the first insulating layer may be between the second blocking layer and the first interlayer insulating layer. In some embodiments, a portion of the first insulating layer may be between the first blocking layer and the first interlayer insulating layer. The first blocking layer may include a portion of the first gate electrode layer.

A memory device according to further embodiments of the inventive concepts includes a cell region including a plurality of alternating gate electrode layers and insulating layers stacked on the substrate, a peripheral circuit region adjacent to the cell region and including a plurality of circuit devices on the substrate, a first interlayer insulating layer on the substrate in the peripheral circuit region and covering the plurality of circuit devices, a blocking layer on the upper surface of the first interlayer insulating layer, and a second interlayer insulating layer on the substrate in the cell region and the peripheral circuit region. The second interlayer insulating layer covers the first interlayer insulating layer in the peripheral circuit region, the blocking layer is between the first interlayer insulating layer and the second, interlayer insulating layer, and a side surface of the blocking layer facing the cell region is covered by the second interlayer insulating layer.

BRIEF DESCRIPTION OF DRAWINGS

The above and other aspects, features and advantages of the present inventive concept will be more clearly understood from the following detailed description taken in conjunction with the accompanying drawings, in which.

DETAILED DESCRIPTION

Figure 1:
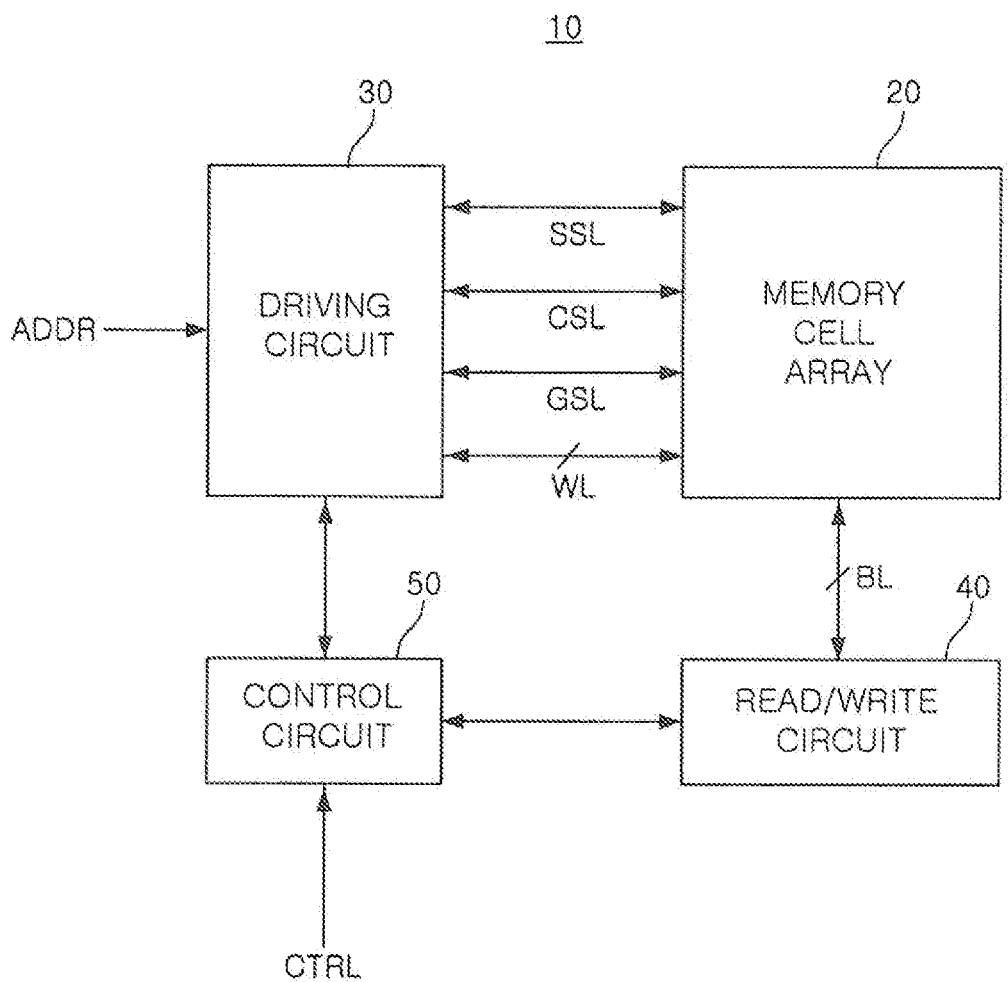
FIG. 1 is a schematic block diagram illustrating a memory device according to an exemplary embodiment of the present inventive concept.

Exemplary embodiments of the present inventive concepts will now be described in detail with reference to the accompanying drawings.

The inventive concepts may, however, be exemplified in any different forms and should not be construed as being limited to the specific embodiments set forth herein. Rather, these embodiments are provided so that this disclosure will be thorough and complete, and will fully convey the scope of the inventive concept to those skilled in the art.

In the drawings, the shapes and dimensions of elements May be exaggerated for clarity, and the same reference numerals will be used throughout to designate the same or like elements.

FIG. 1 is a schematic block diagram illustrating a memory device according to an exemplary embodiment of the present inventive concept.

Referring to FIG. 1, a memory device 10 according to the exemplary embodiment of the present inventive concept may include a memory cell array 20, a driving circuit 30, a read/write circuit 40, and a control circuit 50.

The memory cell array 20 may include a plurality of memory cells, and the plurality of memory cells may be arranged in a plurality of rows and columns. The plurality of memory cells included in the memory cell array 20 may be connected to the driving circuit 30 through a word line WL, a common source line CSL, a string select line SSL, a ground select line GSL, and the like, and to the read/write circuit 40 through a bit line BE In some exemplary embodiments, the plurality of memory cells arranged on the same row may be connected to the same word line WL, and the plurality of memory cells arranged m the same column may be connected to the same bit line BL.

The plurality of memory cells included in the memory cell array 20 may be divided into a plurality of memory blocks. Each memory block may include a plurality of word lines WL, a plurality of string select lines SSL, a plurality of ground select lines GSL, a plurality of bit lines EL, and at least one common source line CSL.

The driving circuit 30 and the read/write circuit 40 may be operated by the control circuit 50. In some exemplary embodiments, the driving circuit 30 may select at least a portion of the word lines WL, the common source lines CST, the string select lines SSL, and the ground select lines GSL, connected to a memory cell array, by receiving address information ADDR from the outside and decoding the received address information ADDR. The driving circuit 30 may include a driving circuit for each of the word lines WL, the string select lines SSL, and the common source lines CSL.

The read/write circuit 40 may select at least a portion of the bit lines BL connected to the memory cell array 20 according to a command received from the control circuit 50. The read/write circuit 40 may read data stored in a memory cell connected to the selected portion of the bit lines BL, or write in the memory cell connected to the selected portion of the bit lines BL. The read/write circuit 40 may include a circuit, such as a page buffer, an input/output buffer, and a data latch, in order to perform the above-described operations.

The control circuit 50 may control operations of the driving circuit 30 and the read/write circuit 40 in response to a control signal transmitted from the outside. When data stored in the memory cell array 20 is read, the control circuit 50 may control an operation of the driving circuit 30 so as to supply a voltage for the reading operation to a word line WL in which data to be read is stored. When the voltage for the reading operation is supplied to a specific word line WL, the control circuit 50 may control the read/write circuit 40 to read data stored in the memory cell connected to the word line WL to which the voltage for the reading operation is supplied.

Meanwhile, when data is to be written in the memory cell array 20, the control circuit 50 may control an operation of the driving circuit 30 so as to supply a voltage for the writing operation to a word line WL in which the data is to be written. When the voltage for the writing operation is supplied to a specific word line WL, the control circuit 50 may control the read/write circuit 40 to write the data to a memory cell connected to the word line WL to which the voltage for the writing operation is supplied.

Figure 2A:
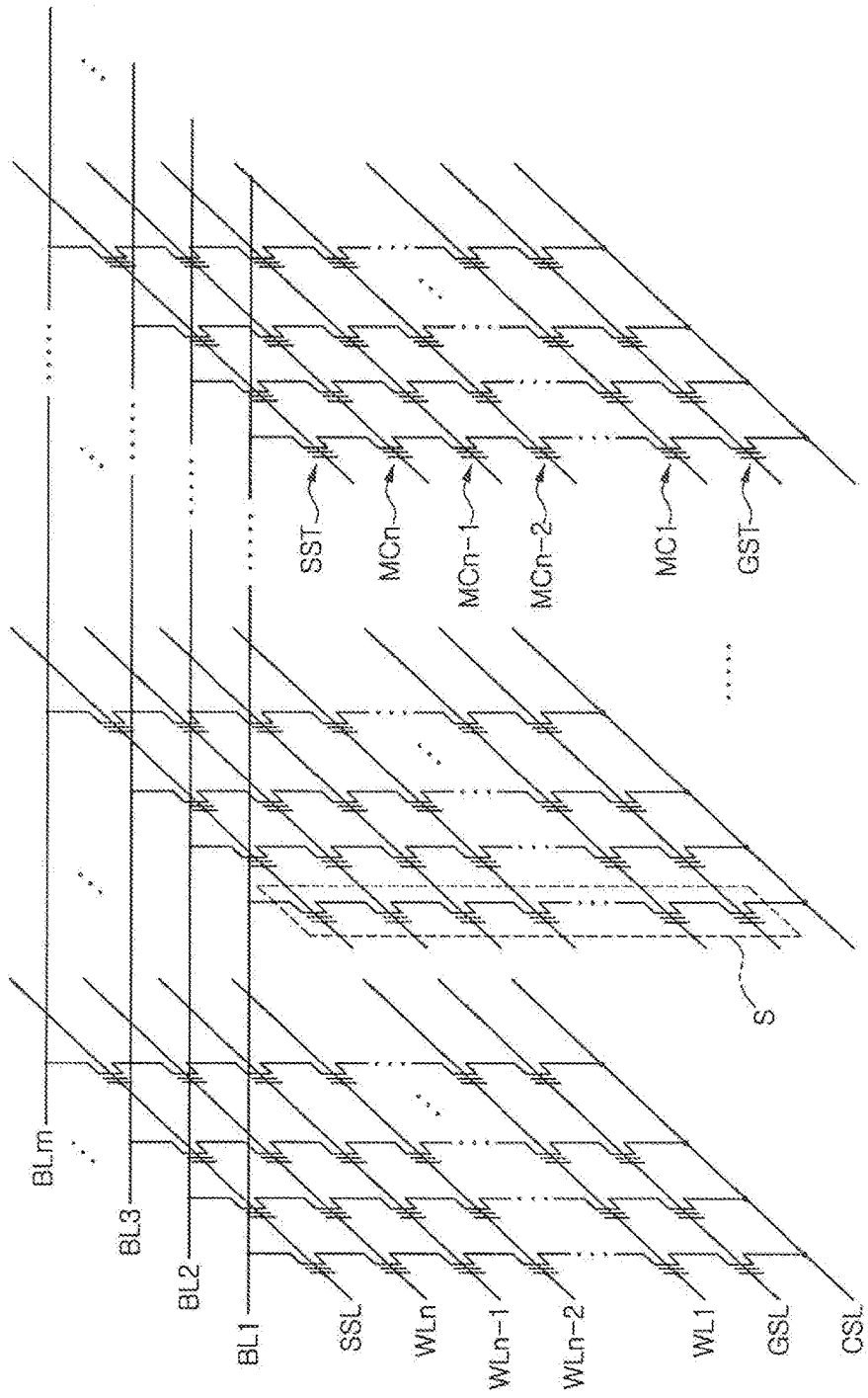
FIGS. 2A to 2C are circuit diagrams of a memory cell array included in a memory device according to an exemplary embodiment of the present inventive concept.
Figure 2B:
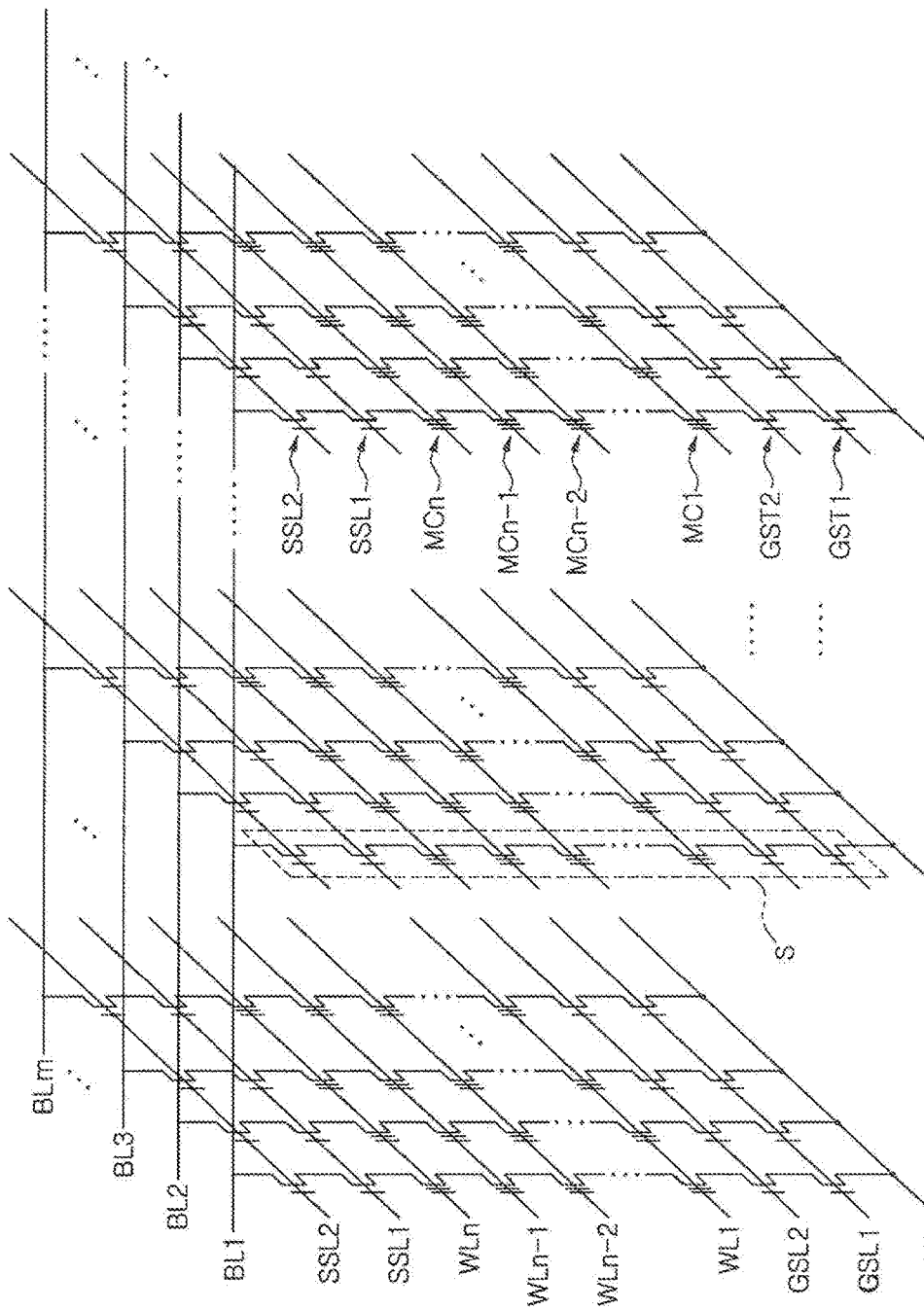
Figure 2C:
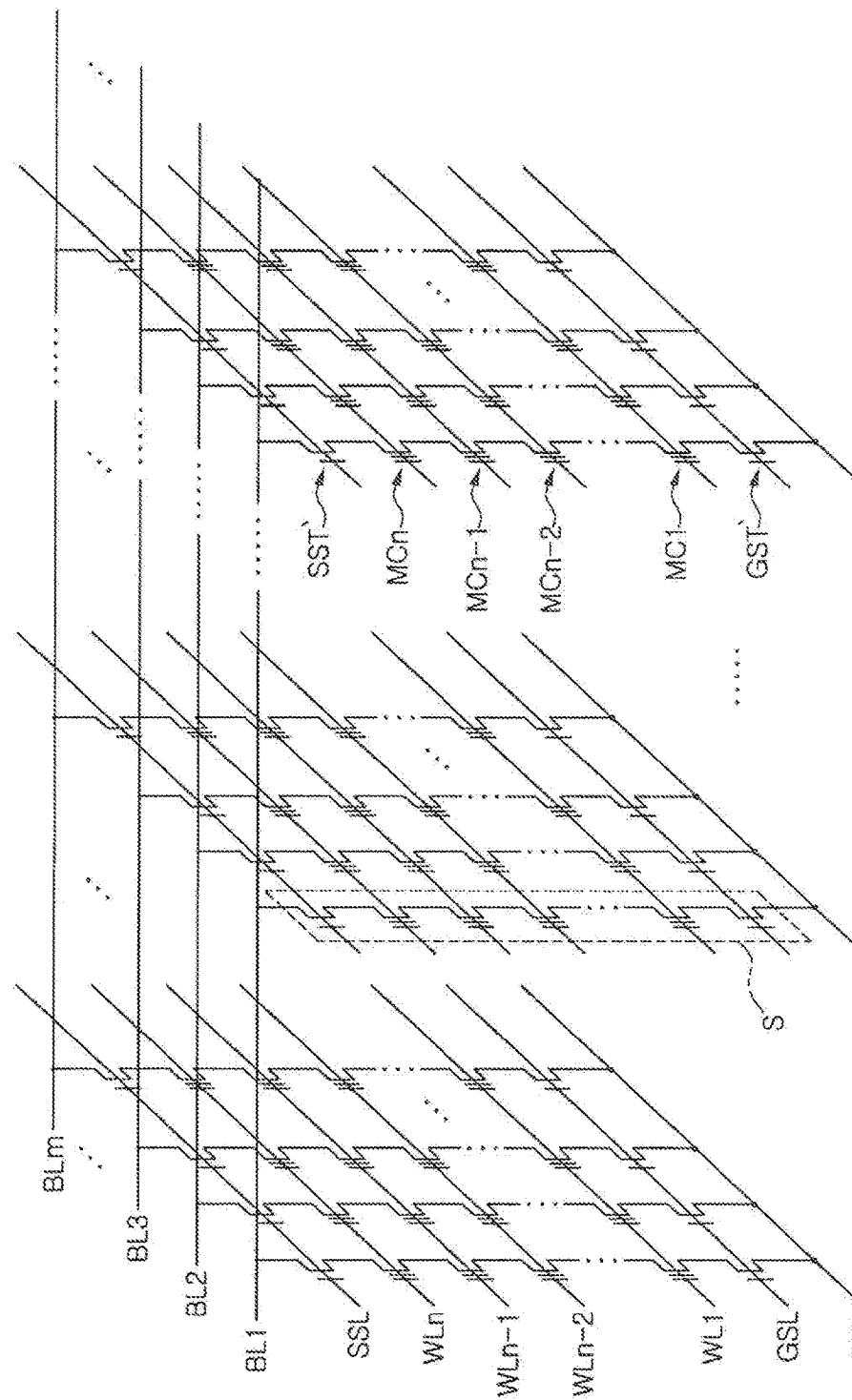

FIGS. 2A to 2C are equivalent circuit diagrams of a memory cell array included in a memory device according to an exemplary embodiment of the present inventive concept.

Referring to FIG. 2A, the memory cell array according to the exemplary embodiment of the present inventive concept may include a plurality of memory cell strings S. Each of the memory cell strings S include n memory cell devices MC1 to MCn connected to each other in series, and a ground select transistor GST and a string select transistor SST respectively connected to both ends of the memory cell devices MC1 to MCn.

The n memory cell devices MC1 to MCn connected to each other in series may be respectively connected to word lines WL1 to WLn for selecting at least a portion of the memory cell devices MC1 to MCn.

A gate terminal of the ground select transistor GST may be connected to a ground select line GSL, and a source terminal of the ground select transistor GST may be connected to a common source line CSL. A gate terminal of the string select transistor SST may be connected to a string select line SSL, and a source terminal of the string select transistor SST may be connected to a drain terminal of a memory cell device Men. In FIG. 2A, one ground select transistor GST and one string select transistor SST are connected to the n memory cell devices MC1 to MCn that are connected to each other in series. However, a plurality of ground select transistors GST or a plurality of string select transistors SST may be connected to the a memory cell devices MC1 to MCn, or the ground select transistor GST or the string select transistor SST may have a different structure from the n memory cell devices MC1 to MCn.

For example, referring to an equivalent circuit diagram of a memory cell array illustrated in FIG. 2B, a plurality of ground select transistors GST1 and GST2 and a plurality of string select transistors SST1 and SST2 may be included in one memory cell string S. In addition, referring to FIG. 2C, a ground select transistor GST' and a string select transistor SST' may not include a floating gate, in contrast to the memory cell devices MC1 to MCn.

A drain terminal of the string select transistor SST may be connected to a plurality of bit lines BL1 to BLm. When a signal is applied to the gate terminal of the string select transistor SST through the string select line SSL, the signal applied through the bit lines BL1 to BLm is transmitted to the n memory cell devices MC1 to MCn connected to each other in series, and a data read or data writing operation may be performed. In addition, when the source terminal applies a signal to the gate terminal of the ground select transistor GST connected to the common source line CSL through the ground select line GSL, an erase operation in which charges stored in the n memory cell devices MC1 to MCn are fully removed may be performed.

Figure 3:
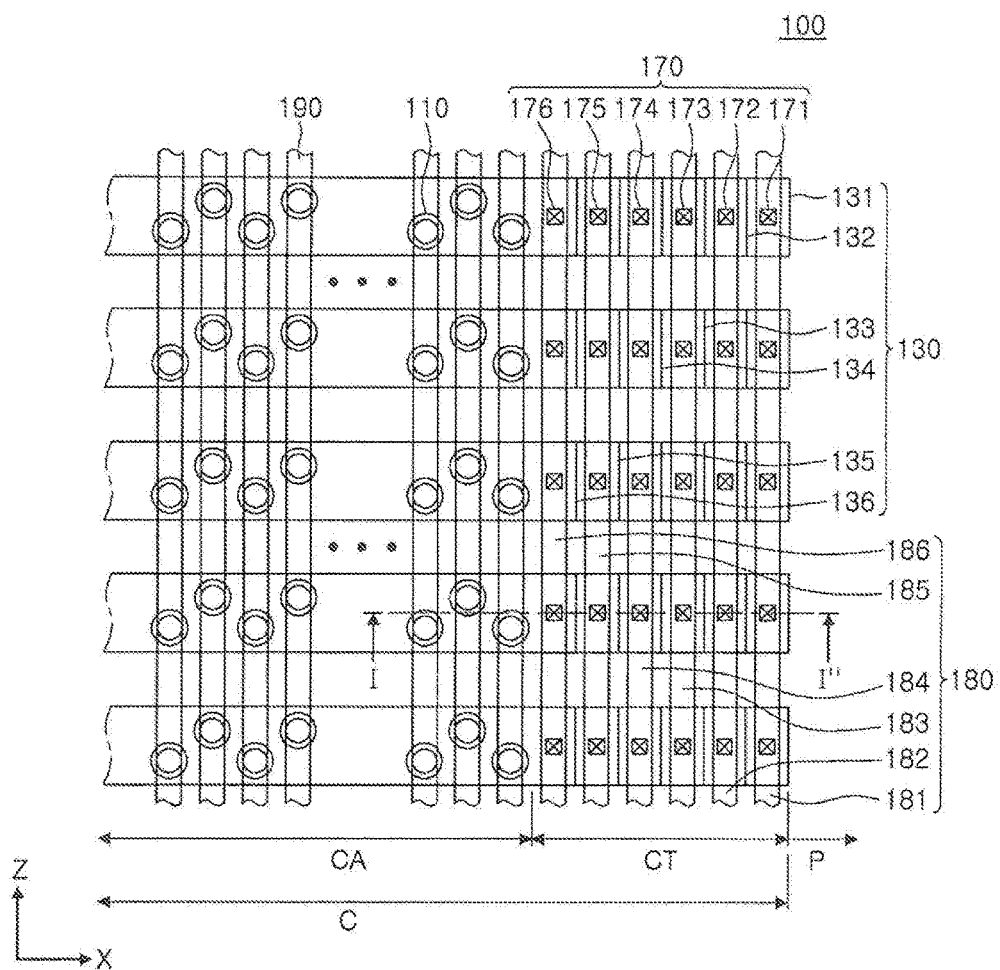
FIG. 3 is a plan view illustrating a structure of a memory device according to an exemplary embodiment of the present inventive concept.

FIG. 3 is a plan view illustrating a structure of a memory device according to an exemplary embodiment of the present inventive concept.

Referring to FIG. 3, a memory device 100 according to the exemplary embodiment of the present inventive concept may include a cell region C and a peripheral circuit region P. In some exemplary embodiments, the cell region C may include a cell array region CA in which a plurality of channel areas 110 are formed, and a connection region CT in which a plurality of gate electrode layers 131 to 136 (generally denoted 130) are connected to a plurality of contact plugs 170 to 176 (generally denoted 170). Meanwhile, the peripheral circuit region P may be formed in an external region of the connection region CT of the cell region C. and a plurality of circuit devices, such as a plurality of horizontal transistors, may be disposed in the peripheral circuit region P.

In the cell region C, a plurality of memory cells, and a plurality of bit lines 190 and gate electrode layers 130 that are electrically connected to the memory cells, may be disposed. The plurality of gate electrode layers 130 may include a conductive material and extend in one direction. In FIG. 3, the plurality of gate electrode layers 130 are illustrated as extending in an x-axis direction. The plurality of bit lines 190 may extend in another direction intersecting the direction in which the plurality of gate electrode layers 130 extend. In FIG. 3, the plurality of plurality of bit lines 190 axe illustrated as extending in a y-axis direction intersecting the x-axis direction.

The plurality of gate electrode layers 130 may be stacked in a z-axis direction perpendicular to an x-y plane defined by the x-axis and y-axis and form word lines. Some gate electrode layers 130 disposed at the same height in the z-axis direction may be electrically connected to each other by a plurality of interconnection lines 181 to 186 (generally denoted 180). In order to connect the gate electrode layers 130 disposed at the same height in the z-axis direction through the interconnection lines 180, a plurality of contact plugs 170 extending in the z-axis direction may be formed.

The plurality of channel areas 110 may be disposed in the plurality of gate electrode layer's 130 in zigzag form, and each channel area 110 may be electrically connected to the bit line 190. Since the plurality of channel areas 110 are disposed in the gate electrode layers 130 in zigzag form, the number of channel areas 110 disposed in the gate electrode layers 130 may increase.

The connection region CT is disposed between the cell array region CA and the peripheral circuit region P. In the connection region CT, the plurality of gate electrode layers 130 extending from the cell array region CA in one direction (the x-axis direction) and the plurality of contact plugs 170 connected to the plurality of gate electrode layers 130 may be disposed. A length of each of the plurality of gate electrode layers extending in the same direction may be gradually shortened by a predetermined amount from a lowermost gate electrode layer 131 toward an uppermost gate electrode layer 136 in the z-axis direction perpendicular to the x-y plane. As the length of each of the plurality of gate electrode layers extending in the direction is gradually shortened from the lowermost gate electrode layer 131 toward the uppermost gate electrode layer 136, a step may be formed between each of the plurality of gate electrode layers 130 and an adjacent gate electrode layer 130 in a direction in which the gate electrode layers 130 are stacked.

The peripheral circuit region P may be disposed outside of the connection region CT. In the peripheral circuit region P, circuits for operating the memory cells, circuits for reading information stored in the memory cells, and the like may be disposed. In some exemplary embodiments, the peripheral circuit region P may include a plurality of circuit devices, and. the plurality of circuit devices included m the peripheral circuit region P may include one or more horizontal transistors.

FIGS. 4 to 8 are perspective views illustrating structures of memory devices according to exemplary embodiments of the present inventive concept.

Figure 4:
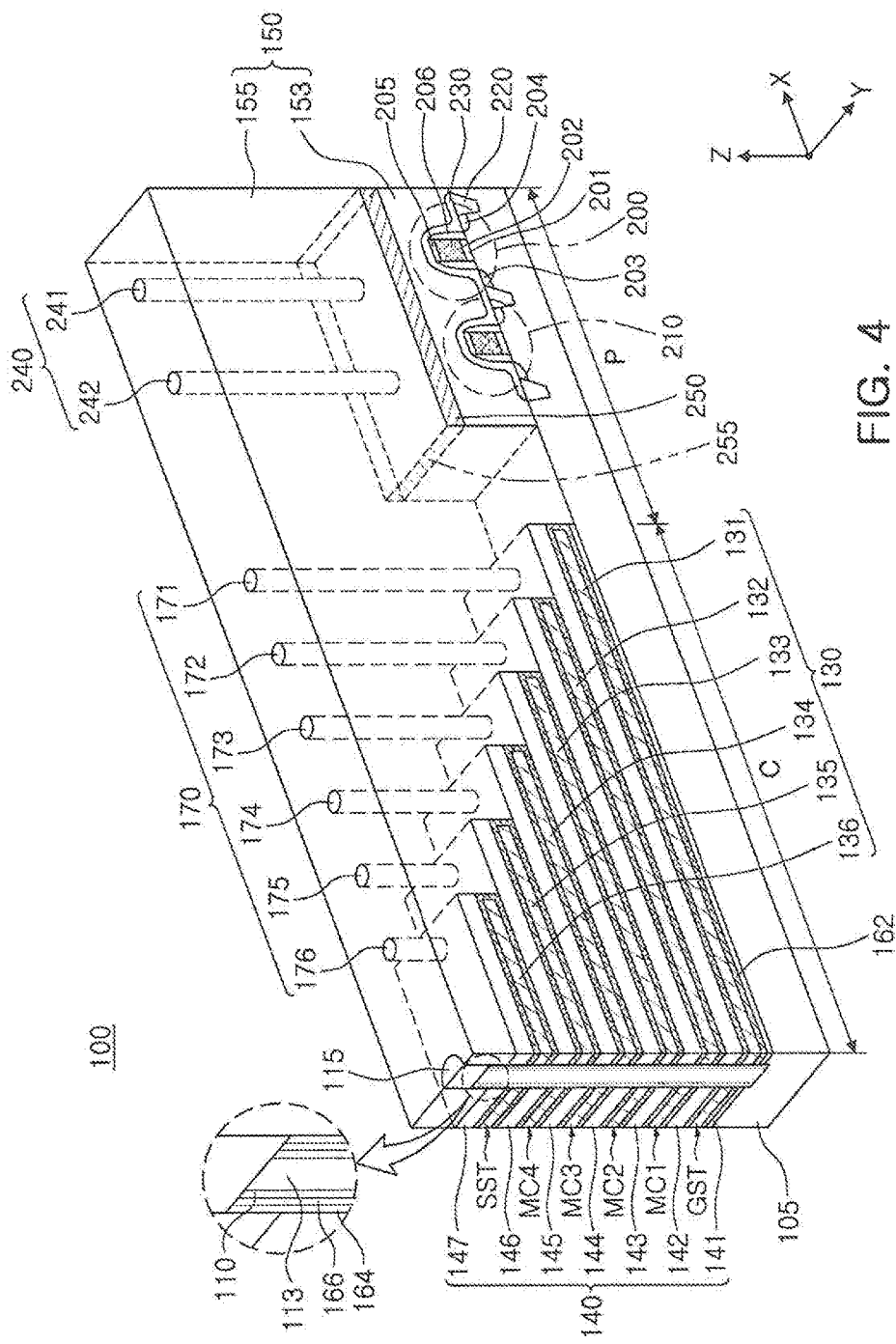
FIGS. 4 to 8 are perspective views illustrating structures of memory devices according to exemplary embodiments of the present inventive concept.

FIG. 4 is a perspective view illustrating a structure of a memory device 100 according to an exemplary embodiment of the present inventive concept. In some exemplary embodiments, the memory device 100 illustrated in FIG. 4 may illustrate a section taken along line I-I' of the memory device 100 illustrated in FIG. 3. In FIG. 4, some elements included in the memory cell illustrated in FIGS. 2A to 2C and FIG. 3 may be omitted. For example, the bit lines 190 and the interconnection lines 180 illustrated in FIG. 3 may be omitted in FIG. 4.

Referring to FIG. 4, the memory device 100 may include a plurality of gate electrode layers 131 to 136 (generally denoted 130) stacked on an upper surface of substrate 105 in the z-axis direction, and a plurality of insulating layers 141 to 147 (generally denoted 140) disposed between the plurality of gate electrode layers 130. The plurality of gate electrode layers 130 and the plurality of insulating layers 140 may extend in one direction (the x-axis direction in FIG. 4). The cell region C may further include a channel area 110 extending in the z-axis direction and being adjacent to the plurality of gate electrode layers 130 and the plurality of insulating layers 140. The channel area 110 may be formed in a cavity having a circular cross-section, and an embedded insulating layer 113 may be formed in the channel area 110 having an annular shape whose center portion is empty. A conductive layer 115 may be formed on the channel area 110, and the bit line 190 (refer to FIG. 3) may be connected to the channel area 110 through the conductive layer 115. The conductive layer 115 is provided as a drain area.

A gate insulating layer including a blocking layer 162, a charge storage layer 164, and a tunneling layer 166 may be disposed between the channel area 110 and the gate electrode layers 130. According to the structure of the memory device 100, all of the blocking layer 162, the charge storage layer 164, and the tunneling layer 166 may be disposed to surround the gate electrode layers 130. Otherwise, a portion of the gate insulating layer may extend in the z-axis direction parallel to the channel area 110 to be disposed outside of the channel area 110, and the other portion of the gate insulating layer may be disposed to surround the gate electrode layers 130. In the exemplary embodiment illustrated in FIG. 4, the charge storage layer 164 and the tunneling layer 166 are disposed outside of the channel area 110 to extend in the z-axis direction parallel to the channel area 110, and the blocking layer 162 is disposed to surround the gate electrode layers 130.

The blocking layer 162 may include silicon oxide ($SiO_2$), silicon nitride ($Si_3N_4$), silicon oxynitride (SION), or a high-k dielectric material. The high dielectric material may be one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). When the blocking layer 162 includes a high-k dielectric material, the term "high-k" may be interpreted as having a meaning that a dielectric constant of the blocking layer 162 is higher than a dielectric constant of the tunneling layer 166.

Meanwhile, the blocking layer 162 may selectively include a plurality of layers having different dielectric constants. By disposing a layer having a relatively low dielectric constant to be closer to the channel area 110 than a layer having a relatively high dielectric constant, an energy band such as a height of a barrier may he controlled to improve characteristics of the memory device 100, such as the erase characteristics of the memory device 100.

The charge storage layer 164 may be a charge trapping layer or a floating gate conductive layer. When the charge storage layer 164 is the floating gate, it may be formed, by depositing polysilicon using, for example, a low pressure chemical vapor deposition LPCVD) method. When the charge storage layer 164 is the charge trapping layer, it may include at least one of $SiO_2$, $Si_3N_4$, SiON, $HfO_2$, $ZrO_2$, $Ta_2O_3$, $TiO_2$, $HfAl_xO_y$, $HfTa_xO_y$, $HfSi_xO_y$, $Al_xN_y$, and $AlGa_xN_y$.

The tunneling layer 165 may include at least one of $SiO_2$, $Si_3N_4$, SiON, $HfO_2$, $HfSi_xO_y$, $Al_2O_3$ and $ZrO_2$.

Each of the gate electrode layers 130 and insulating layers 140 may extend from other gate electrode layers 130 and other insulating layers 140 stacked at different positions in the z-axis direction at different lengths to form a plurality of stair-like steps. The steps formed by the plurality of gate electrode layers 130 and insulating layers 140 extended at different lengths in the x-axis direction may provide a plurality of pad areas. In FIG. 4, the insulating layers 140 are illustrated as being disposed on the gate electrode layers 130 in the z-axis direction, in each pad area. In contrast, in some embodiments, the gate electrode layers 130 may be disposed to be higher than the insulating layers 140.

The peripheral circuit region P may be a region defined in a peripheral region of the cell region C, and the plurality of circuit devices may be disposed in the peripheral circuit region. The plurality of circuit devices disposed in the peripheral circuit region P may provide the driving circuit 30, the read/write circuit 40, and the control circuit 50 illustrated in FIG. 1, and may include one or more horizontal transistors 200 and 210. Although two horizontal transistors 200 and 210 are illustrated in FIG. 4, the number of horizontal transistors 200 and 210 may not be limited thereto.

Referring to FIG. 4, each of the horizontal transistors 200 and 210 included in the peripheral circuit region P may include a horizontal gate insulating layer 201, a horizontal gate electrode 202, a horizontal source electrode 203, and a horizontal drain electrode 204. The positions of the horizontal source electrode 283 and the horizontal drain electrode 204 may be exchanged in contrast to that illustrated in FIG. 4, and the horizontal gate electrode 202 may include at least one of polysilicon, a metal (e.g. tungsten or molybdenum), and a metal suicide, in other exemplary embodiments, the horizontal gate electrode 202 may have a structure in which a polysilicon layer and a metal silicide layer are stacked.

A capping layer 205 and a gate spacer 206 are respectively disposed on an upper surface and side surfaces of the horizontal gate electrode 202. The capping layer 205 disposed on the upper surface of the horizontal gate electrode 202 may include silicon nitride, and the gate spacer 206 disposed on the side surfaces of the horizontal gate electrode 202 may include at least one of silicon nitride and silicon oxide.

In some exemplary embodiments, the capping layer 205 and the gate spacer 206 may be formed at the same time in a single process. After the horizontal gate electrode 202 is formed, a silicon oxide layer may be deposited to have a thickness of 500 to 600 Å on the horizontal gate electrode 202 using a middle temperature oxide (MTO) deposition process. Next, the silicon oxide layer deposited on the horizontal gate electrode 202 is etched using an etchback process to form the capping layer 205 and the gate spacer 206.

A device protection layer 230 including an silicon oxide layer or the like may be disposed on the capping layer 205 and the gate spacer 206, and a device isolation layer 220 may be disposed outwardly of the horizontal source electrode 203 and the horizontal drain electrode 204. The device protection layer 230 may be formed by depositing the silicon oxide layer to have a thickness of about 50 Å using an MTO process.

Similar to the gate electrode layers 130 connected to the contact plugs 170 in the cell region C, the horizontal gate electrode 202 may be connected to a peripheral contact plug 240. However, the arrangement of the horizontal gate electrode 202, the device isolation layer 220, and the peripheral contact plug 240 may not be limited to the configuration illustrated in FIG. 4.

A memory device 100 according to the exemplary embodiment of the present inventive concept may include an interlayer insulating layer 150 disposed on the substrate 105 in the cell region C and the peripheral circuit region P. The interlayer insulating layer 150 may include a first interlayer insulating layer 153 and a second interlayer insulating layer 155. The first interlayer insulating layer 153 may cover the plurality of horizontal transistors 200 and 210 in the peripheral circuit region P. In some exemplary embodiments, the first interlayer insulating layer 153 may only be formed in the peripheral circuit region P. In particular, the first interlayer insulating layer 153 may only be formed in a portion of the peripheral circuit region P at which the horizontal transistors 200 and 210 are disposed. The first interlayer insulating layer 153 may fill a space formed between the plurality of horizontal transistors 200 and 210. Accordingly, the first interlayer insulating layer 153 may include a material with excellent gap-filling properties, such as a high deposition plasma (HDP) oxide layer.

The second interlayer insulating layer 155 may be disposed on the substrate 105 throughout the cell region C and the peripheral circuit region P. In the cell region C, the second interlayer insulating layer 155 may be formed on the pad areas formed by the plurality of gate electrode layers 130 that extend at different lengths in a same direction (e.g., the x-axis direction in FIG. 4) and the insulating layers 140 in the peripheral circuit region P the second interlayer insulating layer 155 may be formed. on the first interlayer insulating layer 153.

The second interlayer insulating layer 155 may be formed by a physical vapor deposition (PVD) process, a chemical vapor deposition (CVD) process, a sub-atmospheric chemical vapor deposition (SACVD) process, a low pressure chemical vapor deposition (LPCVD) process, a plasma enhanced chemical vapor deposition (PECDV) process, and the like. In some exemplary embodiments, the second interlayer insulating layer 155 may include a tetra-ethyl-orthosilicate (TEOS) oxide layer having a relatively high deposition rate. The gap-filling ability of the second interlayer insulating layer 155 may be less than that of the first interlayer insulating layer 153, however.

A blocking layer 250 may be disposed between the first interlayer insulating layer 153 and second interlayer insulating layer 155. The blocking layer 250 may include a material, such as silicon nitride, that is different from the material of the interlayer insulating layers and that has an etch selectivity relative to the material of the interlayer insulating layers. The blocking layer 250 may serve to prevent the horizontal transistors 200 and 210 from being damaged due to excessive etching of the interlayer insulating layer 150 during a process of fabricating the memory device. In addition, the blocking layer 250 may reduce or prevent mobile charges from flowing into the horizontal transistors 200 and 210. Since the blocking layer 250 is disposed on the first interlayer insulating layer 153, blocking layer 250 may have a surface that is substantially parallel to an upper surface of the substrate 105. In addition, the blocking layer 250 may only be formed in the peripheral circuit region P.

In the process of manufacturing the memory device 100, the blocking layer 250 may be formed after the horizontal transistors 200 and 210 the device protection layer 230, and the first interlayer insulating layer 153 are formed. In some exemplary embodiments, the blocking layer 250 may be formed by filling the space between the horizontal transistors 200 and 210 with the first interlayer insulating layer 153 and planarizing an upper surface of the first interlayer it layer 153 by performing a chemical and mechanical polishing (CMP) process. Since the space between the horizontal transistors 200 and 210 is first filled with the first interlayer insulating layer 153 which has excellent gap-filling properties, the generation of voids in the space between the horizontal transistors 200 and 210 may be reduced or prevented. Meanwhile, since the second interlayer insulating layer 155 is formed after the blocking layer 250 is formed, at least one side surface 255 of the blocking layer 250 may be covered by the second interlayer insulating layer 155 in the peripheral circuit region P.

The first interlayer insulating layer 153 may have a relatively smaller thickness than the second interlayer insulating layer 155. For example, the thickness of the first interlayer insulating layer 153 may be equal to about ⅟20 to about ⅟10 of the thickness of the second interlayer insulating layer 155. The thicknesses of the first interlayer insulating layer 153 and the second interlayer insulating layer 155 included in the interlayer insulating layer 150 may vary across the substrate according to the thicknesses of the plurality of gate electrode layers 130 and insulating layers 140 included in the memory device 100 and the number of stacked gate electrode layers 130 and insulating layers 140.

The second interlayer insulating layer 155 may be formed by a single process performed after the pad areas are formed. Accordingly, the second interlayer insulating layer 155 may have the same quality throughout the cell region C and the peripheral circuit region P.

Meanwhile, four memory cells MC1 to MC4, one string select transistor SST, and one ground select transistor GST are illustrated in FIG. 4, but the present embodiment is not limited thereto, and the number of memory cells and the numbers of the string select transistor SST and the ground select transistor GST may be more or less. In addition, the memory cells MC1 to MC4, the string select transistor SST, and the ground select transistor GST are illustrated as having the same structure, but the string select transistor SST and the ground select transistor UST may have a different structure from the memory cells MC1 to MC4. For example, the insulating layers 140 disposed between the gate electrode layers 130 and the gate electrode layers 130 included in the string select transistor SST, the ground select transistor GST, and the memory cells MC1 to MC4 may have a different structure from each other.

Figure 5:
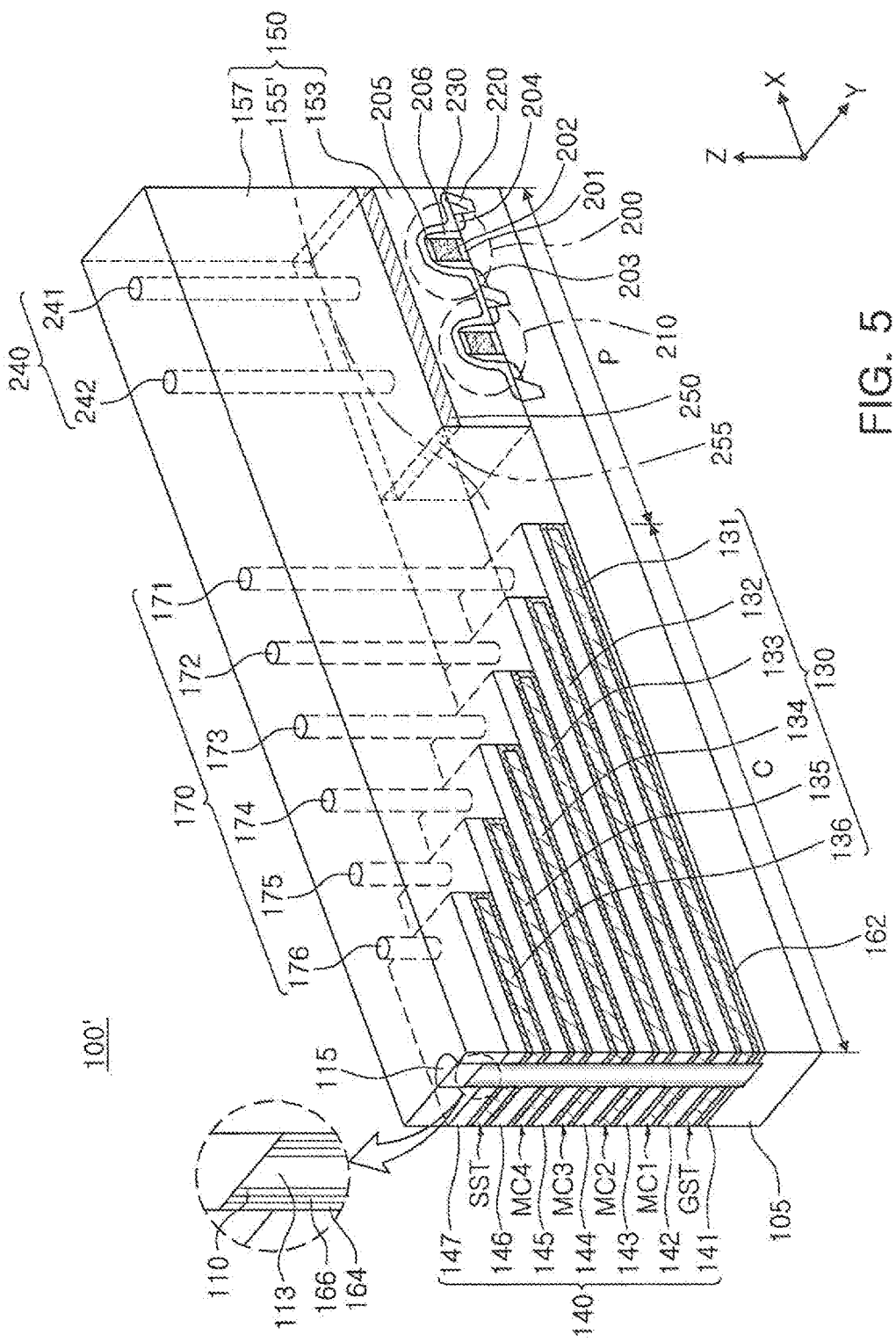

FIG. 5 is a perspective view illustrating a memory device 100' according to an exemplary embodiment of the present inventive concept.

Some components included in the memory device 100' according to the exemplary embodiment illustrated in FIG. 5 of the present inventive concept may be similar to the memory device 100 illustrated in FIG. 4. However, in the exemplary embodiment illustrated in FIG. 5 of the present inventive concept, the interlayer insulating layer 150 may include the first interlayer insulating layer 153, a second interlayer insulating layer 155', and a third interlayer insulating layer 157.

The second interlayer insulating layer 155' may be disposed between the first interlayer insulating layer 153 and the gate electrode layers 130, and may include an HDP oxide layer having excellent gap-filling properties similar to the first interlayer insulating layer 153, An upper surface of the second interlayer insulating layer 155' may be coplanar with respect to an upper surface of the blocking layer 250, and the third interlayer insulating layer 157 may be disposed on the upper surfaces of the second interlayer insulating layer 155' and the blocking layer 250. In the exemplary embodiment illustrated in FIG. 5, at least one side surface 255 of the blocking layer 250 may be covered by the second interlayer insulating layer 155'.

Figure 6:
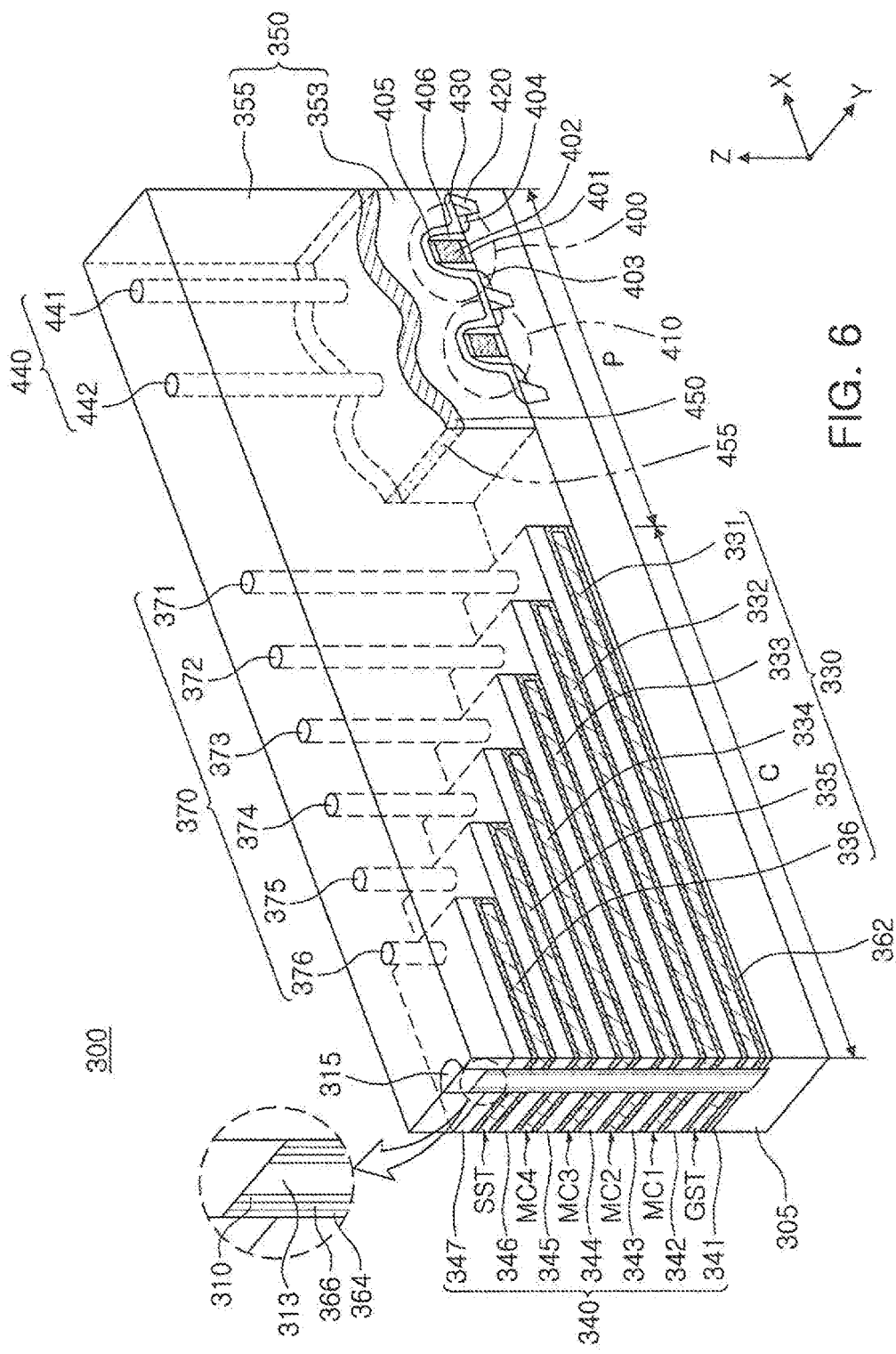

FIG. 6 is a perspective view illustrating a memory device 300 according to a different exemplary embodiment of the present inventive concept from those illustrated in FIGS. 4 and 5.

Referring to FIG. 6, a channel area 310, memory cells MC1 to MC4, a string select transistor SST, a ground select transistor GST, a plurality of gate electrode layers 331 to 336 (generally denoted 330), and a plurality of contact plugs 371 to 376 (generally denoted 370) respectively connected to the plurality of gate electrode layers 330 may be similar to the memory devices 100 and 100' according to the exemplary embodiment illustrated in FIGS. 4 and 5. However, in the exemplary embodiment illustrated in FIG. 6, a first interlayer insulating layer 353 may have a curved surface corresponding to the shape of a plurality of horizontal transistors 400 and 410. in addition, an blocking layer 450 formed on an upper surface of the first interlayer insulating layer 353 may also have a curved surface.

Similarly to the exemplary embodiments illustrated in FIGS. 4 and 5, referring to FIG. 6, the plurality of gate electrode layers 330 and a the plurality of insulating layers 340 stacked in the z-axis direction may extend in one direction (the x-axis direction) to provide pad areas. The uppermost gate electrode layer 336 and insulating layer 347 extend to have the shortest length in the horizontal (x-axis) direction, and the lowermost gate electrode layer 331 and insulating layers 341 and 342, disposed closest to an upper surface of the substrate 305, may extend to have the longest length in the horizontal direction. The insulating layer 341, which has a relatively smaller thickness than the other insulating layers 342 to 347, may be additionally formed between the lowermost gate electrode layer 331 in the vertical direction and the substrate 305.

In the peripheral circuit region P, the plurality of horizontal transistors 400 and 410 may be disposed as circuit devices, and each of the horizontal transistors 400 and 410 may include a horizontal gate insulating layer 401, a horizontal gate electrode 402, a horizontal source electrode 403, and a horizontal drain electrode 404. Positions of the horizontal source electrode 403 and the horizontal drain electrode 404 may be opposite to those illustrated in FIG. 6, and a device isolation layer 420 may be disposed outside of the horizontal source electrode 403 and the horizontal drain electrode 404. he horizontal transistor 400 disposed in the peripheral circuit region P may be connected to a peripheral contact plug 440.

A second interlayer insulating layer 355 may be disposed on the first interlayer insulating layer 353. The second interlayer insulating layer 355 may cover the first interlayer insulating layer 353 and the blocking layer 450, and in particular, at least one side surface 455 of the blocking layer 450 in the peripheral circuit region P. When upper surfaces of the first interlayer insulating layer 353 and the blocking layer 450 have curved surfaces corresponding to the horizontal transistors 400 and 410 as shown the exemplary embodiment illustrated in FIG. 6, a CMP process for planarizing the upper surface of the first interlayer insulating layer 353 after forming the first interlayer insulating layer 353 may be omitted. Accordingly, process steps may be reduced, as compared to the memory device 100 and 100' according to the exemplary embodiments illustrated in FIGS. 4 and 5.

The first interlayer insulating layer 353 may include a layer with excellent gap-filling properties, such as an HDP oxide layer, and the second interlayer insulating layer 355 may include a material, such as TEOS oxide, with a high deposition rate. The first interlayer insulating layer 353, which fills a space between the plurality of horizontal transistors 400 and 410, may include an HDP oxide layer having excellent gap-filling properties. The second interlayer insulating layer 355, which has a relatively larger volume than the first interlayer insulating layer 353, may include a material, such as a TEOS oxide, that has a high deposition rate so as to reduce the total amount of time needed to form the interlayer insulating layer 350 while reducing/avoiding the formation of gaps in the interlayer insulting layer 350 near the devices 400, 410. In some exemplary embodiments, a ratio of a thickness of the first interlayer insulating layer 353 to a thickness of the second interlayer insulating layer 355 may be about 1:10 to about 1:20, but is not limited thereto. The ratio may change depending on the number of stacked gate electrode layers 330 and/or the thicknesses of the gate electrode layers 330.

Figure 7:
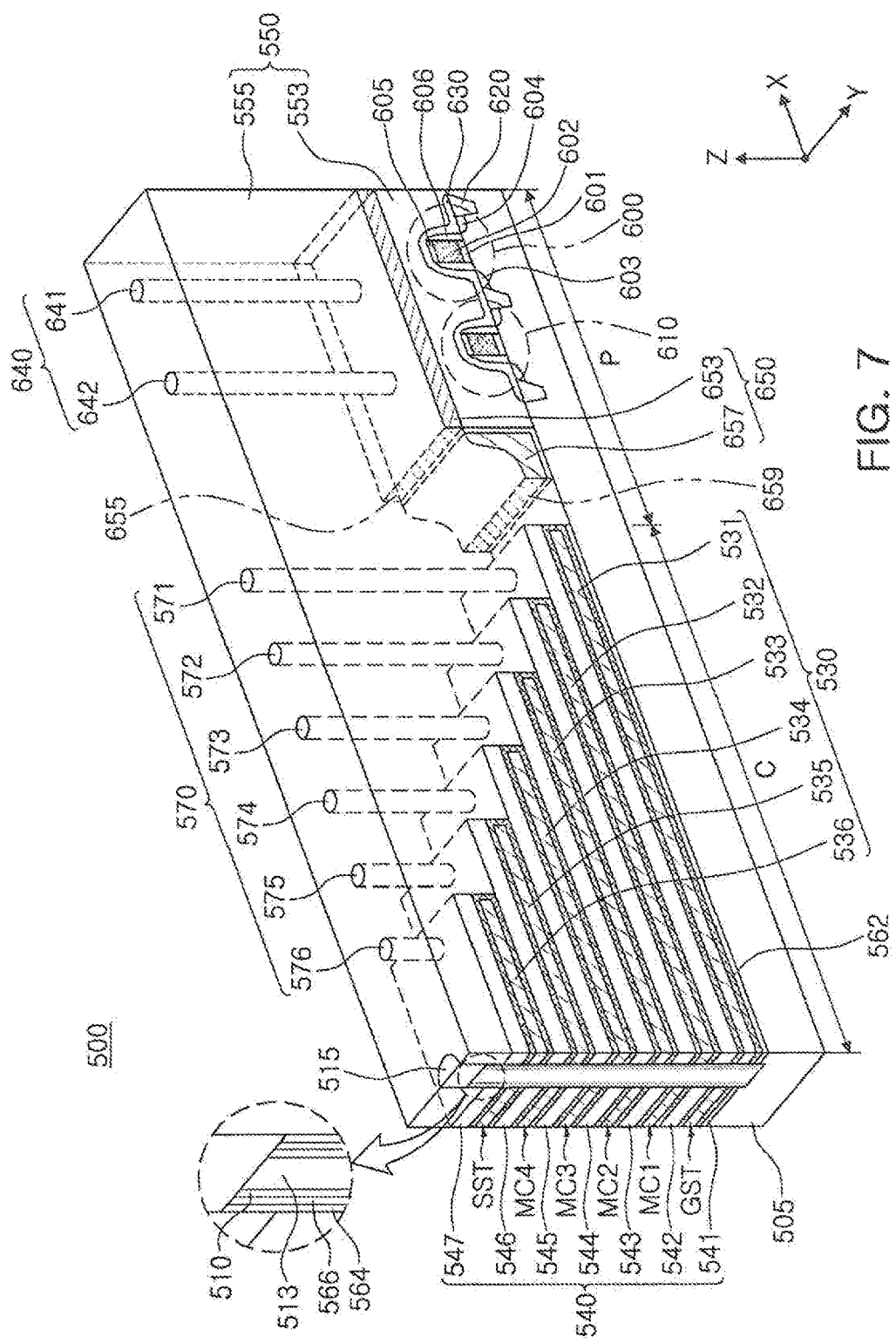

FIG. 7 is a perspective view illustrating a memory device 500 according to a different exemplary embodiment from FIGS. 4 to 6. Referring to FIG. 7, the memory device 500 according to the exemplary embodiment of the present inventive concept may include plurality of gate electrode layers 531 to 536 (generally denoted 530) and a plurality of insulating layers 541 to 547 (generally denoted 540) alternately stacked on an upper surface of a substrate 505 in the z-axis direction. In the cell region C, cavity passing through the plurality of gate electrode layers 530 and the insulating layers 540 to the substrate 505 may be formed, and a channel area 510 may be formed in the cavity.

Each of the plurality of gate electrode layers 530 and the plurality of insulating layers 540 may extend in the x-axis direction to form steps, pad areas may be formed by the gate electrode layers 530 and the insulating layers 540 extending in different lengths. In each pad area, each of the gate electrode layers 530 may be connected to respective ones of a plurality of contact plugs 570. The insulating layers 540 are illustrated as being disposed on the gate electrode layers 530 in the pad areas in FIG. 7. However, in some embodiments, the gate electrode layers 530 may be disposed on the insulating layers 540 in the pad areas.

The memory device 500 may include an interlayer insulating layer 550 having a first interlayer insulating layer 553 and a second interlayer insulating layer 555. The first interlayer insulating layer 553 may be disposed in a peripheral circuit region P to cover horizontal transistors 600 and 610, and the second interlayer insulating layer 555 may be disposed on the first interlayer insulating layer 553 in the cell region C and the peripheral circuit region P. Since the first interlayer insulating layer 553 includes an HDP oxide layer having excellent gap-filling properties, the first interlayer insulating layer 553 may fill a space between the plurality of horizontal transistors 600 and 610.

The memory device 500 may include a blocking layer 650 disposed in the peripheral circuit region P. The blocking layer 650 may not extend into the cell region C. The blocking layer 650 may include a first blocking layer 653 and a second blocking layer 657, that are disposed on different surfaces of the first interlayer insulating layer 553. For example, the first blocking layer 653 may be disposed on an upper surface of the first interlayer insulating layer 553, and the second blocking layer 657 may be disposed on a side surface of the first interlayer insulating layer 553 facing the cell region C. Since the blocking layer 650 is disposed on both upper and side surfaces of the first interlayer insulating layer 553, it may more effectively reduce/prevent mobile charges from flowing into the horizontal transistors 600 and 610. The first blocking layer 653 may serve to reduce/prevent the inflow of the mobile charges into the horizontal transistors 600 and 610, and may further prevent the interlayer insulating layer 550 from being excessively etched, which could otherwise result in damage to the horizontal transistors 600 and 610 during a process of forming contact plugs 570 and 640.

The blocking layer 650 may include a material, such as silicon nitride or the like, that has an etch selectivity relative to the interlayer insulating layer 550. The first blocking layer 653 and the second blocking layer 657 may be separated from each other, and at least one side surface 655 as well as the upper surface of the first blocking layer 653 may be covered by the second interlayer insulating layer 555. In some exemplary embodiments, the second blocking layer 657 tray be formed by partially retaining a sacrificial layer for forming a first gate electrode layer 531 disposed closest to the upper surface of the substrate 505 in the z-axis direction. Accordingly, a thickness of one end of the second blocking layer 657 may be substantially the same as the sum of the thickness of the first insulating layer 541 and the thickness of the first gate electrode layer 531. That is, at the one end of the second blocking layer 657, an upper surface of the second blocking layer 657 may be substantially coplanar with respect to the upper surface of the first gate electrode layer 531.

In addition, the first insulating layer 541 that is disposed at the lowermost layer in a vertical direction (in the z-direction) may partially remain between the second blocking layer 657 and the first interlayer insulating layer 553. This will be described below with reference to FIGS. 12A to 12G.

Figure 8:
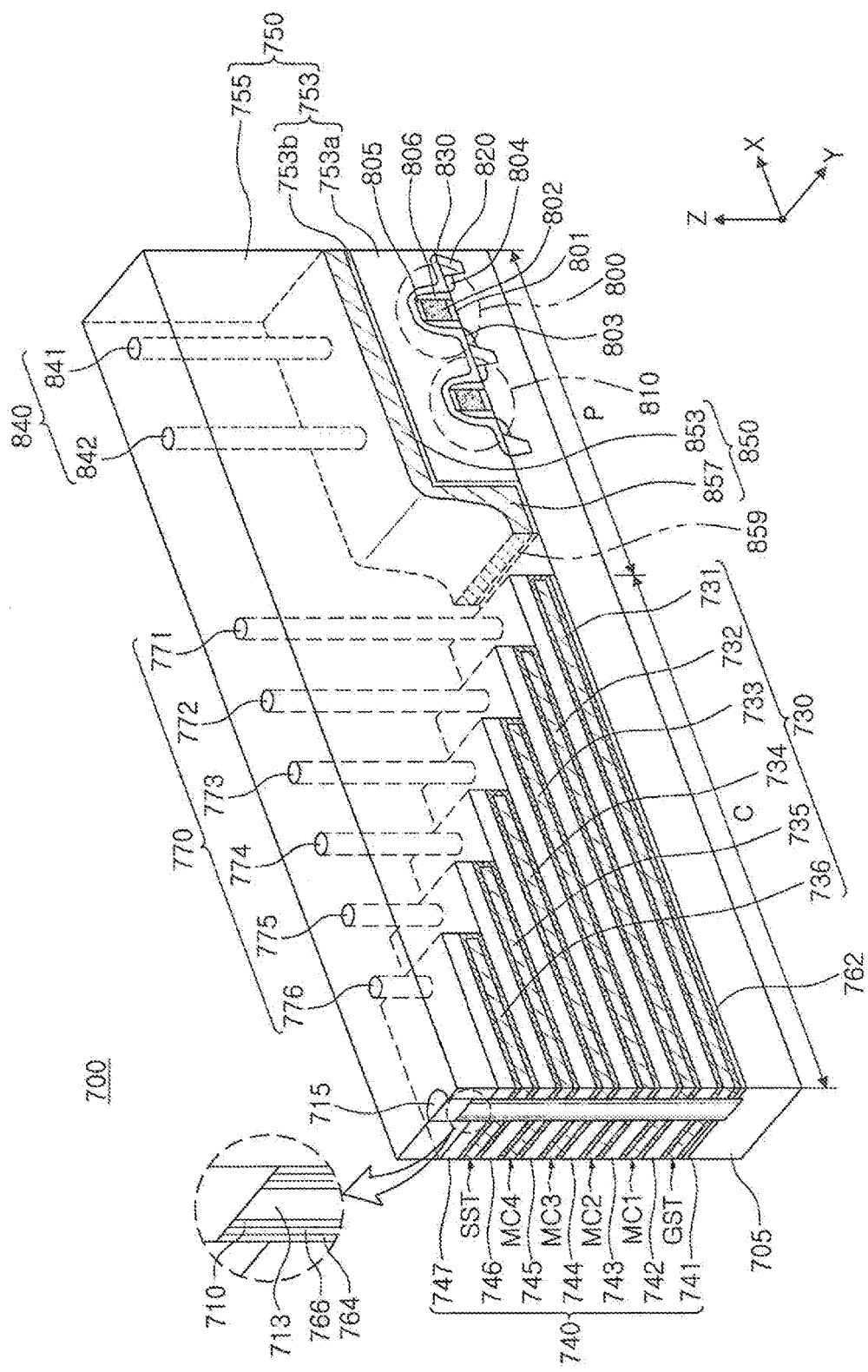

FIG. 8 is a perspective view illustrating a memory device 700 according to a different exemplary embodiment from FIGS. 4 to 7. Referring to FIG. 8, the memory device 700 according to the exemplary embodiment of the present inventive concept may include plurality of gate electrode layers 731 to 736 (generally denoted 730) and a plurality of insulating layers 741 to 747 (generally denoted 740) alternately stacked on an upper surface of a substrate 705 in the z-axis direction. In the cell region C, a cavity passing through the plurality of gate electrode layers 730 and the insulating layers 740 to the substrate 705 may be formed, and a channel area 710 may be formed in the cavity.

The plurality of gate electrode layers 730 and the plurality of insulating layers 740 may extend to have different lengths from each other in the x-axis direction to form steps, and pad areas may be formed by the gate electrode layers 730 and the insulating layers 740 extending by different lengths. However in some embodiments, the gate electrode layers 730 may be respectively connected to a plurality of contact plugs 771 to 776 (generally denoted 770). In FIG. 8, the insulating layers 740 are illustrated as being disposed on the gate electrode layers 730 in the pad areas. The gate electrode layers 730 may be disposed on the insulating layers 740 in the pad areas, The memory device 700 may include an interlayer insulating layer 750 having a first interlayer insulating layer 753 and a second interlayer insulating layer 755. The first interlayer insulating layer 753 may be disposed in a peripheral circuit region P to cover horizontal transistors 800 and 810, and may include a first portion 753a and a second portion 753b. The first portion 753a may be formed by depositing an HDP oxide layer after forming the horizontal transistors 800 and 810, a device isolation layer 820, and a device protection layer 830. The second portion 753b may be formed by retaining at least a portion of the lowermost first insulating layer 741 in the z-axis direction.

A blocking layer 850 may be formed on the first interlayer insulating layer 753. The blocking layer 850 may reduce/prevent the first interlayer insulating layer 753 from being excessively etched during a process of forming contact plugs 770 and 840, and at the same time, reduce/prevent mobile charges from flowing into the horizontal transistors 800 and 810. The blocking layer 850 may include a first blocking layer 853 and a second blocking layer 857. The first blocking layer 853 may be disposed on an upper surface of the first interlayer insulating layer 753, and the second blocking layer 857 may be disposed on a side surface of the first interlayer insulating layer 753. Similar to the exemplary embodiment illustrated in FIG. 7, since the blocking layer 850 is disposed on both of the upper surface and the side surface of the first interlayer insulating layer 753, it may more effectively reduce/prevent mobile charges from flowing into the horizontal transistors 800 and 810. In addition, in some cases, the blocking layer 850 may be formed by partially retaining a sacrificial layer for forming the first gate electrode layer 731 on the first interlayer insulating layer 753. Accordingly, at one end of the second blocking layer 857, an upper surface of the second blocking layer 857 may be substantially coplanar with respect to an upper surface of the first gate electrode layer 731.

The first blocking layer and 853 and the second blocking layer 857 may be formed by retaining at least a portion of the sacrificial layer for forming the gate electrode layers 730. A method of forming the blocking layer 850 will be described below with reference to FIGS. 13A to 13F. The second interlayer insulating layer 755 may be disposed on the first interlayer insulating layer 753 and the blocking layer 850. The second interlayer insulating layer 755 may include a material, such as a TEOS oxide layer, that has a high deposition rate so as to shorten the process time needed to form the interlayer insulating layer 750. The second interlayer insulating layer 755 may cover at least one side 859 of the blocking layer 850.

Methods of fabricating the memory devices illustrated in FIGS. 4 to 8 are described below with reference to FIGS. 9 to 13.

FIGS. 9A to 9M are views illustrating methods of fabricating the memory device 100 illustrated in FIG. 4. FIGS. 9A to 9M are cross-sectional views taken along the y-axis direction in the perspective view in FIG. 4 according to process steps.

Figure 9A:
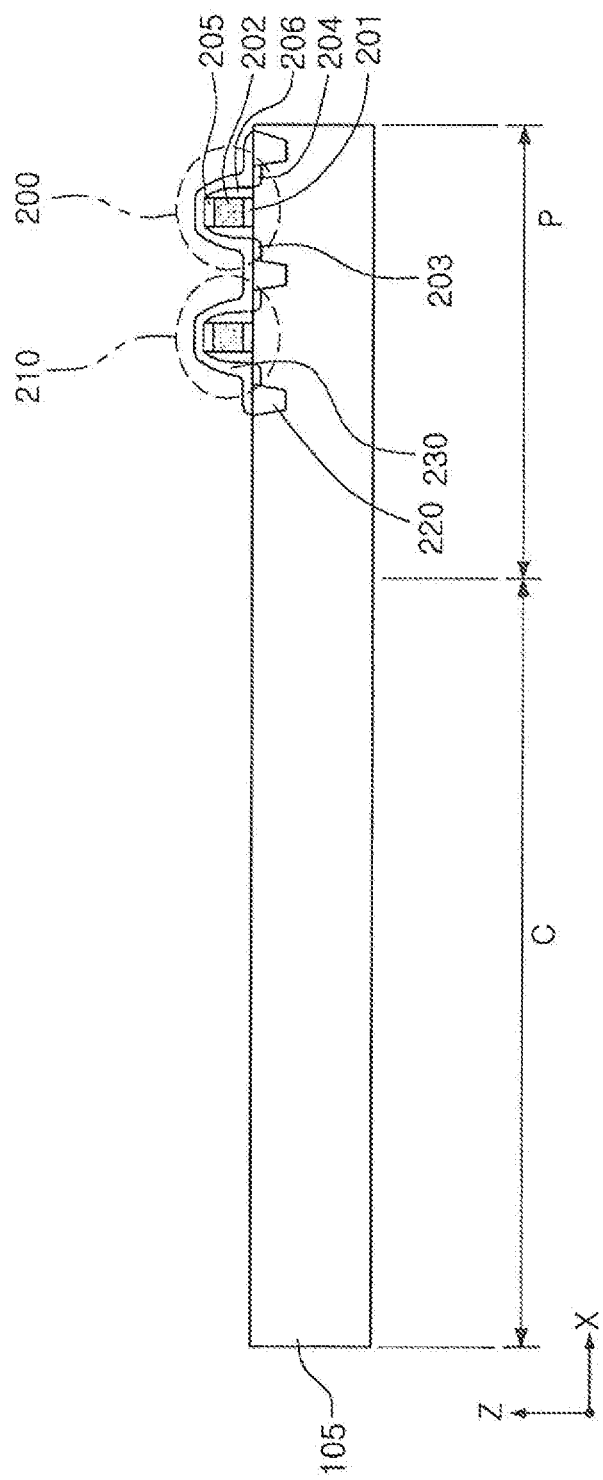
FIGS. 9A to 9M are views illustrating a method of fabricating the memory device illustrated in FIG. 4.

Referring to FIG. 9A, the memory device 100 according to the exemplary embodiment of the present inventive concept may include a cell region C and a peripheral circuit region P. The peripheral circuit region P may include a plurality of circuit devices, and the plurality of circuit devices may include horizontal transistors 200 and 210 formed on a substrate 105 as illustrated in FIG. 9A.

Each of the horizontal transistors 200 and 210 may include a horizontal source electrode 203, a horizontal drain electrode 204, and a horizontal gate electrode 202 formed on the substrate 105 by an impurity injection process. The horizontal gate. electrode 202 may be formed of polysilicon, a metal, or a laminate structure of polysilicon and a metal silicide, and a horizontal gate insulating layer 201 may be disposed between the horizontal gate electrode 202 and the substrate 105. A capping layer 205 may be formed on an upper surface of the horizontal gate electrode 202, and gate spacers 206 may be formed on side surfaces of the horizontal gate electrode 202. The capping layer 205 and the gate spacers 206 may be formed on the horizontal gate electrode 202 by depositing a silicon oxide layer or the like using an MTO process and performing an etch-back process. After the capping layer 205 and the gate spacer 206 are formed, a horizontal source electrode 203 and a horizontal drain electrode 204 may be formed by an ion-implantation process.

A device isolation layer 220 may be formed outside of the horizontal source electrode 203 and the horizontal drain electrode 204. An active region in which channel areas of the horizontal transistor 200 are formed may be defined by the device isolation layer 220 in the substrate 105. When the peripheral circuit region P includes the plurality of horizontal transistors 200 and 210, the device isolation layer 220 may he formed between the horizontal transistors 200 and 210. In addition, a device protection layer 230 may be formed on the horizontal transistors 200 and the device isolation layer 220. The device protection layer 230 may be formed in a silicon oxide layer using an MTO process, and may have a thickness of about 50 Å.

Figure 9B:
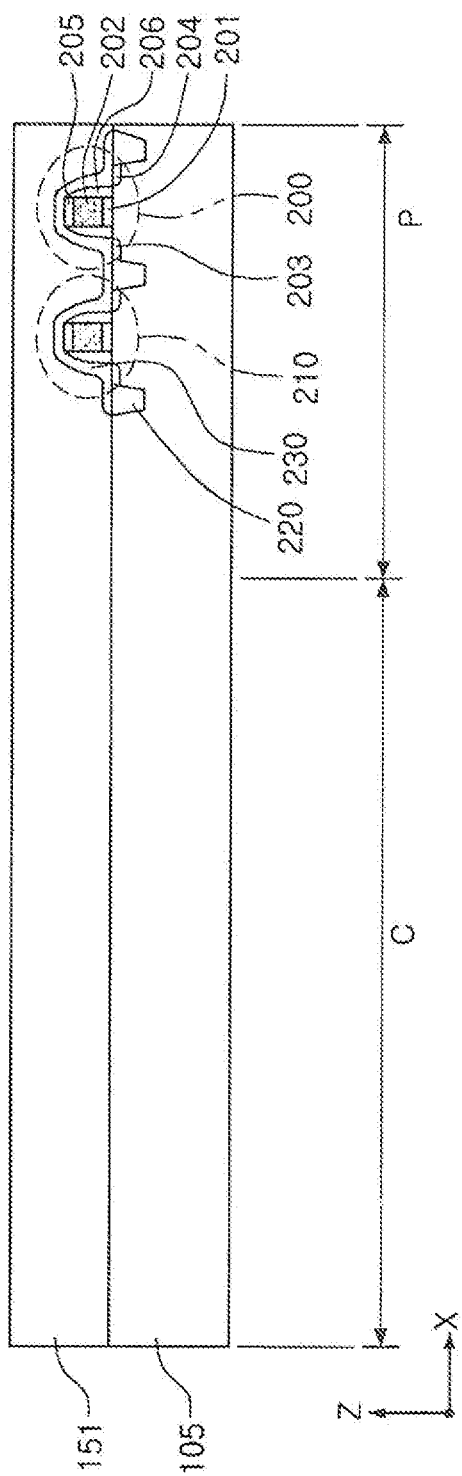

Next, referring to FIG. 9B, a first oxide layer 151 for forming a first interlayer insulating layer 153 may be formed or substrate 105, The first oxide layer 151 may include an HDP oxide layer having excellent gap-filling properties. After the first oxide layer 151 is formed, an upper surface of the first oxide layer 151 may be planarized, for example, using a polishing process.

Figure 9C:
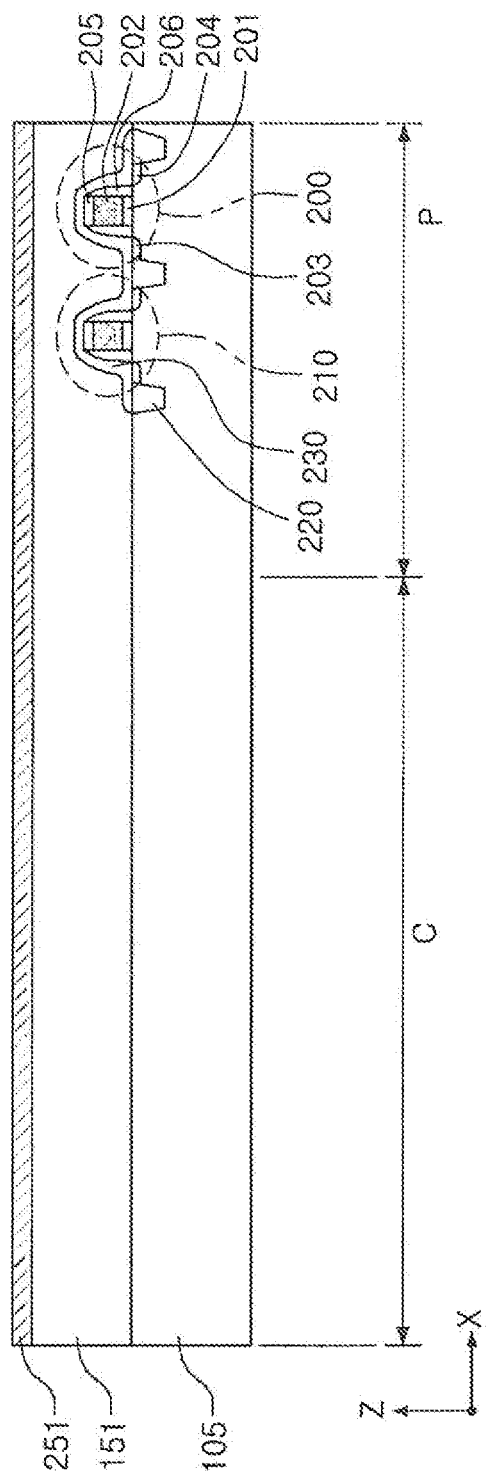
Figure 9D:
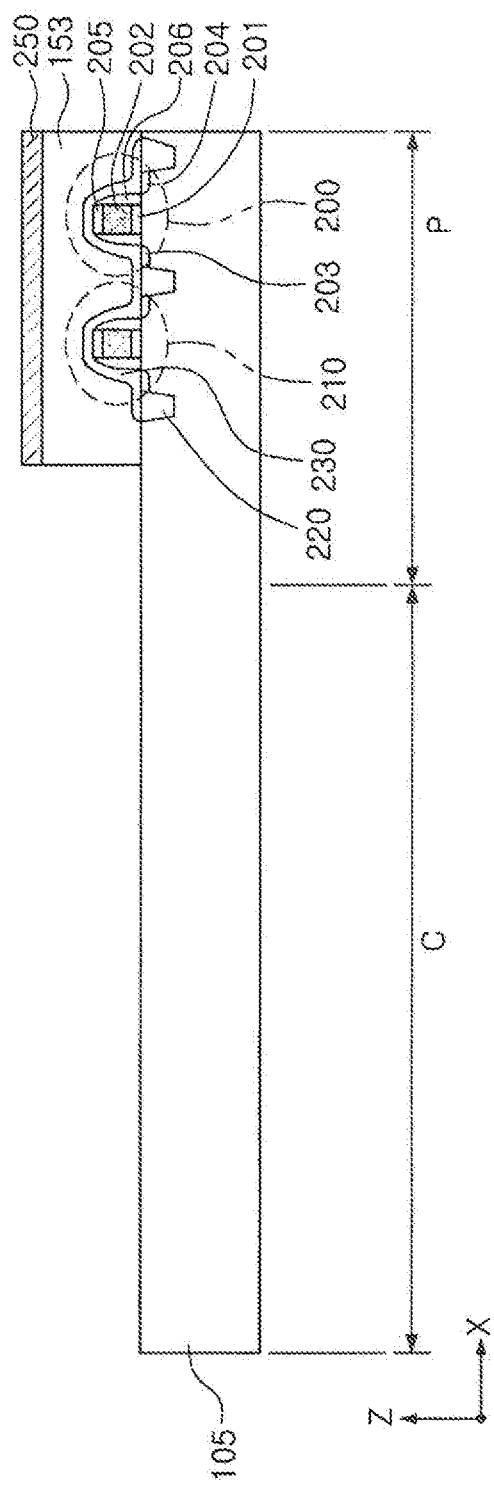

Referring to FIG. 9C, a preliminary blocking layer 251 may be formed on the first oxide layer 151. The preliminary blocking layer 251 may be provided to form an blocking layer 250, and formed on the first oxide layer 151 throughout the cell region C and the peripheral circuit region P. Next, referring to FIG. 9D, the first oxide layer 151 and the preliminary blocking layer 251 may be removed from every region of the substrate except at least. a portion of the peripheral circuit region P, and thereby the first interlayer insulating layer 153 and the blocking layer 250 may be formed.

Figure 9E:
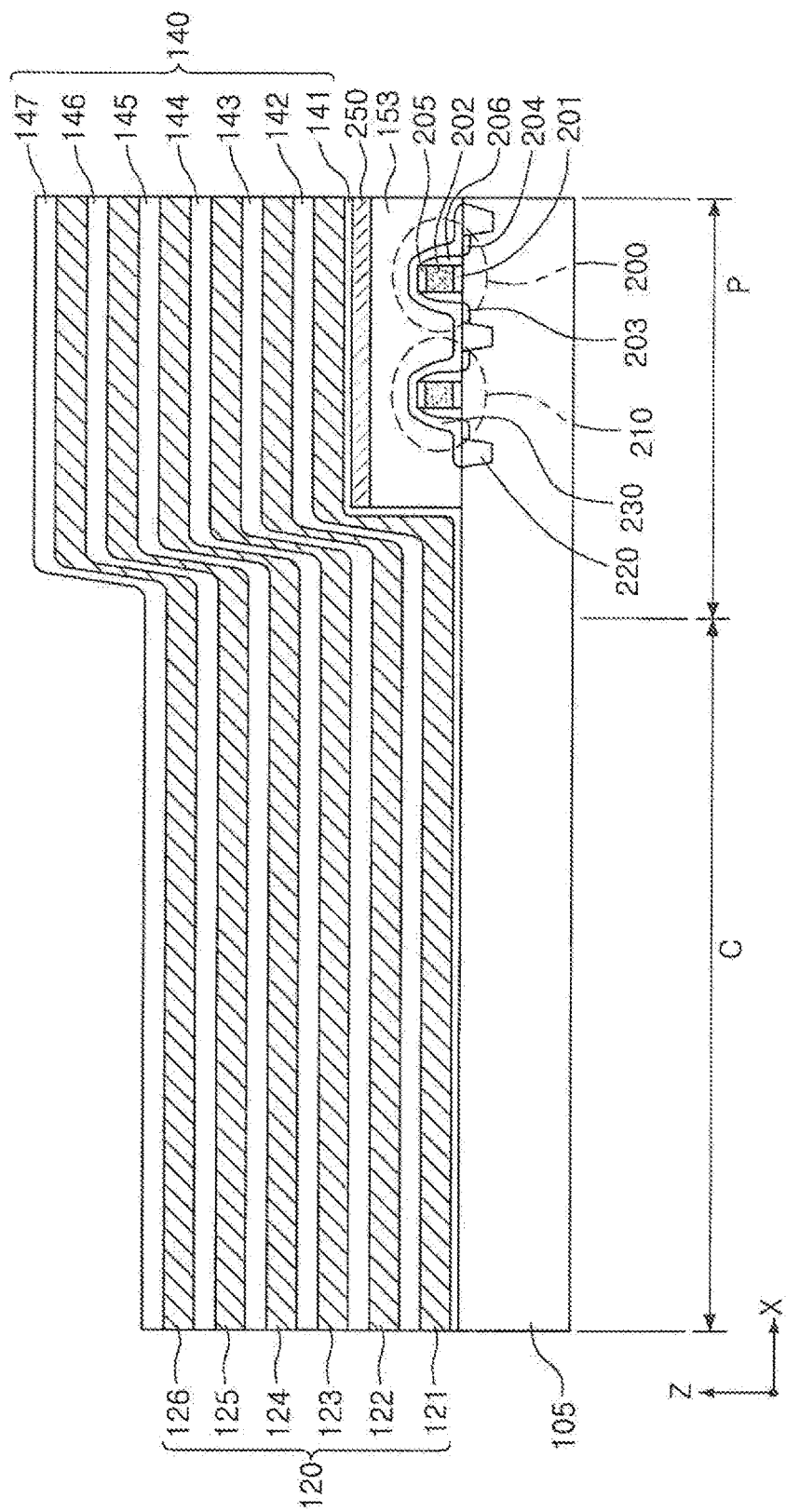

Referring to FIG. 9E, a plurality of insulating layers 141 to 147 (generally denoted 140) and a plurality of sacrificial layers 121 to 126 (generally denoted 120) may be alternately stacked on the substrate 105. The sacrificial layers 120 may be formed of a material having etch selectivity with respect to the insulating layers 140. That is, the sacrificial layers 120 may include a material that. may be preferentially etched relative to the insulating layers 140. Such etch selectivity may be quantitatively represented by a ratio of an etching rate of the sacrificial layers 120 to an etching rate of the insulating layers 140. For example, the insulating layers 140 may be at least one of silicon oxide layers and silicon nitride layers. The sacrificial layers 120 may be one selected from silicon layers, silicon oxide layers, silicon carbide layers, and silicon nitride layers, which are different from the insulating layers 140. For example, when the insulating layers 140 are silicon oxide layers, the sacrificial layers 120 may be silicon nitride layers.

According to various embodiments of the present inventive concept, the plurality of insulating layers 140 may have different thicknesses. For example, the lowermost insulating layer 141 among the plurality of insulating layers 140 in the z-axis (vertical) direction may have a relatively smaller thickness than the other insulating layers 142 to 147, and the uppermost insulating layer 147 may have a relatively greater thickness than the other insulating layers 141 to 146. That is, thicknesses of the insulating layers 140 and the sacrificial layers 120 may not be limited to those described in FIG. 9E and may be modified in various ways as desired. Further, the number of layers configuring the insulating layers 140 and the sacrificial layers 120 may be modified in various ways as desired.

Figure 9F:
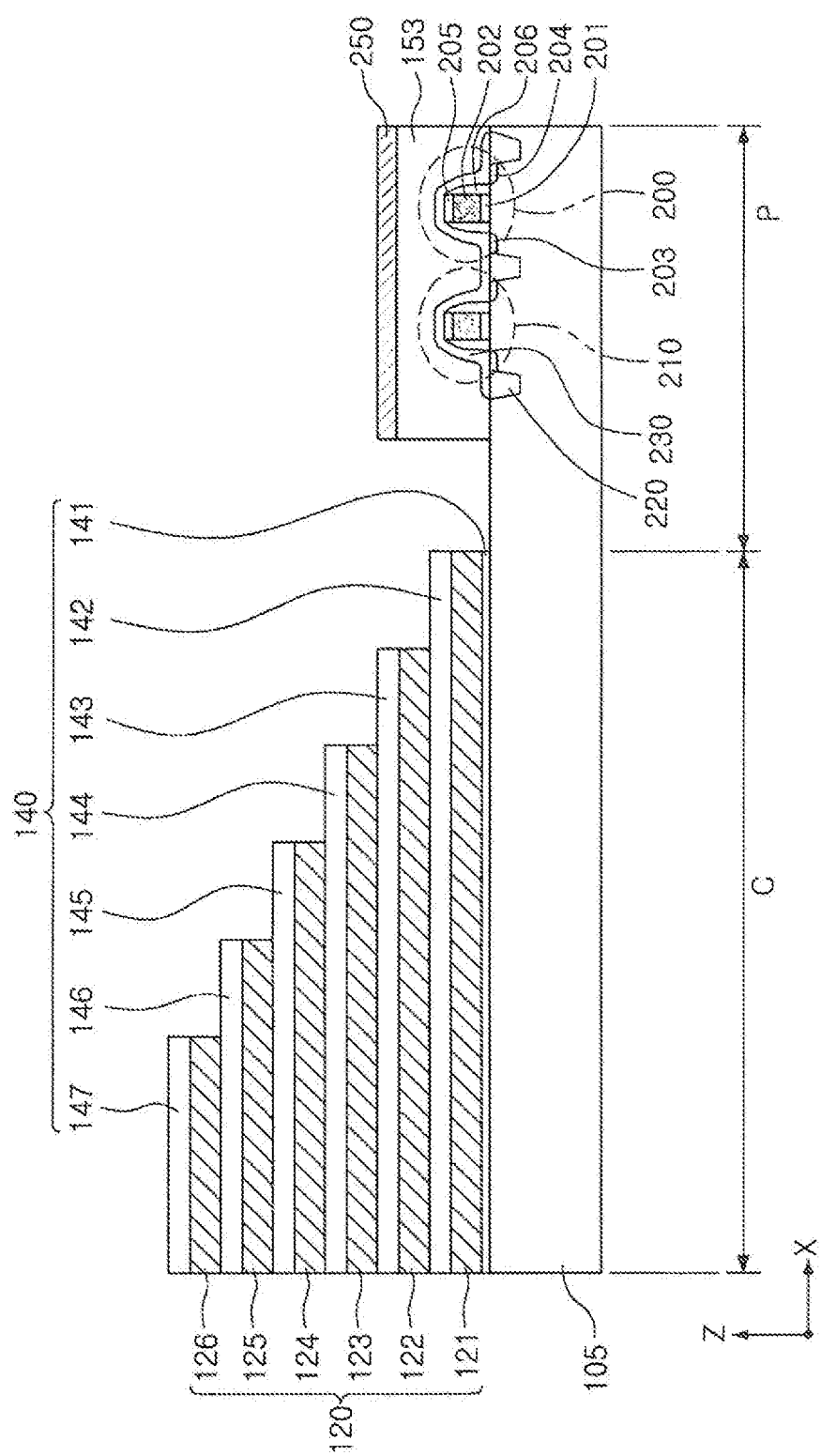

Next, referring to FIG. 9F, the plurality of sacrificial layers 120 and insulating layers 140 may be etched to form pad areas having a step structure. In order to form steps, as illustrated in FIG. 9F, between the sacrificial layers 120 and the insulating layers 140 adjacent to each other in the z-axis direction, a predetermined mask layer may be formed on the plurality of sacrificial layers 120 and insulating layers 140 alternately stacked on the substrate 105, and the sacrificial layers 120 and the insulating layers 140 exposed by the mask layer may be etched. The sacrificial layers 120 and the insulating layers 140 may be sequentially etched by etching the sacrificial layers 120 and the insulating layers 140 exposed by the mask layer while trimming the mask layer, several times. Thus, the plurality of steps as illustrated in FIG. 9F may be formed.

In some exemplary embodiments, each of the insulating layers 140 and each of the sacrificial layers 120 may form a pair, and each pair of insulating layers 140 and sacrificial layers 120 may extend in the same direction (e.g., the x-axis direction) by the same length. Moreover, an insulating layer 141 extending to the same length may be further disposed under the lowermost sacrificial layer 121 in the z-axis direction.

Figure 9G:
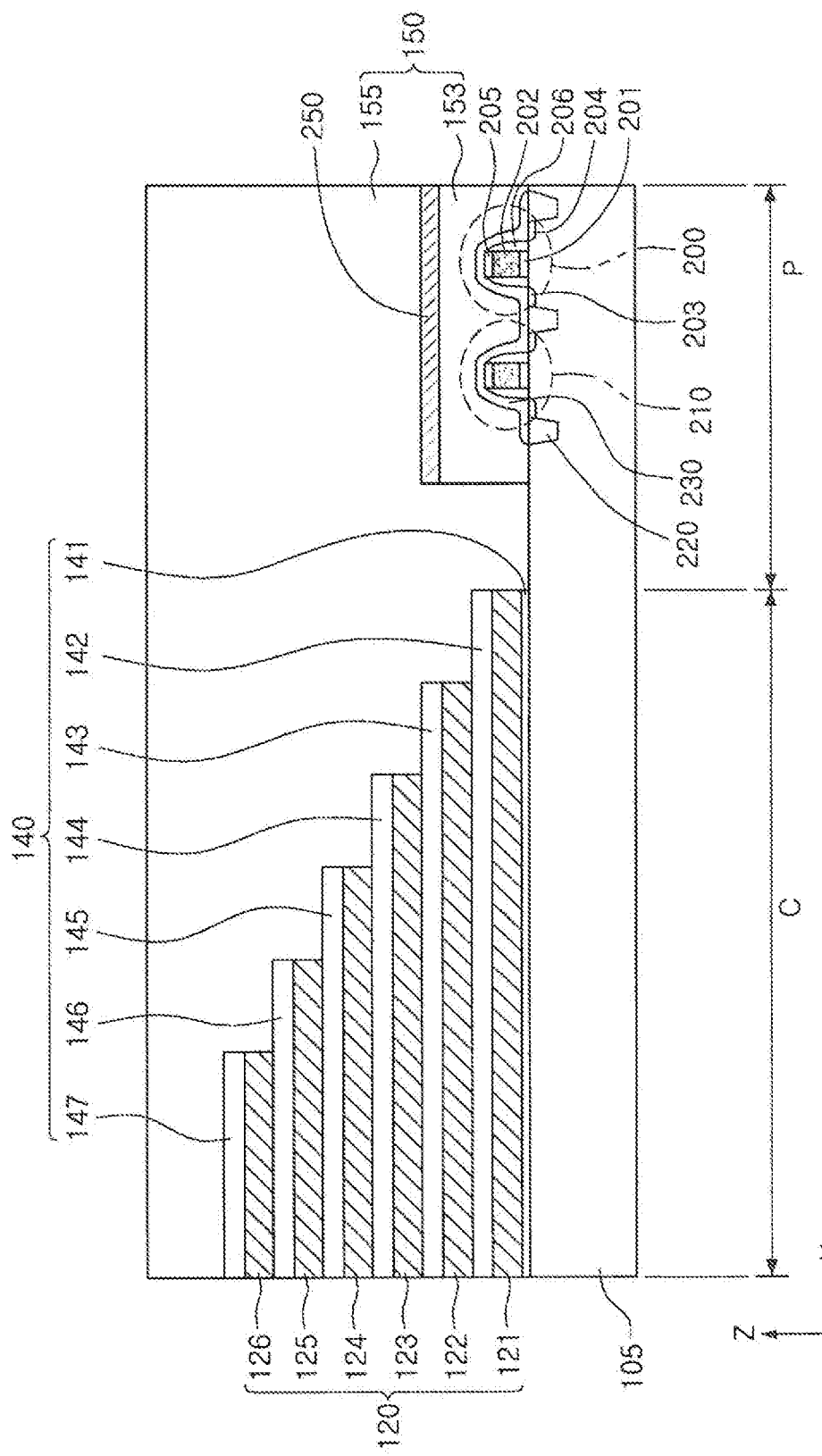

After the step structure is formed, as illustrated in FIG. 9G, a second interlayer insulating layer 155 may be formed on the first interlayer insulating layer 153 and the blocking layer 250. As illustrated in FIG. 4, the second interlayer insulating layer 155 may cover the upper surface and at least one side surface 255 of the blocking layer 250.

The second interlayer insulating layer 155 may be formed on the substrate 105 throughout the cell region C and the peripheral circuit region P. That is, the second interlayer insulating layer 155 may be disposed on the substrate 105 or the plurality of insulating layers 140 and sacrificial layers 120 having a step structure in the cell region C. and on the first interlayer insulating layer 153 and blocking layer 250 covering the substrate 105 and/or the horizontal transistors 200 and 210 in the peripheral circuit region P.

Since the second interlayer insulating layer 155 has a larger volume than the first interlayer insulating layer 153, the second interlayer insulating layer 153 may be effectively formed using a TEOS oxide layer. By forming the second interlayer insulating layer 155 with the TEOS oxide layer having an excellent deposition rate, the process time may be reduced and process efficiency may be improved in the process of forming the second interlayer insulating layer 155.

Figure 9H:
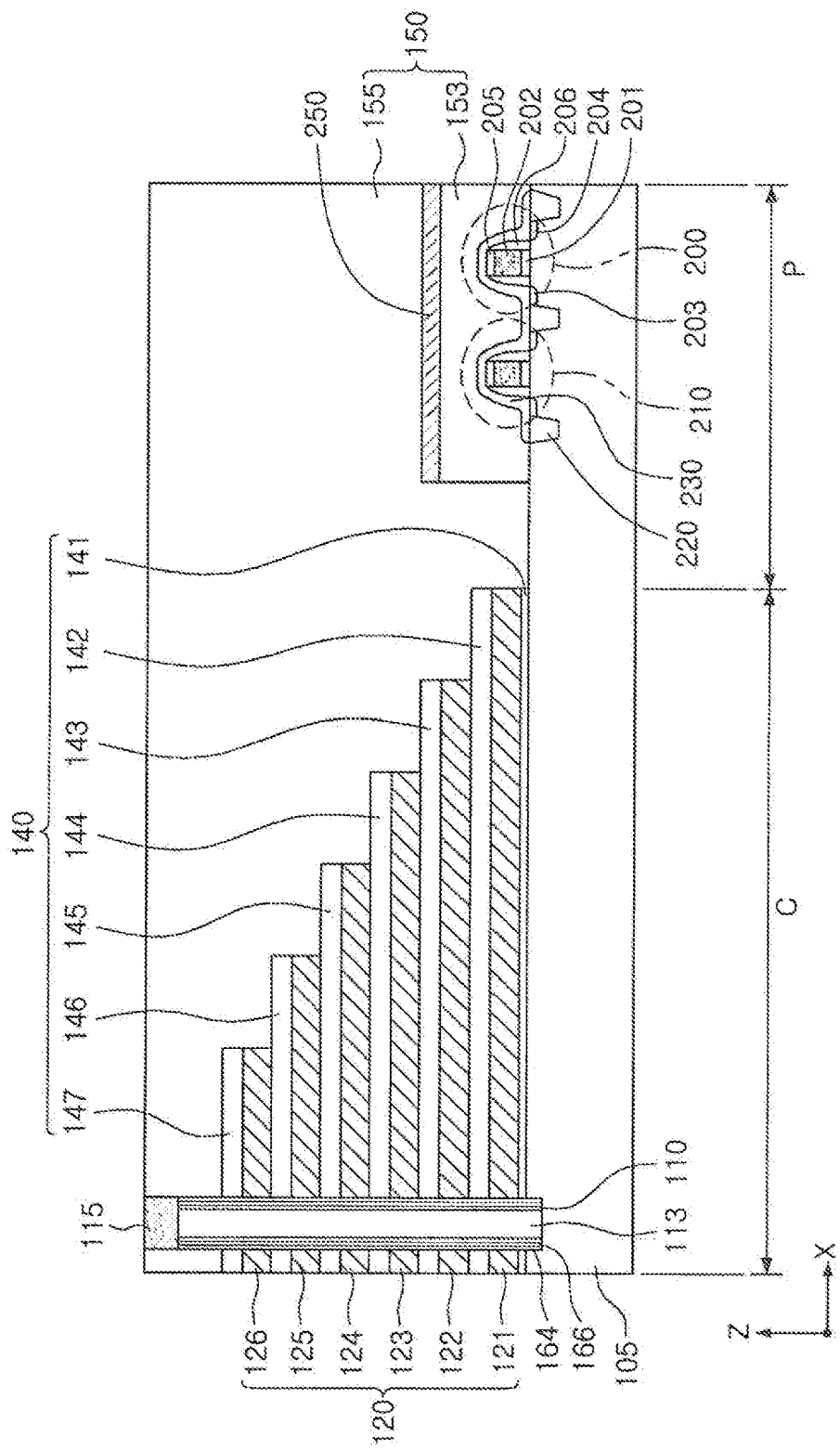

After the interlayer insulating layer 150 is formed, a channel area 110 may be formed as illustrated in FIG. 9H. In order to form the channel area 110, an opening may be formed passing through the plurality of insulating layers 140 and sacrificial layers 120 in the z-axis direction. In some exemplary embodiments, a plurality of openings may be formed depending on the number of the channel area 110, and the plurality of openings may be disposed in a zigzag form on an x-y plane perpendicular to the z-axis to be spaced apart from each other. The plurality of openings may be formed by exposing only areas on which the plurality of openings are to be formed using a mask layer and anisotropically etching the exposed areas, similar to the method of forming the step structure described with reference to FIG. 9F. Each of the plurality of openings may expose the upper surface of the substrate 105, or may recess into the substrate 105 at a predetermines depth.

A charge storage layer 164 and a tunneling layer 166 may be formed on an inner wall and a bottom surface of each of the plurality of openings by an atomic layer deposition (ALD) or chemical vapor deposition (CVD) method. The charge storage layer 164 and the tunneling layer 166 may be sequentially stacked from an area adjacent to the plurality of sacrificial layers 120 and insulating layers 140, and the channel area 110 may be formed on an inner surface of the tunneling layer 166. The channel area 110 may have a predetermined thickness in the range of, for example, 1/50 to 1/5 of a width or diameter of each of the plurality of openings. The channel area 110 may be formed by an ALD or CVD method, similarly to the charge storage layer 164 and the tunneling layer 166. Meanwhile, the channel area 110 may be in direct contact with the substrate 105 and electrically connected to the substrate 105 on the bottom surface of each of the plurality of openings.

The inside of the channel area 110 may be filled with an embedded insulating layer 113. Selectively, before the embedded insulating layer 113 is formed, a hydrogen annealing process in which the structure including the channel area 110 formed thereon is heat-treated in a hydrogen-containing or deuterium-containing gas atmosphere, may be additionally performed. Through the hydrogen annealing process, many of crystal defects existing in the channel area 110 may be cured.

The above-described structure is according to the exemplary embodiment illustrated in FIG. 4, and the channel area 110 can be formed in different structures. For example, just after the plurality of openings for forming channel area 110 are formed, the channel area 110 may be formed without forming the charge storage layer 164 and the tunneling layer 166, and then the embedded insulating layer 113 may be formed on an inner surface of the channel area 110. The tunneling layer 166 and the charge storage layer 164, like a blocking layer 162, may be formed before the gate electrode layers 130 are formed, and disposed on an external surface of the blocking layer 162 to surround the gate electrode layers 130.

Next, a planarization process may be performed to remove unnecessary semiconductor materials and insulating materials covering the uppermost interlayer insulating layer 150. Next, an upper portion of the embedded insulating layer 113 may be partially removed using an etching process, and then a material for forming a conductive layer 115 may be deposited on the removed portion. Next, a planarization process may be further performed to form the conductive layer 115, The conductive layer 115 may be provided as a drain area.

Figure 9I:
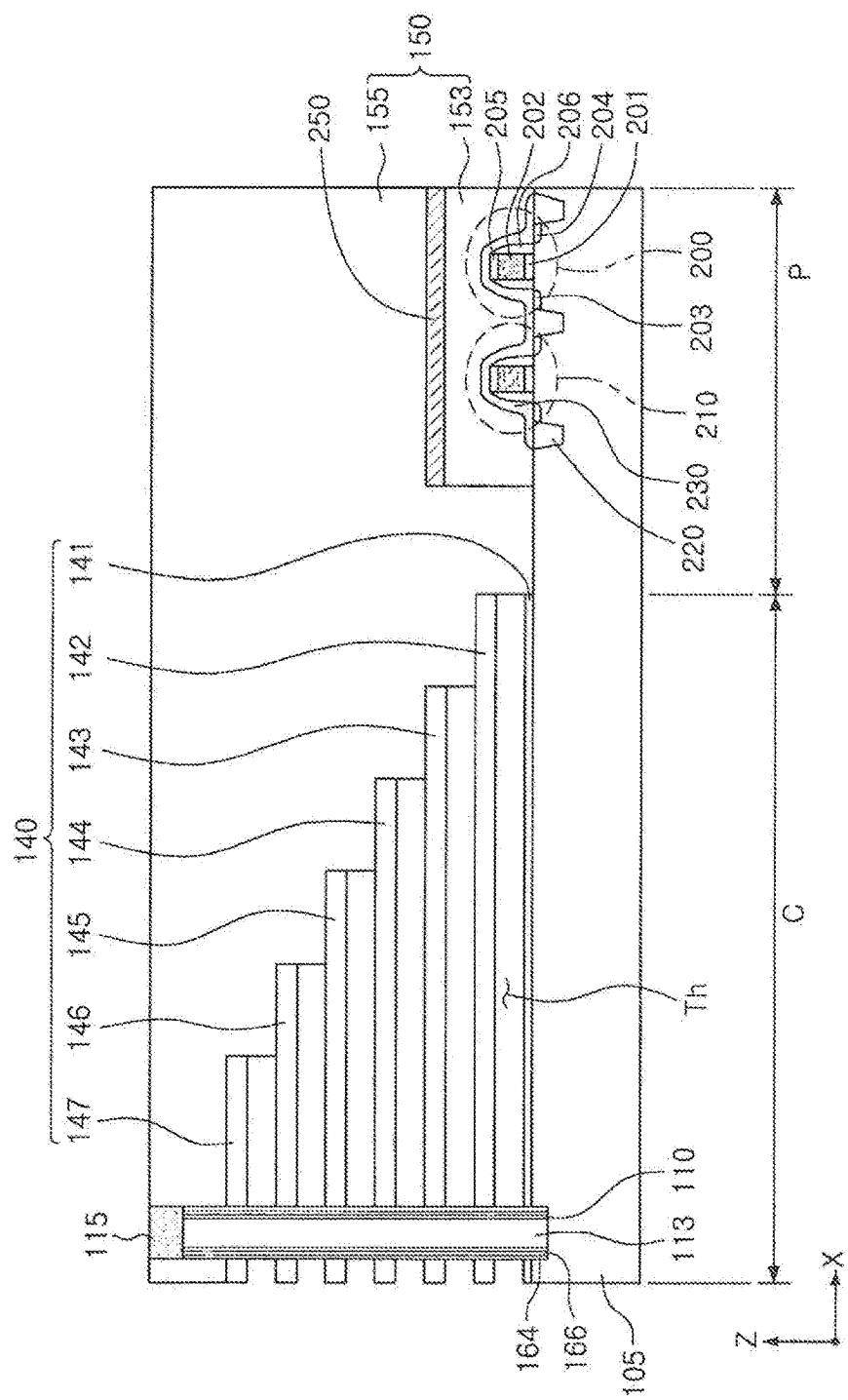

When the channel area 110 is formed, a plurality of horizontal openings Th may be formed as illustrated in FIG. 9I by removing the plurality of sacrificial layers 120. As the plurality of sacrificial layers 120 are removed, the plurality of horizontal openings Th may be formed between the insulating layers 140, The plurality of gate electrode layers 130 may be formed by depositing a conductive material in the plurality of horizontal openings Th.

Figure 9J:
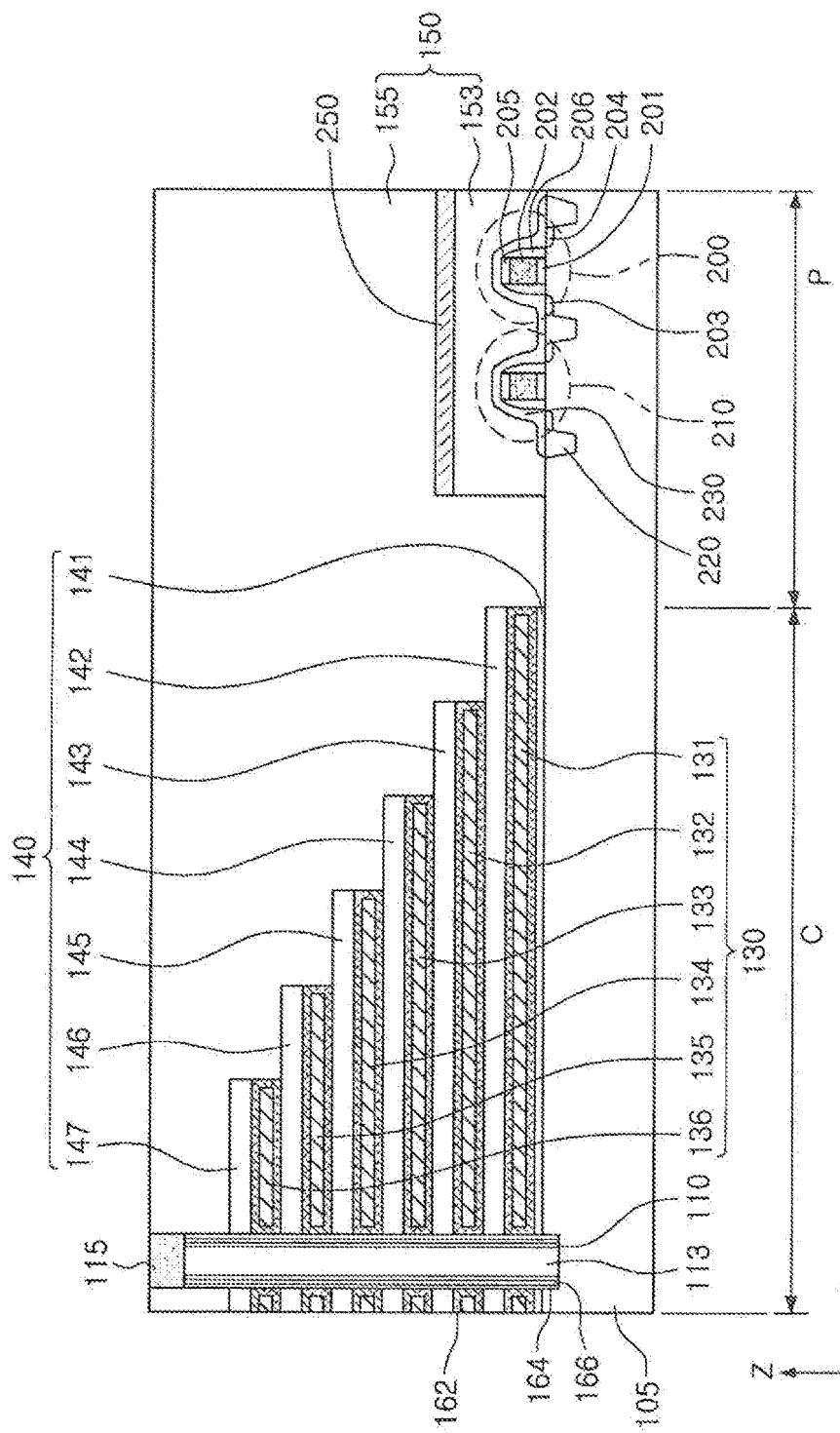

Referring to FIG. 9J, the blocking layer 162 and the gate electrode layers 131 to 136 (generally denoted 130) may be formed in the horizontal openings Th. When the blocking layer 162 and the gate electrode layers 130 are sequentially formed in the horizontal openings Th, the blocking layer 162, like the charge storage layer 164 and the tunneling layer 166, may be formed by an ALD, CVD, or physical vapor deposition (PVD) process. Since the blocking layer 162 is formed before the gate electrode layers 130 is formed, the blocking layer 162 may have the form of surrounding the gate electrode layers 130, as illustrated in FIG. 9J. The gate electrode layers 130 may be formed of a conductive material such as tungsten (W).

Figure 9K:
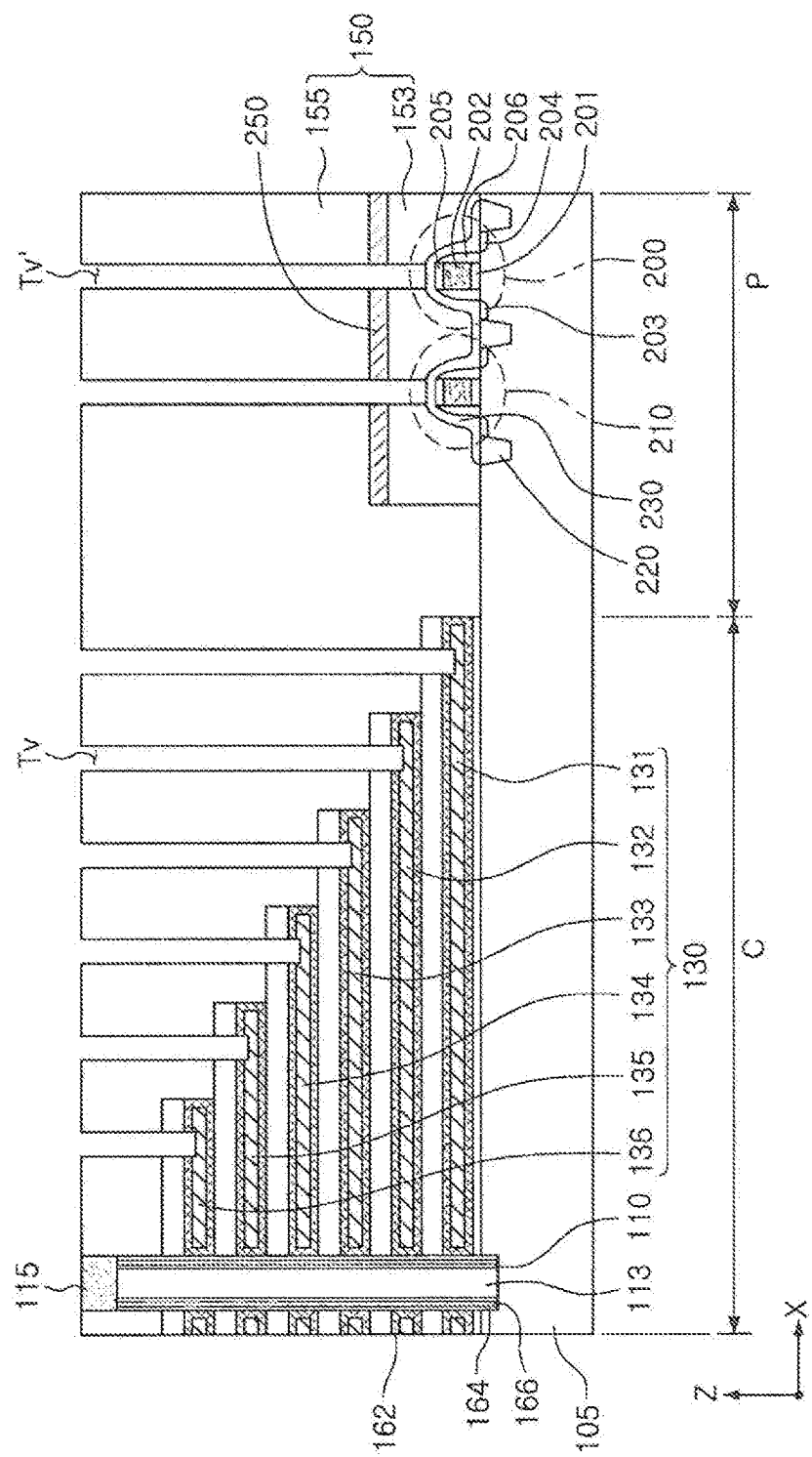
Figure 9L:
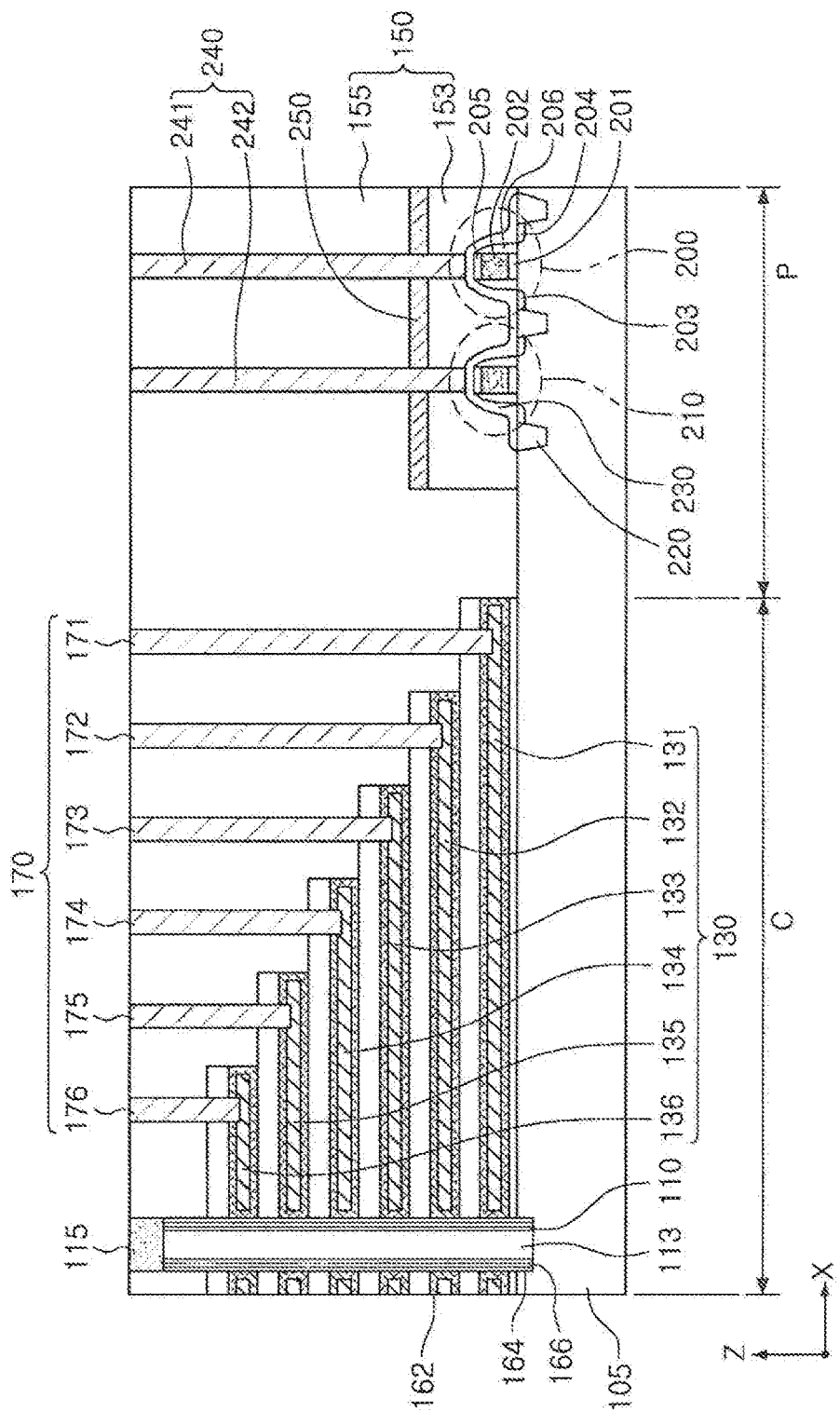

When the blocking layer 162 and the gate electrode layers 130 are formed, a plurality of vertical openings Tv and Tv' for forming contact plugs 170 may be formed by performing an etching process in the z-axis direction parallel to the channel area 110, as illustrated in FIG. 9K. The etching process of forming the plurality of vertical openings Tv and Tv' may include forming a mask layer in which areas corresponding to the vertical openings Tv and Tv' are open, and selectively etching the second interlayer insulating layer 155 and the plurality of insulating layers 140 with respect to the plurality of gate electrode layers 130. By selectively etching, a material included in the second interlayer insulating layer 155 and the plurality of insulating layers 140 with respect to a material included in the plurality of gate electrode layers 130, the vertical openings Tv and Tv' respectively extending to the gate electrode layers 130 and the horizontal gate electrode 202 may be formed, as illustrated in FIG. 9K. In some exemplary embodiments, due to a high aspect ratio, the vertical openings Tv and Tv' may have a tapered structure having inclined side surfaces such that widths thereof decrease toward the substrate 105. Meanwhile, the blocking layer 250 may function to prevent the interlayer insulating layer ISO from being excessively etched during the process of fanning the vertical openings Tv and Tv'. Accordingly, the horizontal transistors 200 and 210 may be prevented from being damaged due to excessive etching attic interlayer insulating layer 150.

After the mask layer for forming the plurality of vertical openings Tv and Tv' is removed, contact plugs 171 to 176 (generally denoted 170) and 241 and 242 (generally denoted 240) may be formed by filling the plurality of vertical openings Tv and Tv' with a conductive material, as illustrated in FIG. 9I. The contact plugs 170 and 230 may include the conductive material such as tungsten W, like the gate electrode layers 130. Each of the contact plugs 170 disposed in the cell region C may pass through the insulating layers 140 located on an upper part in the step structure to be electrically connected to the gate electrode layers 130. The vertical openings Tv for forming the contact plugs 170 to be electrically connected to the gate electrode layers 130, may extend to have a depth capable of passing through the blocking layer 162 surrounding the gate electrode layers 130. A peripheral contact plug 240 connected to the horizontal gate electrode 202 of the horizontal transistors 200 and 210 in the peripheral circuit region P, may be directly connected to the horizontal gate electrode 202 or staggered with respect to the horizontal gate electrode 202 in the y-axis direction.

Figure 9M:
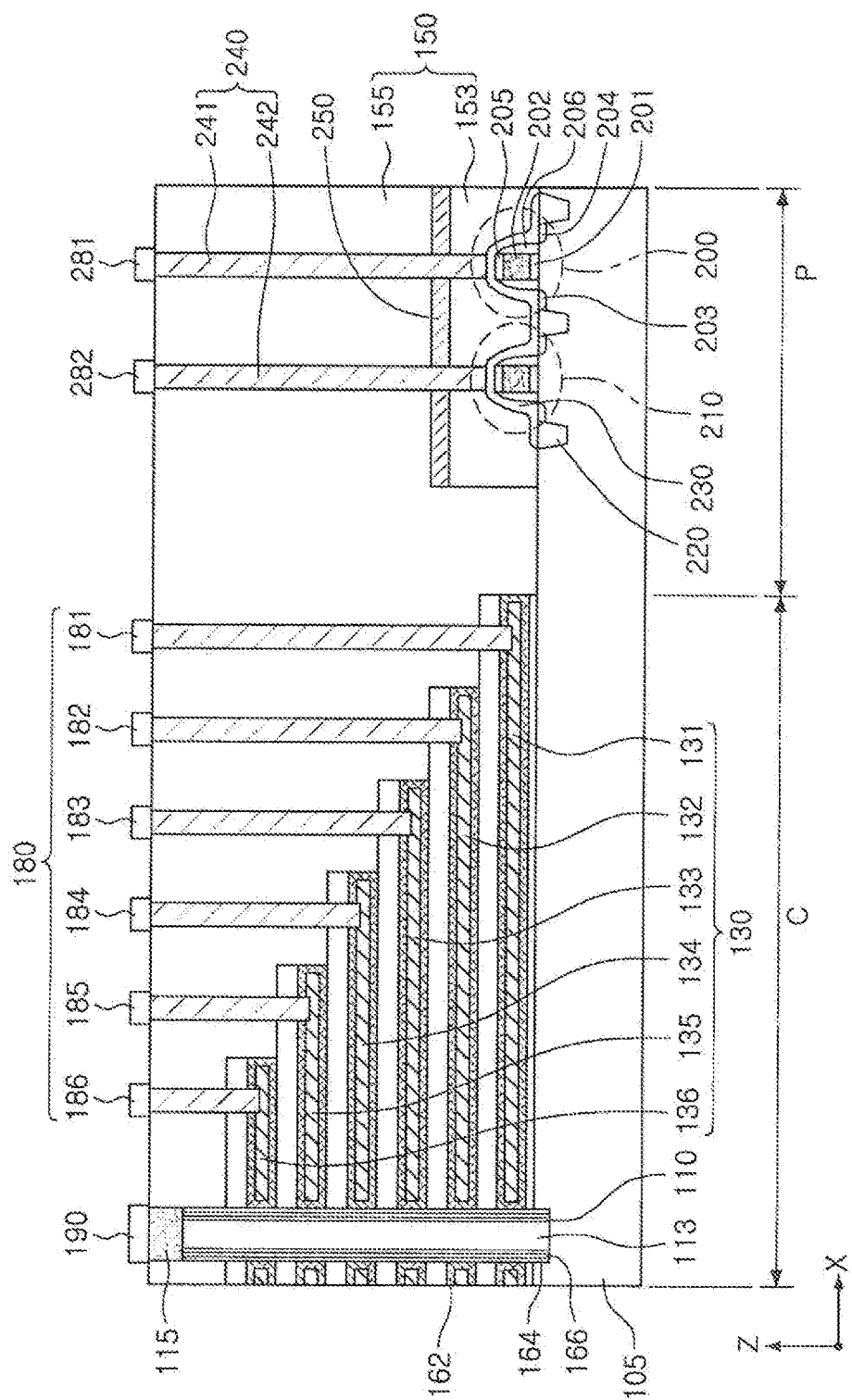

Next, referring to FIG. 9M, a plurality of interconnection lines 181 to 186 (generally denoted 180) may be formed on the plurality of contact plugs 170 disposed in the cell region C, and a bit line 190 may be formed on the conductive layer 115 disposed on the channel area 110. The plurality of interconnection lines 180 may be formed in a direction parallel to the bit line 190 or in a direction intersecting a direction in which the plurality of gate electrode layers 130 extend. The plurality of interconnection lines 180 may electrically connect at least some of the gate electrode layers 130 formed at the same height in the z-axis direction from each other. Moreover, conductive pads 280 and 281 may be formed on the peripheral contact plug 240.

FIGS. 10A to 10F are views illustrating a method of fabricating the memory device 100' illustrated in FIG. 5. FIGS. 10A to 10F may be cross-sectional views taken from the y-axis direction of the perspective view of FIG. 5 according to a process sequence. The method of fabricating the memory device 100' described with reference to FIGS. 10A to 10F may share some processes with the method of fabricating the memory device 100 described with reference to FIGS. 9A to 9M.

Figure 10A:
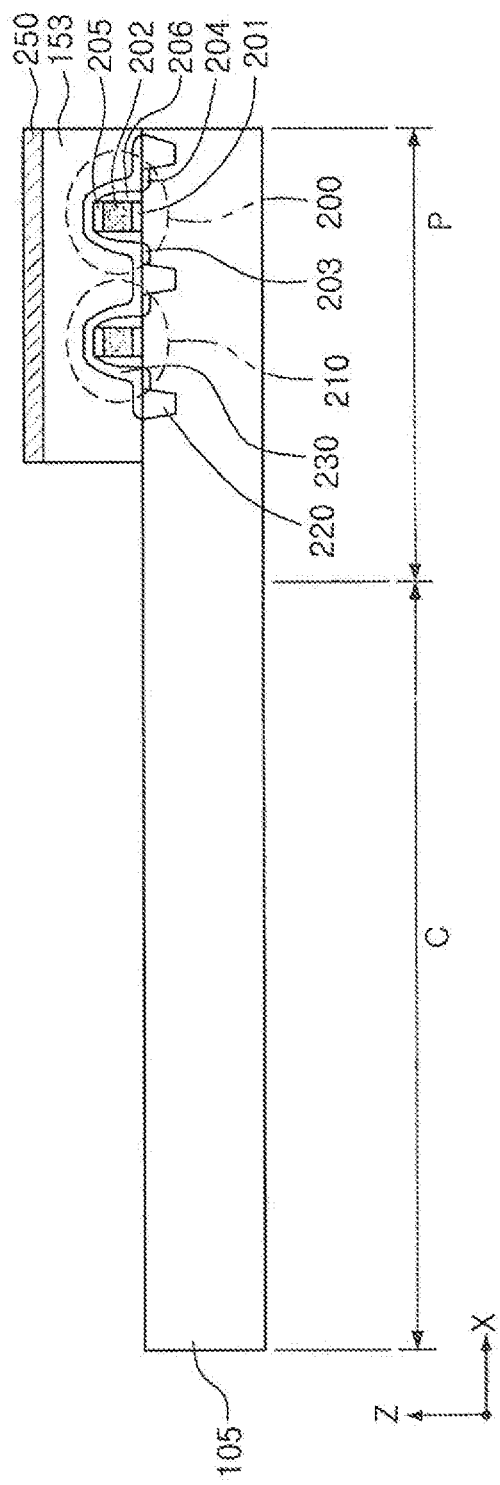
FIGS. 10A to 10F are views a method of fabricating the memory device, illustrated in FIG. 5.

Referring to FIG. 10A, a plurality of horizontal transistors 200 and 210, a first interlayer insulating layer 153, an blocking layer 250 may be formed on a substrate 105 in a peripheral circuit region P. Each of the plurality of horizontal transistors 200 and 210 may include a horizontal source electrode 203, a horizontal drain electrode 204, and a horizontal gate electrode 202. A horizontal gate insulating layer 201 may be formed between the horizontal gate electrode 202 and the substrate 105, a capping layer 205 may be formed on an upper surface of the horizontal gate electrode 202, and a gate spacer 206 may be formed on side surfaces of the horizontal gate electrode 202. After the capping layer 205 and the gate spacer 206 are formed, the horizontal source electrode 203 and the horizontal drain electrode 204 may be formed by an ion implantation process.

A device isolation layer 220 may be disposed outside of the horizontal source electrode 203 and the. horizontal drain electrode 204. When the peripheral circuit region P includes a plurality of horizontal transistors 200 and 210, the device isolation layer 220 may be disposed between the horizontal transistors 200 and 210. In addition, a device protection layer 230 may be formed on the horizontal transistors 200 and 210 and the device isolation layer 220. The device protection layer 230 may be formed of a silicon oxide layer using an MTO process, and may have a thickness of about 50 Å.

The first interlayer insulating layer 153 and the blocking layer 250a may be formed on the plurality of horizontal transistors 200 and 210. The first interlayer insulating layer 153 and the blocking layer 250 may be formed using the same method similar to that according to the exemplary embodiment described with reference to FIGS. 9B to 9D.

Figure 10B:
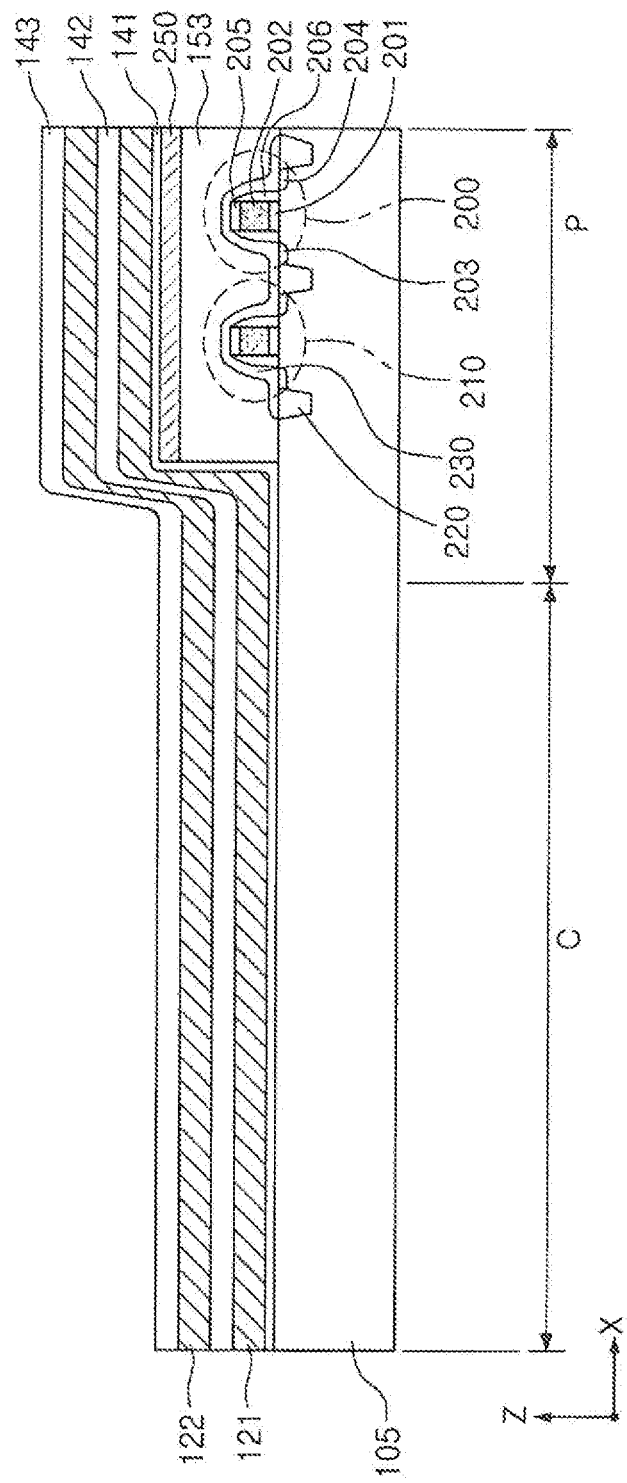

Next, referring to FIG. 10B, some insulating layers 141 to 143 and some sacrificial layers 121 and 122 may be formed on the substrate 105. The insulating layers 141 to 143 and the sacrificial layers 121 and 122 may be formed on the substrate 105 throughout the cell region C and the peripheral circuit region P. The insulating layers 141 to 143 and the sacrificial layers 121 and 122 may be etched as illustrated in FIG. 10C to provide pad areas having a step structure.

Figure 10C:
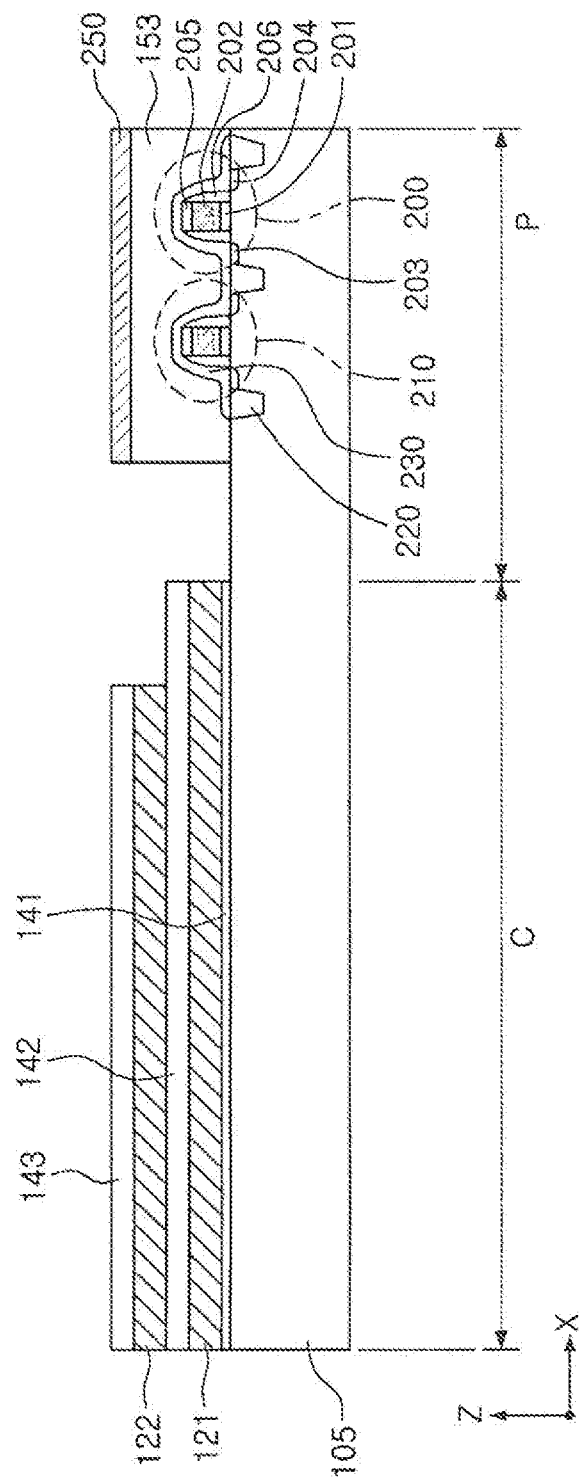

Referring to FIG. 10C, the sacrificial layers 121 and 122 and insulating layers 141 to 143 disposed closer to the substrate 105 along a vertical direction (the z-axis direction) may extend relatively longer in the x-axis direction. In order to form the step structure as illustrated in FIG. 10C, the sacrificial layers 120 and the insulating layers 140 exposed by a mask layer may be etched by etching the sacrificial layers 121 and 122 and the insulating layers 141 to 143 exposed by a mask layer while trimming the mask layer, several times.

Figure 10D:
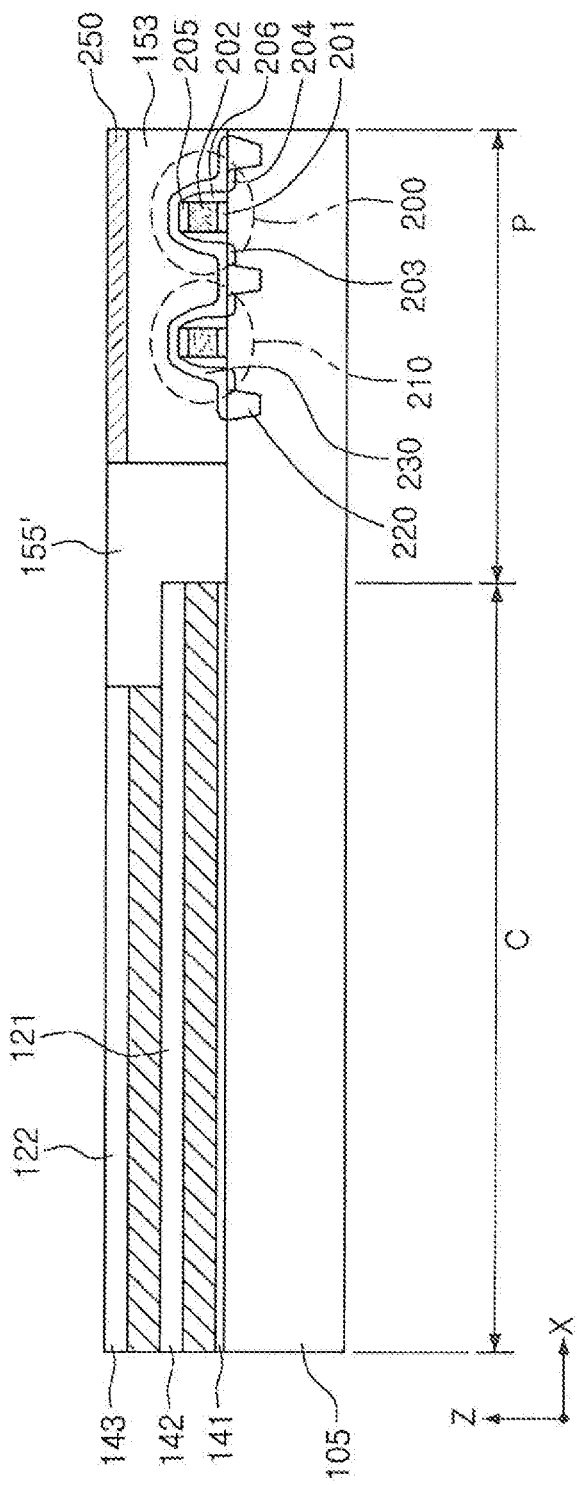

When the step structure is formed, a second interlayer insulating layer 155' may be formed as illustrated in FIG. 10D. Differently from the memory device 100 described with reference to FIGS. 4 and 9A to 9M, the second interlayer insulating layer 155' according to the exemplary embodiment of the present inventive concept may be formed between the plurality of insulating layers 141 to 143 and the first interlayer insulating layer 153. The second interlayer insulating layer 155' may include an HDP oxide layer having excellent gap-filling properties, similar to the first interlayer insulating layer 153. Referring to FIG. 5, the second interlayer insulating layer 155' may cover at least one side surface 255 of the blocking layer 250.

The second interlayer insulating layer 155' may be formed as illustrated in FIG. 10D by depositing the HDP oxide layer on the cell region C and the peripheral circuit region P and polishing the HDP oxide layer such that an upper surface of the second interlayer insulating layer 155' is substantially coplanar with respect to an upper surface of the blocking layer 250. An upper surface of a third insulating layer 143 may be coplanar with respect to upper surfaces of the second interlayer insulating layer 155' and the blocking layer 250.

Figure 10E:
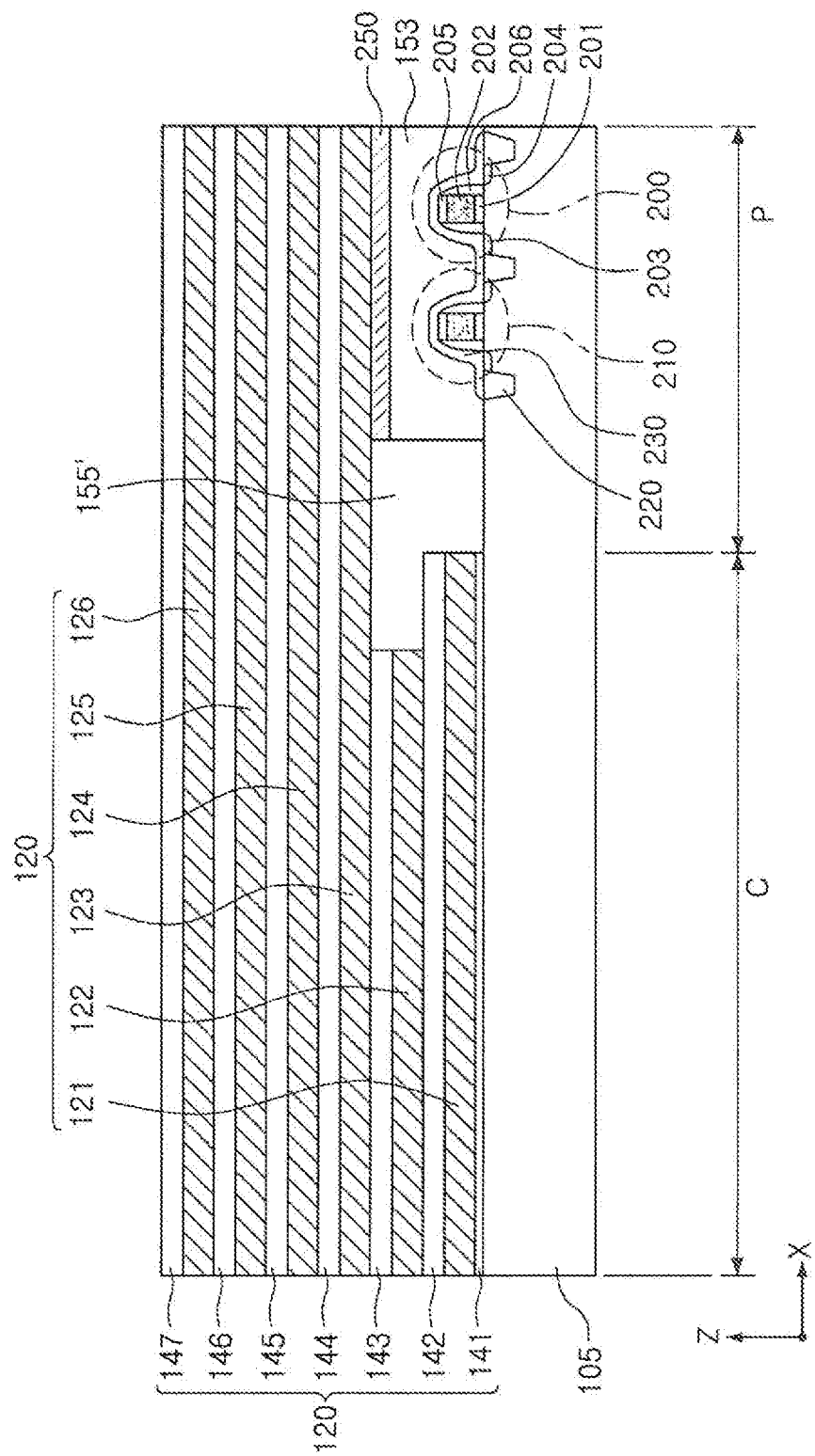
Figure 10F:
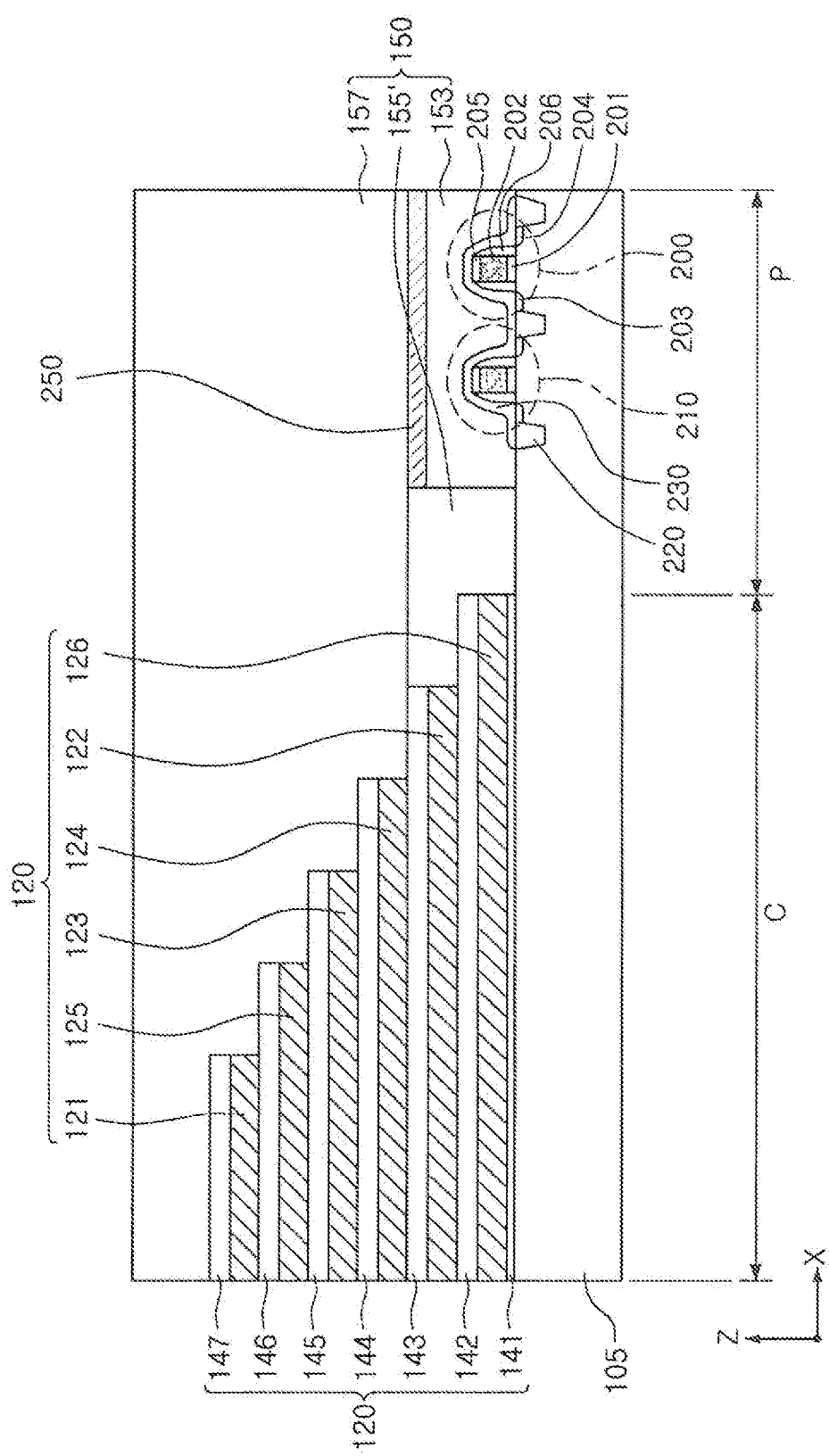

Next, referring to FIG. 10E, the other sacrificial layers 123 to 126 and the other insulating layers 144 to 147 may be additionally formed on the second interlayer insulating layer 155', the blocking layer 250, and the third insulating layer 143, When the sacrificial layers 123 to 126 and the insulating layers 144 to 147 are formed, pad areas having a stacked structure may be formed by etching the sacrificial layers 123 to 126 and the insulating layers 144 to 147, and a third interlayer insulating layer 157 may be formed thereon, as illustrated in FIG. 10F.

Accordingly, a plurality of pad areas in which a plurality of sacrificial layers 121 to 126 (generally denoted 120) and insulating layers 141 to 147 (generally denoted 140) extend in different lengths from each other in the x-axis direction may be formed as illustrated in FIG. 10F. In addition, the interlayer insulating layer 150 may include first to third interlayer insulating layers 153, 155', and 157. The third interlayer insulating layer 157 may have a greater volume than the first and second interlayer insulating layers 153 and 155' and accordingly, may include a TEOS oxide layer having a high deposition rate.

When the pad areas and the interlayer insulating layer 150 are formed as illustrated in FIG. 10F, a channel area 110, a plurality of gate electrode layers 130, a blocking layer 162, a charge storage layer 164, a tunneling layer 166, and contact plugs 170 and 240 may be formed by a method similar to that described with reference to FIGS. 9H to 9M.

FIGS. 11A to 11G are views illustrating a method of fabricating the memory device 300 illustrated in FIG. 6. FIGS. 11A to 11G may be cross-sectional views taken from the y-axis direction of the perspective view of FIG. 6 according to a process sequence.

Figure 11A:
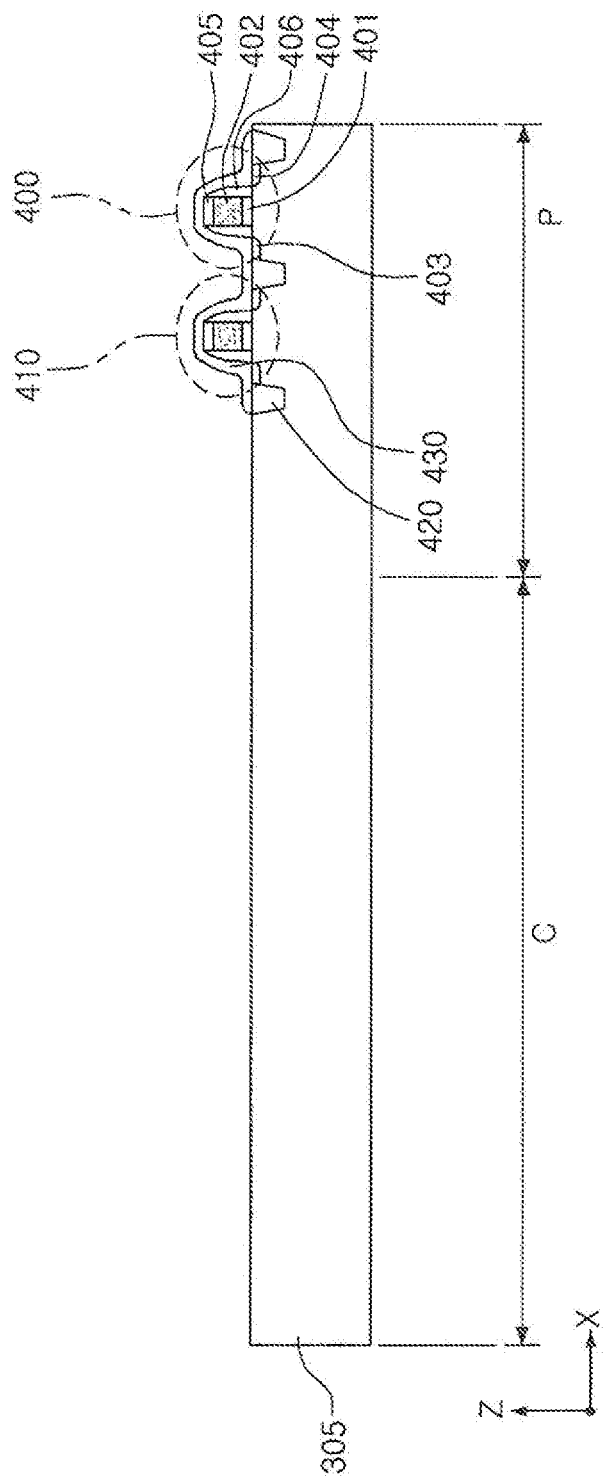
FIGS. 11A to 11G are views illustrating a method of fabricating the memory device illustrated in FIG. 6.

Referring to FIG. 11A, a memory device 300 according to the exemplary embodiment of the present inventive concept may include a cell region C and a peripheral circuit region R The peripheral circuit region P may include a plurality of circuit devices, and the plurality of circuit devices may include horizontal transistors 400 and 410 formed on a substrate 305 as illustrated in FIG. 11A. Each of the horizontal transistors 400 and 410 may include a horizontal source electrode 403, a horizontal drain electrode 404, and a horizontal gate electrode 402. A capping layer 405, a horizontal gate insulating layer 401, and a gate spacer 406 may be respectively formed on an upper surface, a lower surface, and side surfaces of the horizontal gate electrode 402, and a device isolation layer 420 may be formed between the horizontal transistors 400 and 410. A device protection layer 430 including a silicon oxide layer deposited using an MTO process may be formed on the horizontal transistors 400 and 410.

Figure 11B:
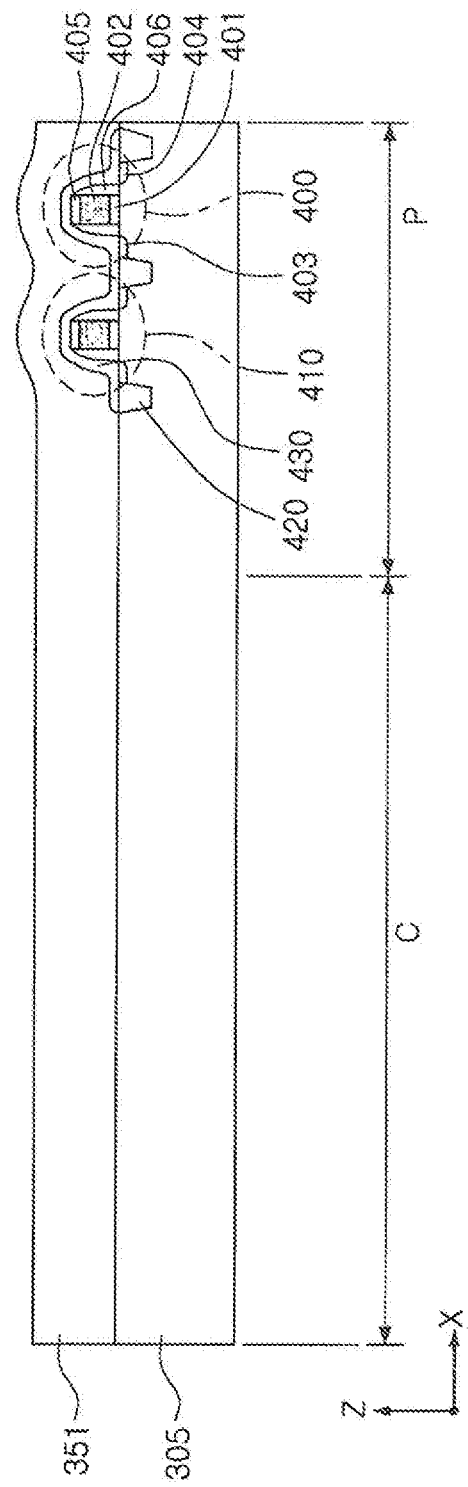

Next, referring to FIG. 11B, a first oxide layer 351 for forming a first interlayer insulating layer 353 may be formed on the substrate 305. The first oxide layer 351 may include an HDP oxide layer having excellent gap-filling properties. Differently from the exemplary embodiment illustrated in FIG. 9B, a polishing process (CMP) for planarizing an upper surface of the first oxide layer 351 may be omitted in the exemplary embodiment illustrated in FIG. 11B.

Figure 11C:
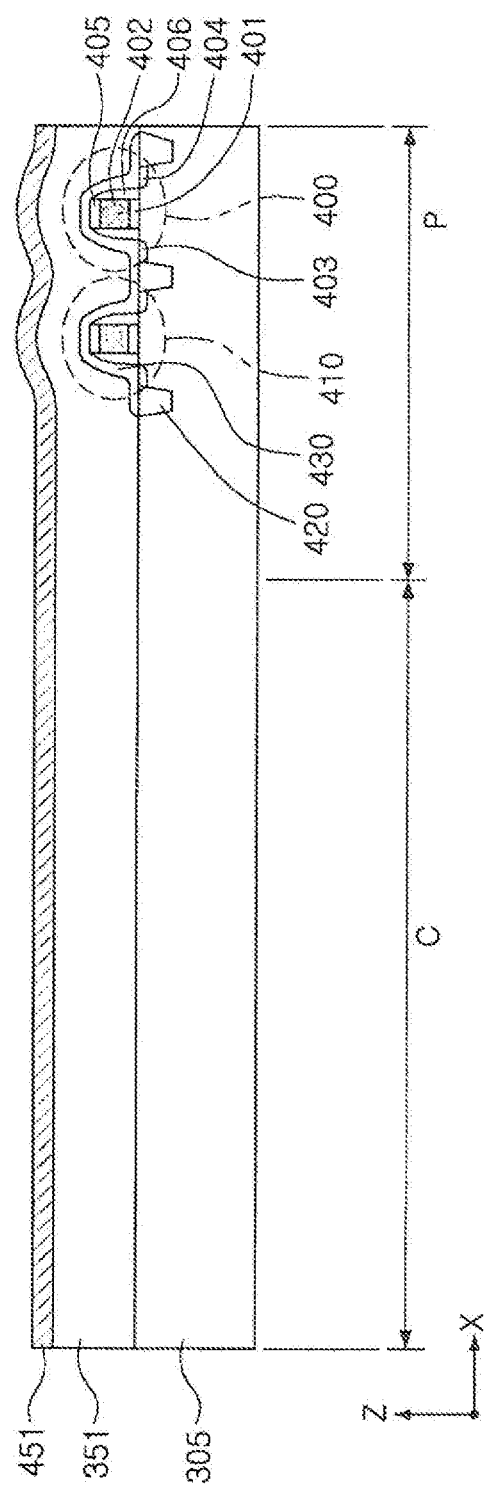
Figure 11D:
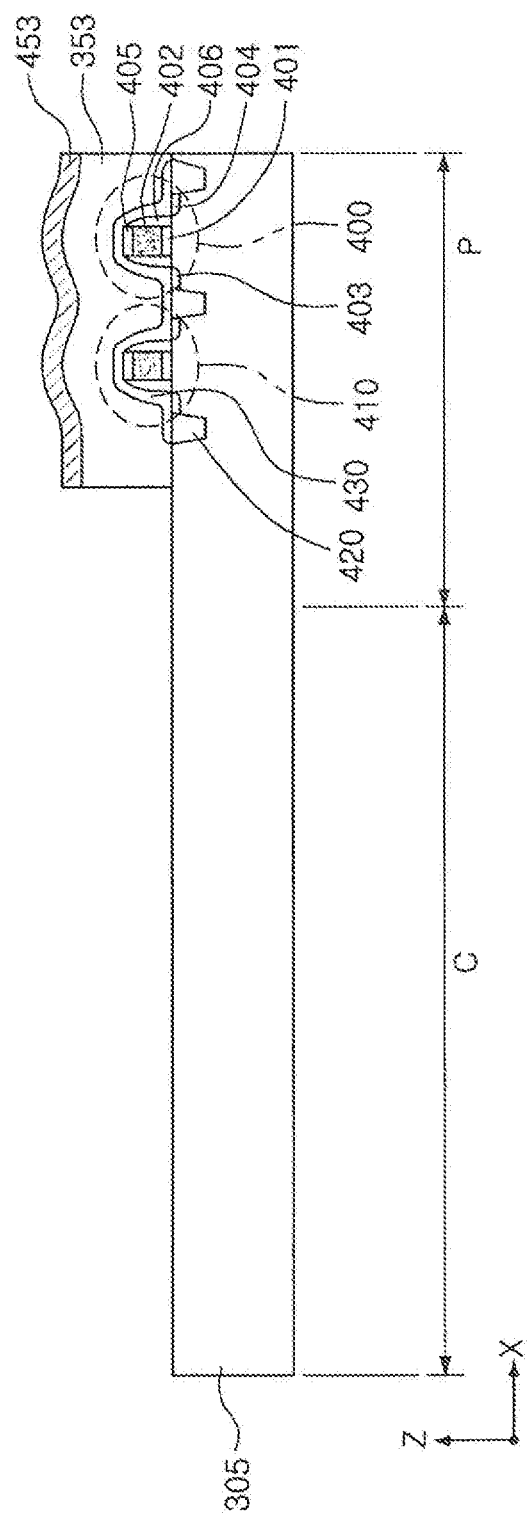

Referring to FIG. 11C, a preliminary blocking layer 451 may be formed on the first oxide layer 351. The preliminary blocking layer 451 may be a layer provided to form an blocking layer 450 in a subsequent process, and may be formed on the first oxide layer 351 throughout the cell region C and the peripheral circuit region P. Next, referring to FIG. 11D, a first interlayer insulating layer 353 and the blocking layer 450 may be formed by removing the first oxide layer 351 and the preliminary blocking layer 451 from an area other than at least a portion of the peripheral circuit region P. Since a process of polishing an upper surface of the first oxide layer 351 is omitted, upper surfaces of the first interlayer insulating layer 353 and the blocking layer 450 may have a curved shape corresponding to gate electrodes of the horizontal transistors 400 and 410 in the peripheral circuit region P.

Figure 11E:
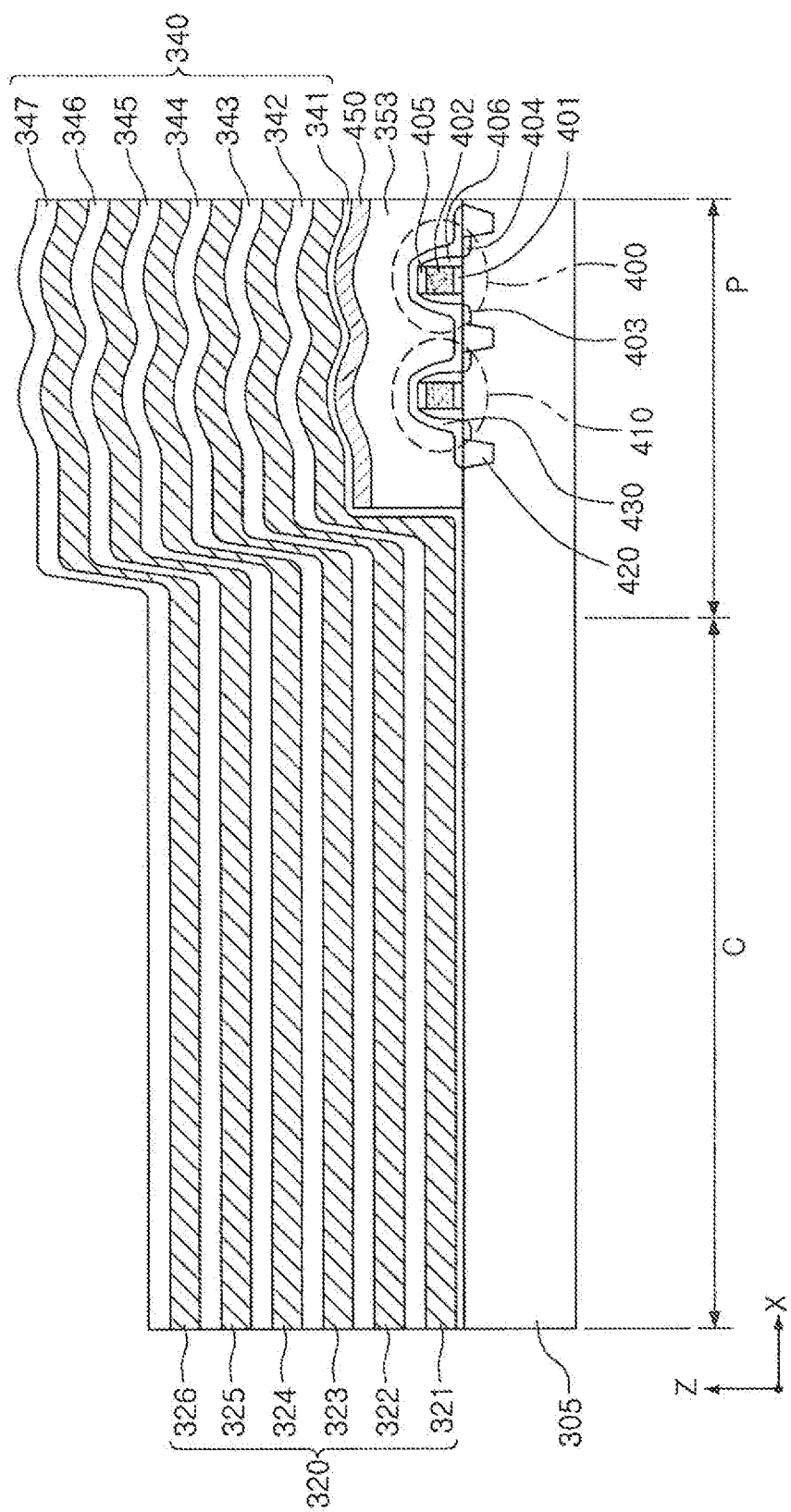

Referring to FIG. 11E, a plurality of insulating layers 341 to 347 (generally denoted 340) and a plurality of sacrificial layers 321 to 326 (generally denoted 320) may be alternately formed on a substrate 305. The sacrificial layers 320 may be formed of a material having etch selectivity with respect to the insulating layers 340. That is, the sacrificial layers 320 may include a material that can be preferentially etched relative to the insulating layers 340. For example, when the insulating layers 340 include silicon oxide, the sacrificial layers 320 may be formed of silicon nitride.

Figure 11F:
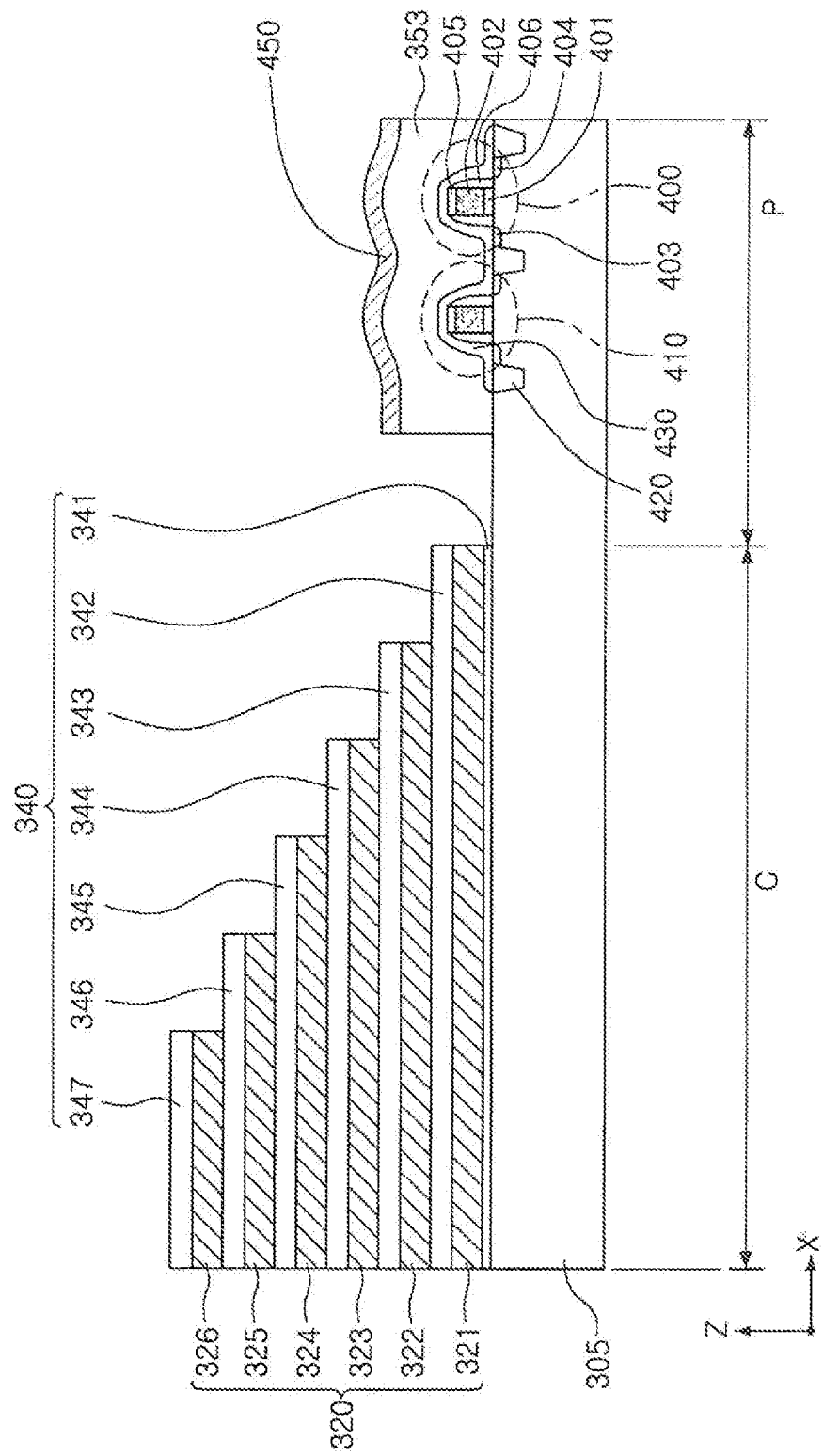

Next, referring to FIG. 11F, the plurality of sacrificial layers 320 and insulating layers 340 alternately stacked on the substrate 305 may be etched to form pad areas having a step structure. In order to form the step structure between the sacrificial layers 320 and the insulating layers 340 adjacent to each other in the z-axis direction, as illustrated in FIG. 11F, a predetermined mask layer may be formed on the plurality of sacrificial layers 320 and insulating layers 340 alternately stacked on the substrate 305, and the sacrificial layers 320 and the insulating layers 340 exposed by the mask layer may be etched. By etching the sacrificial layers 320 and the insulating layers 340 exposed by a mask layer several times while trimming the mask layer, the sacrificial layers 320 and the insulating layers 340 exposed by the mask layer may be sequentially etched to form a plurality of steps as illustrated in FIG. 11F.

Figure 11G:
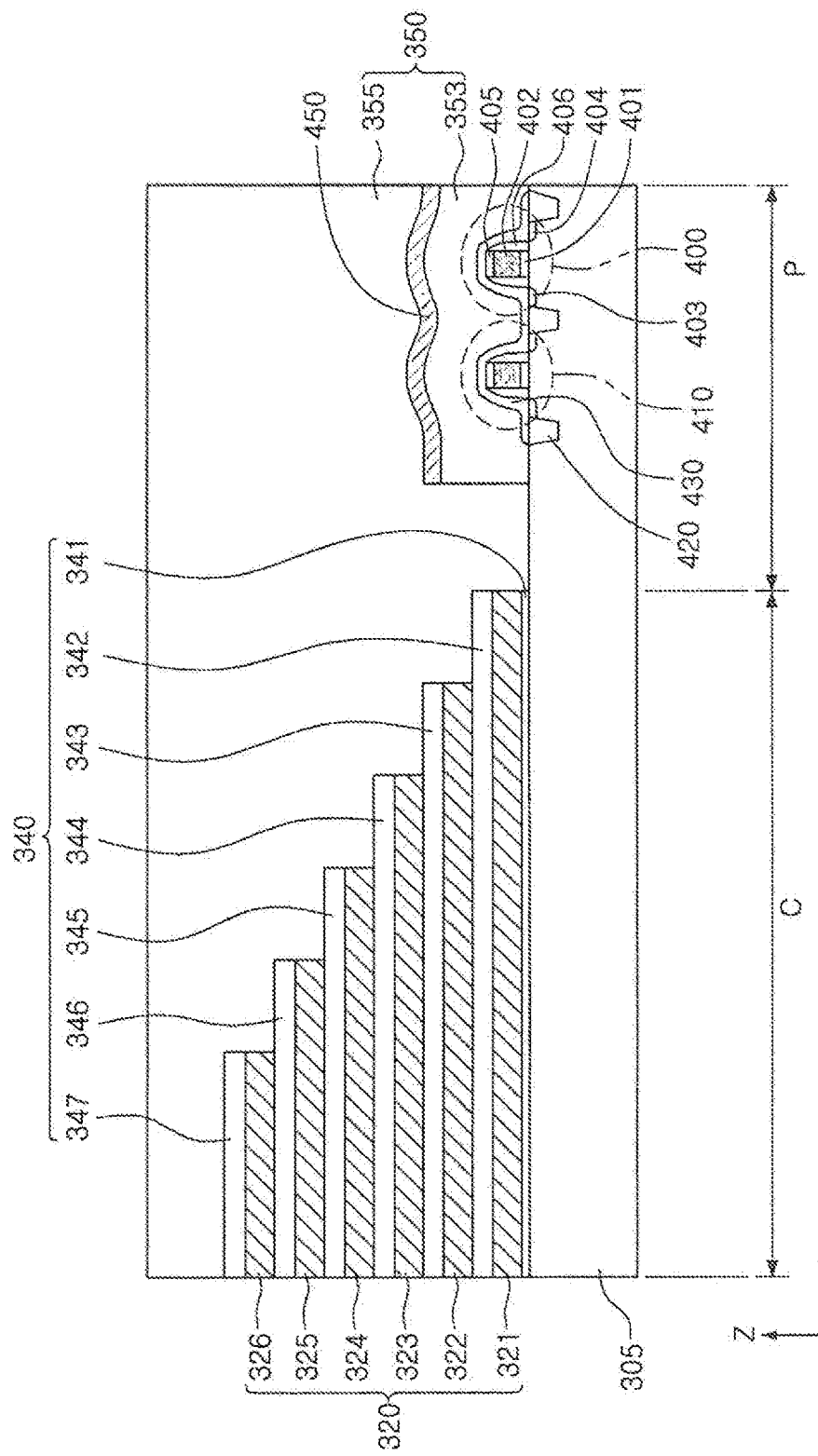

After the step structure is formed, as illustrated in FIG. 11G, a second interlayer insulating layer 355 may be formed on the first interlayer insulating layer 353 and the blocking layer 450. The second interlayer insulating layer 355 may cover the upper surface and at least one side surface 455 of the blocking layer 450 as illustrated in FIG. 6. The second interlayer insulating layer 355 may be formed of a TEOS oxide layer having a high deposition rate in order to reduce process time After the pad areas and the interlayer insulating layer 350 are formed as illustrated in FIG. 11G, a channel area 310, a plurality of gate electrode layers 330, a blocking layer 362, a charge storage layer 364, a tunneling layer 366, and contact plugs 370 and 440 may be formed by a method similar to that described with reference to FIGS. 9H to 9M.

FIGS. 12A to 12G are views illustrating a method of fabricating the memory device 500 illustrated in FIG. 7. FIGS. 12A to 12G may be cross-sectional views taken from the y-axis direction of the perspective view of FIG. 7 according to a process sequence.

Figure 12A:
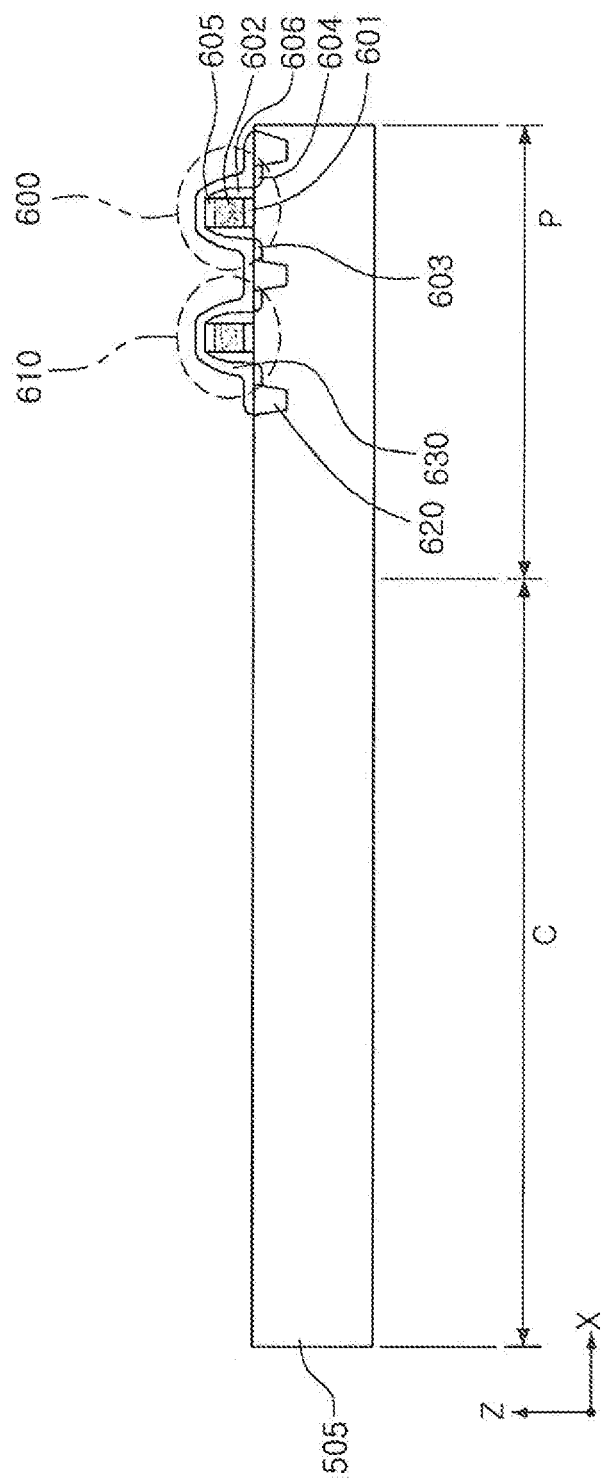
FIGS. 12A to 12G are views illustrating a method of fabricating the memory device illustrated in FIG. 7.

Referring to FIG. 12A, a plurality of horizontal transistors 600 and 610 may be formed on a substrate 505 in the peripheral circuit region P. Similar to the above-described exemplary embodiments, a device isolation layer 620 may be formed between the plurality of horizontal transistors 600 and 610. Each of the horizontal transistors 600 and 610 may include a horizontal source electrode 603, a horizontal drain electrode 604, a horizontal gate electrode 602, a horizontal gate insulating layer 601, a capping layer 605, and a gate spacer 606. A device protection layer 630 including silicon oxide may be formed on the horizontal transistors 600 and 610.

Figure 12B:
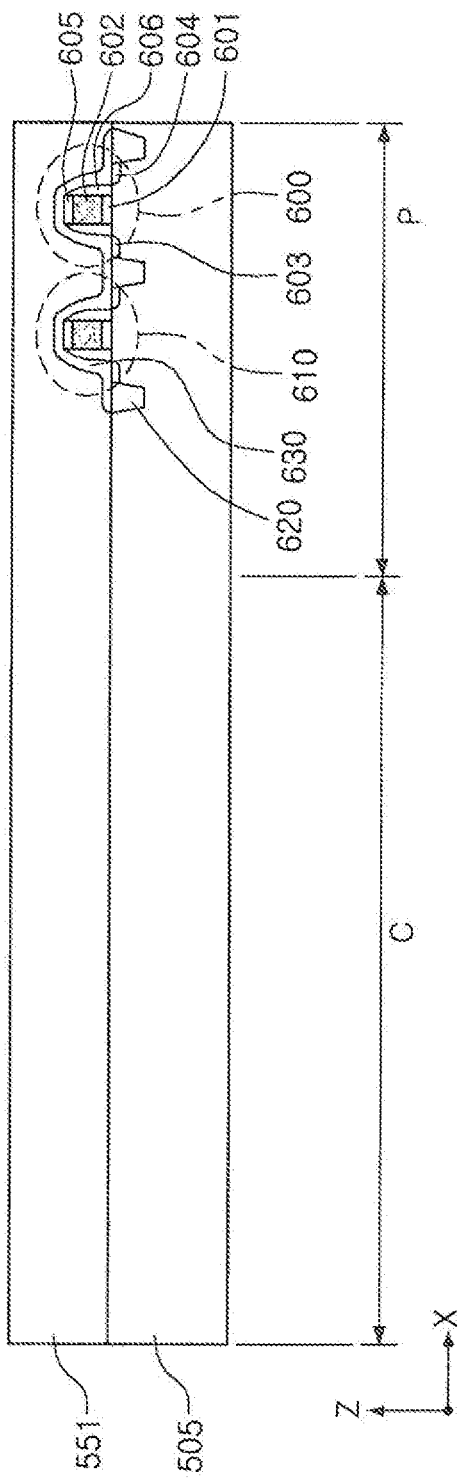
Figure 12C:
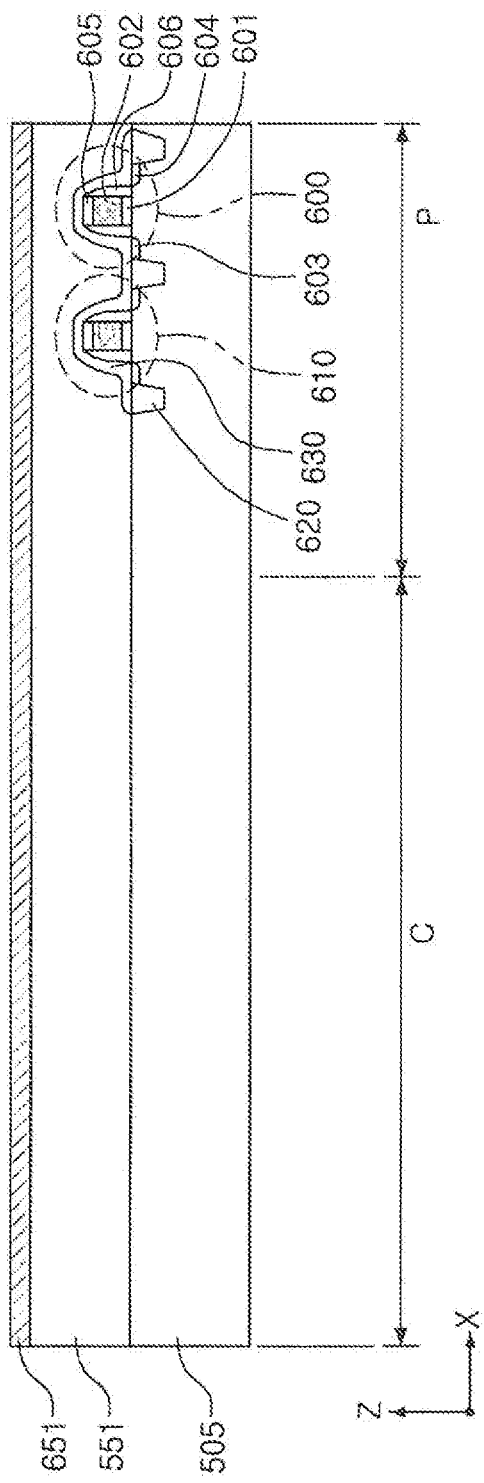

Referring to FIG. 12B, a first oxide layer 551 may be formed on the substrate 505. The first oxide layer 551 may be provided to form a first interlayer insulating layer 553, and may fill a space between the horizontal transistors 600 and 610 in the peripheral circuit region P. Accordingly, the first oxide layer 551 may be formed of a HDP oxide layer having excellent gap-filling properties. The first oxide layer 551 may have a curved upper surface corresponding to the horizontal transistors 600 and 610, and the curved upper surface of the first oxide layer 551 may be planarized by a polishing (CMP) process as illustrated in FIG. 12B.

Figure 12D:
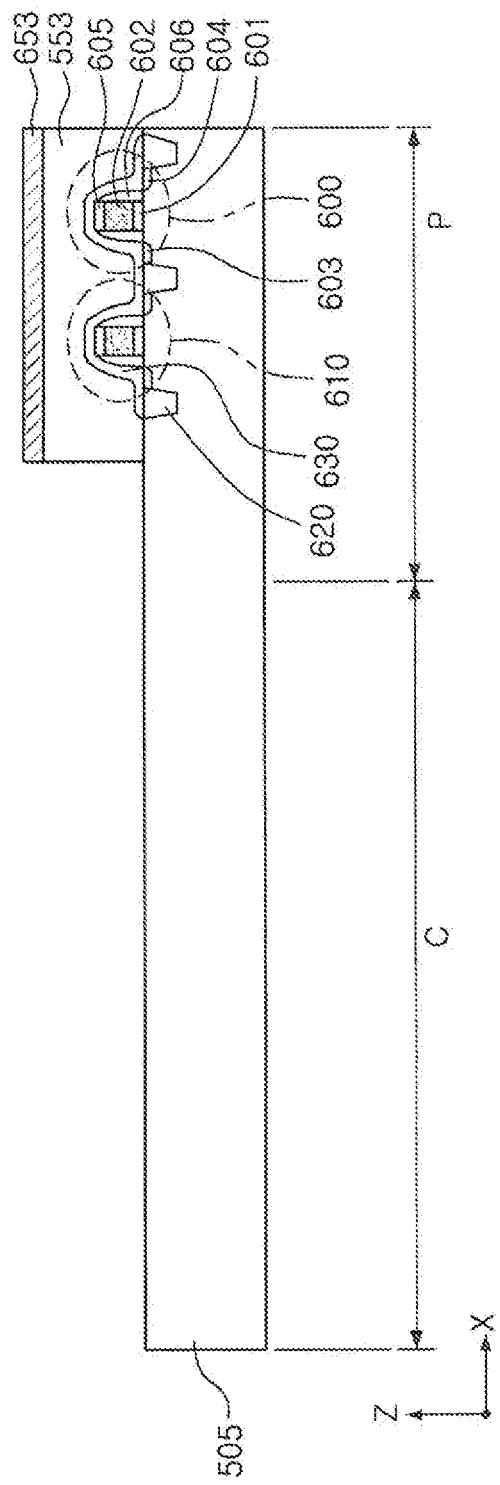

Next, referring to 12C, a preliminary blocking layer 651 may be formed on the upper surface of the first oxide layer 551. The preliminary blocking layer 651 may be formed throughout the cell region C and the peripheral circuit region P, similar to the first oxide layer 551. Next, as illustrated in FIG. 12D, the first interlayer insulating layer 553 and the first blocking layer 653 may be formed by retaining the first oxide layer 551 and the preliminary blocking layer 651 only in a portion of the peripheral circuit region P as illustrated in FIG. 12D.

Figure 12E:
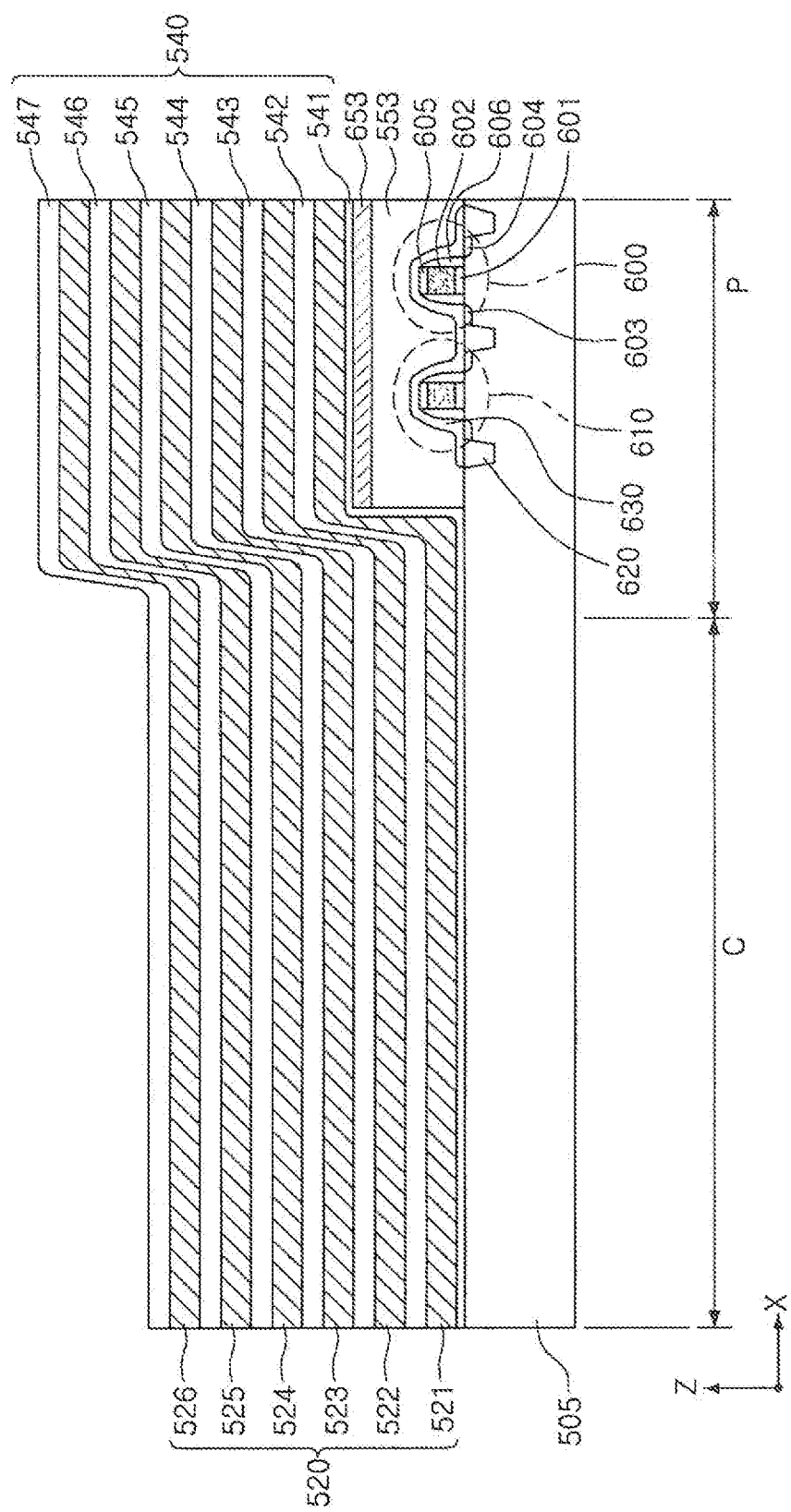

After the first interlayer insulating layer 553 and the first blocking layer 653 are formed, a plurality of sacrificial layers 521 to 526 (generally denoted 520) and a plurality of insulating layers 541 to 547 (generally denoted 540) may be formed on the substrate 505 as illustrated in FIG. 12E. The plurality of sacrificial layers 520 and the plurality of insulating layers 540 may be formed of materials having etching selectivities with respect to each other. For example, the plurality of sacrificial layers 520 may be formed of silicon nitride, and the plurality of insulating layers 540 may be formed of silicon oxide. The plurality of sacrificial layers 520 and the plurality of insulating layers 540 may have the same thickness or different thicknesses. For example, a thickness of a first insulating layer 541 disposed at the closest to the substrate 505 may be thinner than the other insulating layers 542 to 547.

Figure 12F:
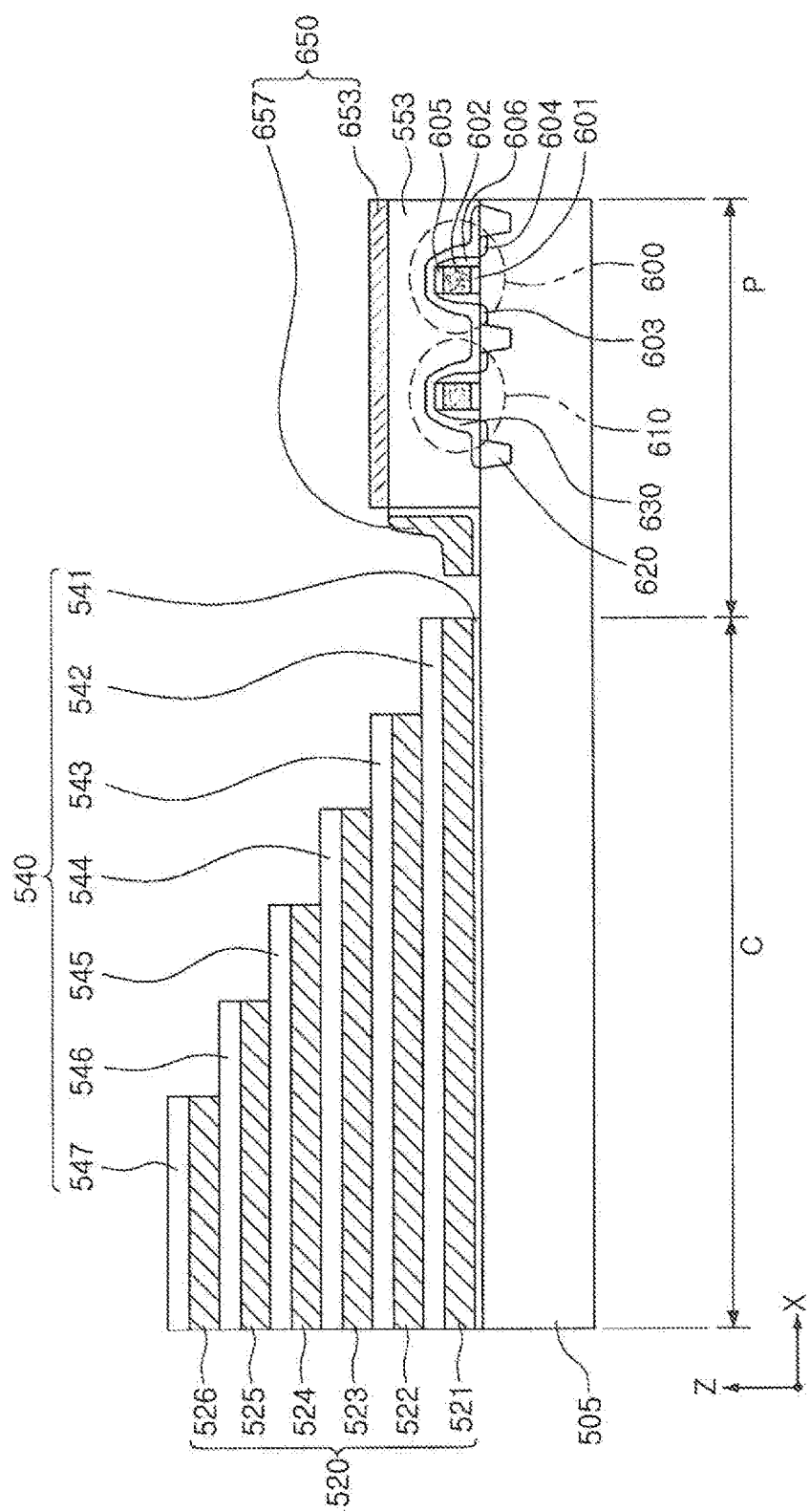

Next, referring to FIG. 12F, the plurality of sacrificial layers 520 and insulating layers 540 may be etched to form a plurality of pad areas having a step structure. A mask layer may be formed on the plurality of sacrificial layers 520 and insulating layers 540, and an area exposed by the mask layer may be etched several times. Accordingly, a plurality of sacrificial layers 520 and the insulating layers 540 may be etched to have a structure as illustrated in FIG. 12F.

Still referring to FIG. 12F, portions of the sacrificial layers 520 and insulating layers 540 disposed relatively closer to the substrate 505 in a vertical direction the z-axis direction) may remain in the peripheral circuit region P adjacent to the cell region C after forming the step structure. In this case, a portion of the sacrificial layer 520 may partially remain on a side surface of the first interlayer insulating layer 553, and may act as a second blocking layer 657, as illustrated in FIG. 12F. The second blocking layer 657 may function to reduce/prevent mobile charges from flowing into the horizontal transistors 600 and 610, similar to the first blocking layer 653. Moreover, a portion of the insulating layer 540 may partially remain between the second blocking layer 657 and the first interlayer insulating layer 553. The blocking layer 653 may function to reduce/prevent over-etching in the peripheral circuit region P during a process of forming vertical openings to form contact plugs 570 and 640.

In FIG. 12F, the second interlayer insulating layer 657 is illustrated as including a single layer and formed by remaining on the lowermost first sacrificial layer 521 in the vertical direction (the z-axis direction), but is not limited thereto. That is, when the first and second sacrificial layers 521 arid 522 disposed closer to the substrate 505 in the vertical direction are retained, a portion of the insulating layer 542 may exist between the plurality of layers included in the second blocking layer 657.

In order to more effectively prevent mobile charges from flowing into the horizontal transistors 600 and 610, etching conditions, such as etch times, for forming the plurality of pad areas may be adjusted to allow portions of the insulating layers 540 and sacrificial layers 520 to remain on the side surface of the first interlayer insulating layer 553. However, the portions of the insulating layers 540 and sacrificial layers 520 on the side surface of the first interlayer insulating layer 553 may be isolated from the plurality of insulating layers 540 and sacrificial layers 520 providing the pad areas in the cell region C.

Figure 12G:
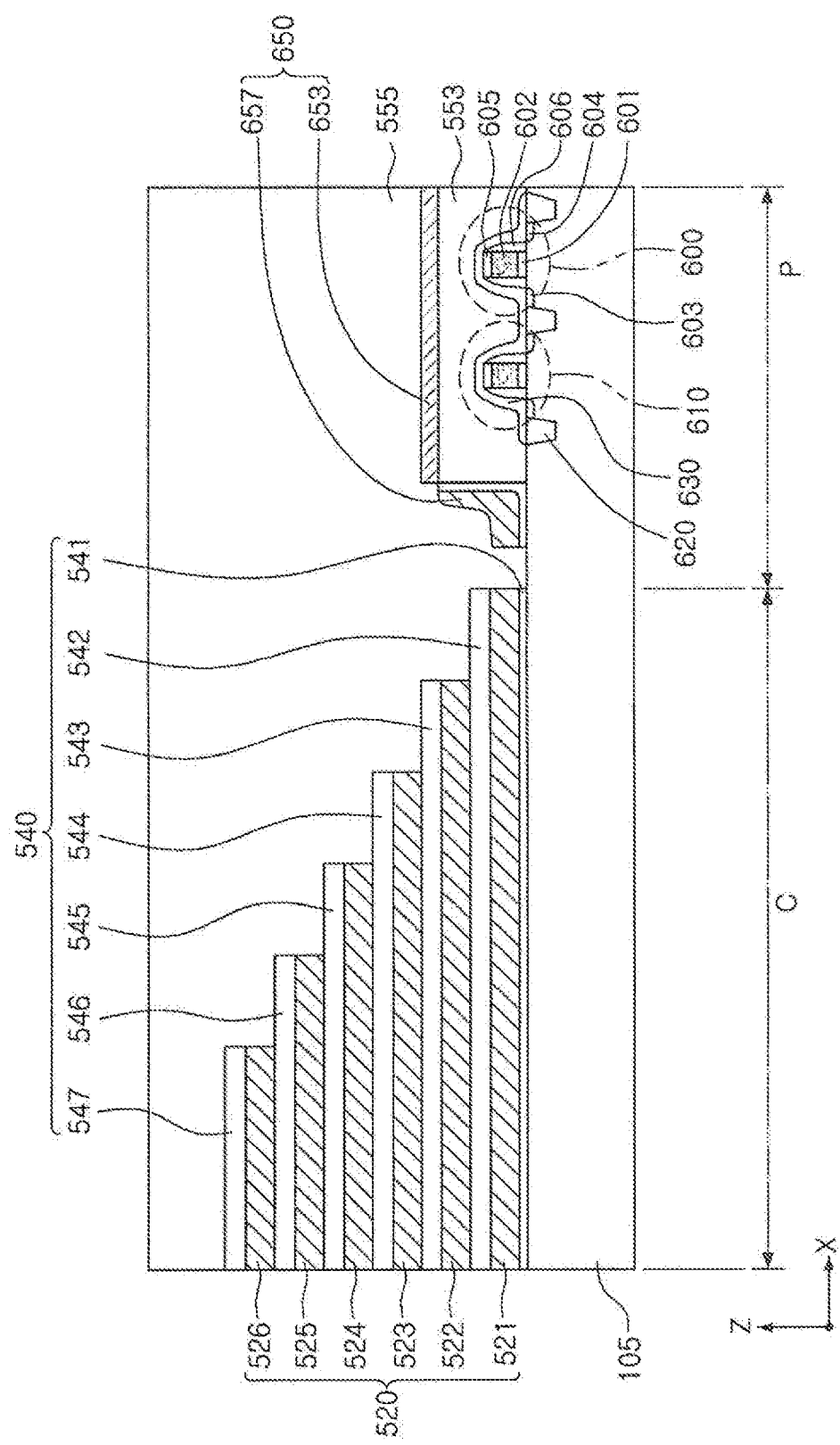

Next, referring to FIG. 12G, a second interlayer insulating layer 555 may be formed on the substrate 505. Since the second interlayer insulating layer 555 has a greater volume than the first interlayer insulating layer 553, the second interlayer insulating layer 555 may include a TEOS oxide layer having a high deposition rate to reduce process time. Since the second interlayer insulating layer 555 may be formed throughout the cell region C and the peripheral circuit region P, at least portions of one sides of the first blocking layer 653 and the second blocking layer 657 may be covered by the second interlayer insulating layer 555 as illustrated in FIG. 7.

As illustrated in FIG. 12G, when the interlayer insulating layer 550 is formed, a channel area 510, a plurality of gate electrode layers 530, a blocking layer 562, a charge storage layer 564, a tunneling layer 566, and contact plugs 570 and 640 may be formed by a method similar to that described with reference to FIGS. 9H to 9M.

FIGS. 13A to 13F are views illustrating a method of fabricating the memory device 700 illustrated in FIG. 8. FIGS. 13A to 13F may be cross-sectional views taken from the y-axis direction of the perspective view of FIG. 8 according to a process sequence.

First, a plurality of horizontal transistors 800 and 810 may be formed on a peripheral circuit region P of a substrate 705. The plurality of horizontal transistors 800 and 810 may have a structure similar to that of the other exemplary embodiments described above.

Figure 13A:
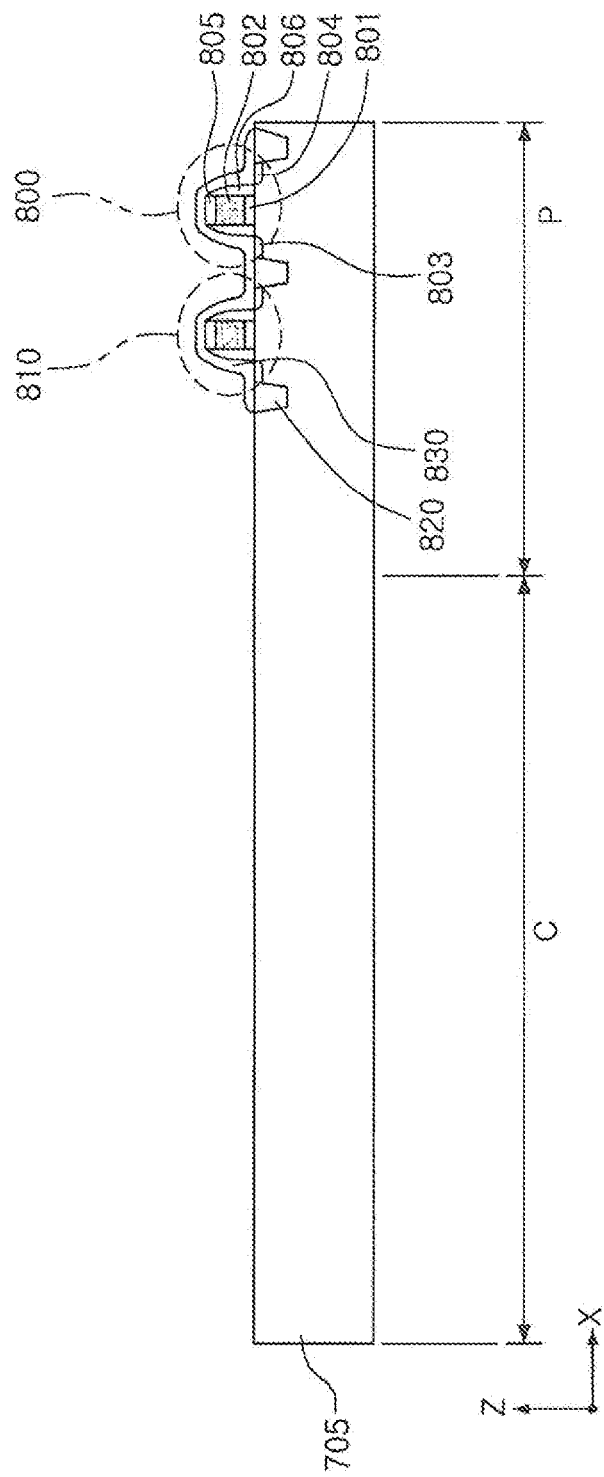
FIGS. 13A to 13F are views illustrating a method of fabricating the memory device illustrated in FIG. 8.
Figure 13B:
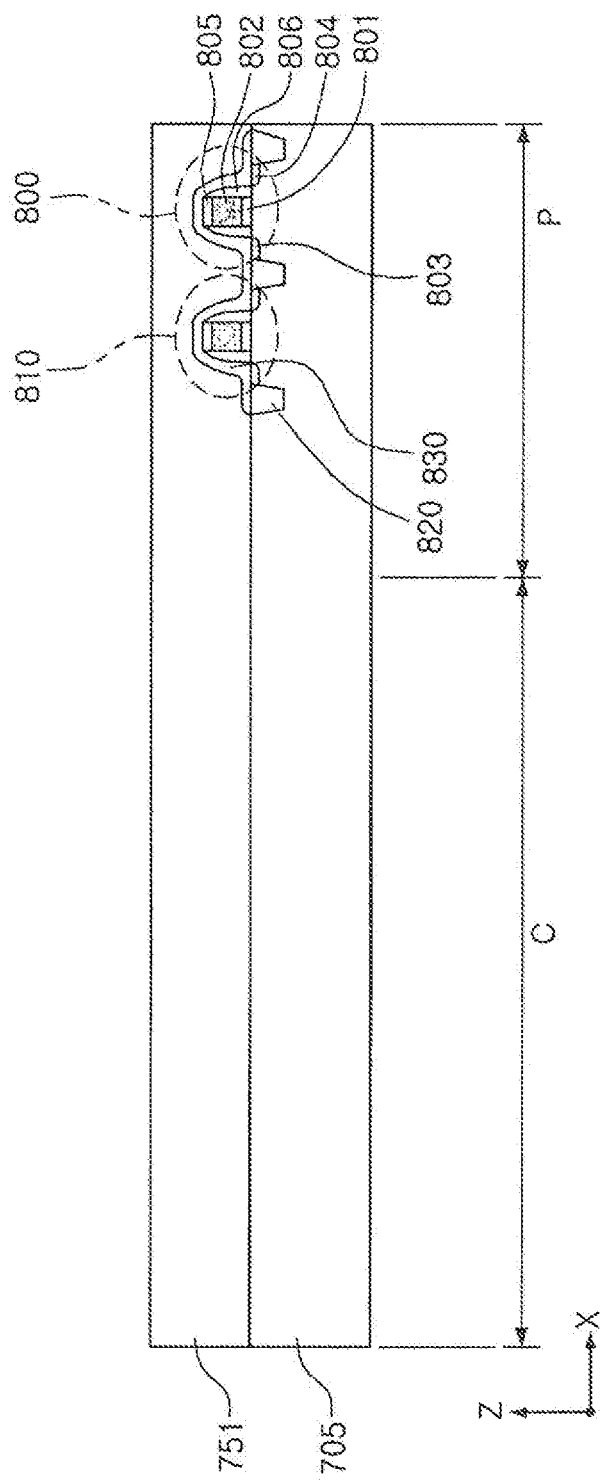

Next, referring to FIG. 13B, a first oxide layer 751 may be formed on the substrate 705. The first oxide layer 751 may be provided to form a first interlayer insulating layer 753, and may include an HDP oxide layer having excellent gap-filling properties to fill a space between the horizontal transistors 600 and 610 in the peripheral circuit region R An upper surface of the first oxide layer 751 may have a curved surface corresponding to the horizontal transistors 800 and 810, and may be planarized as illustrated in FIG. 13B using a CMP process.

Figure 13C:
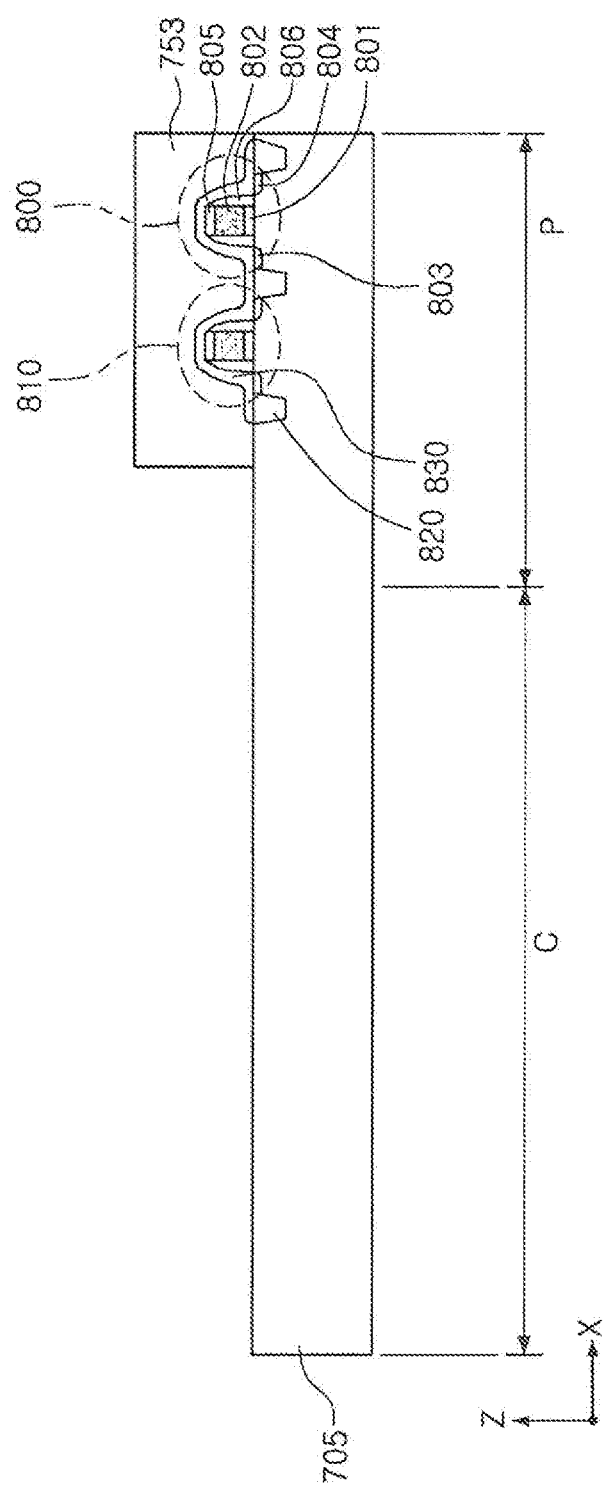

Referring to FIG. 13C, the first oxide layer 751 may be removed from every region except at least a portion of the peripheral circuit region P, and thereby a first interlayer insulating layer 753 may be formed. In order to form the first interlayer insulating layer 753, a mask layer opening a cell region C and a portion of the peripheral circuit region P adjacent to the cell region C may be formed on the first oxide layer 751, and an etching process may be performed.

Figure 13D:
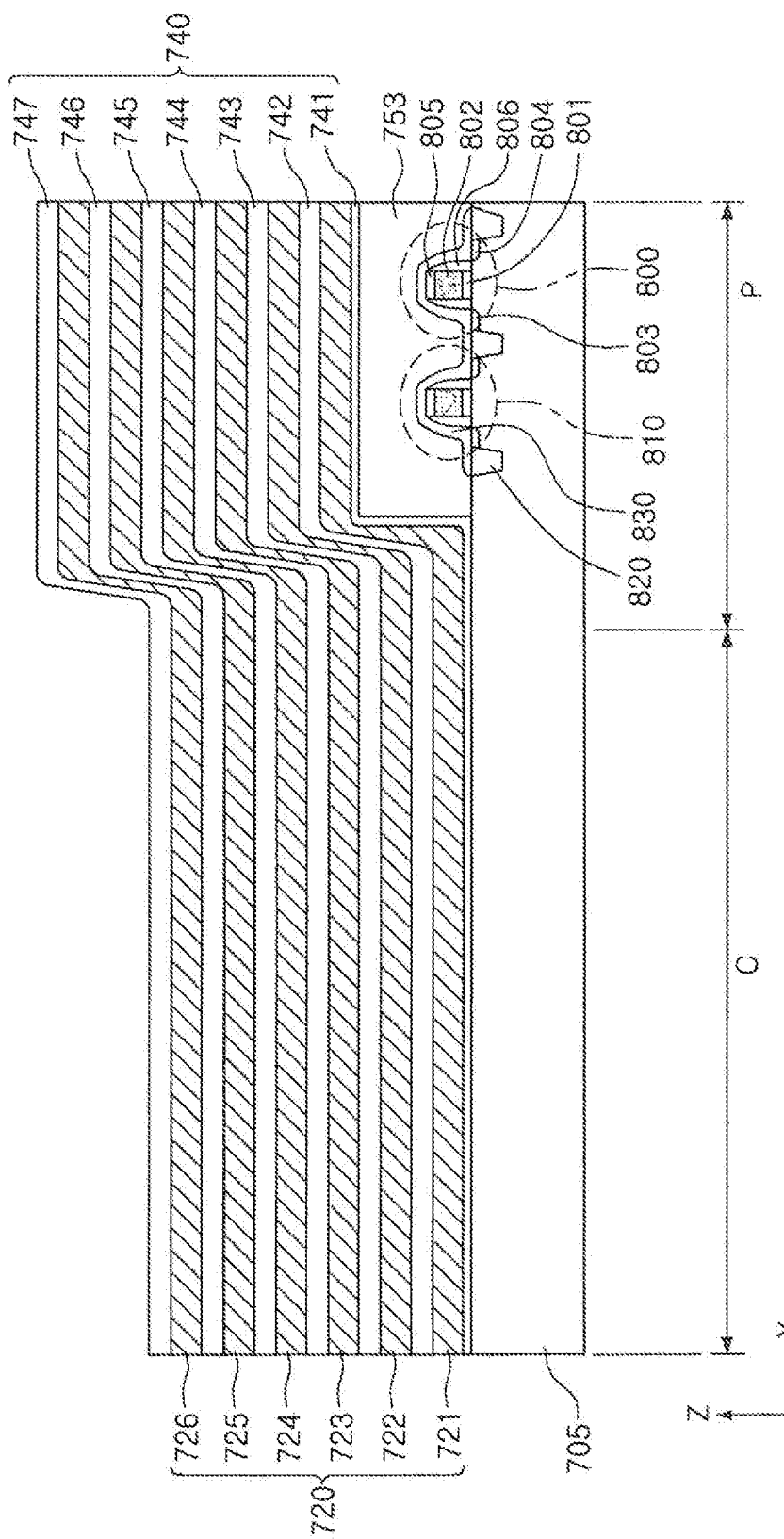

After the first interlayer insulating layer 753 is formed, a plurality of sacrificial layers 721 to 726 (generally denoted 720) and a plurality of insulating layers 741 to 747 (generally denoted 740) may be formed as illustrated in FIG. 13D. The plurality of sacrificial layers 720 and the plurality of insulating layers 740 may be alternately stacked on the substrate 705, and may have a curved area at which the first interlayer insulating layer 753 begins in the peripheral circuit region P Next, referring to FIG. 13E, the plurality of sacrificial layers 720 and the insulating layers 740 may be etched to form a plurality of pad areas. The pad areas illustrated in FIG. 13E may be formed by forming a predetermined mask layer on the plurality of sacrificial layers 720 and insulating layers 740 and selectively etching a region exposed by the mask layer. In particular, according to the exemplary embodiment illustrated in FIG. 13, at least a portion of the plurality of sacrificial layers 720 and insulating layers 740 may remain in the peripheral circuit region P adjacent to the cell region C.

Figure 13E:
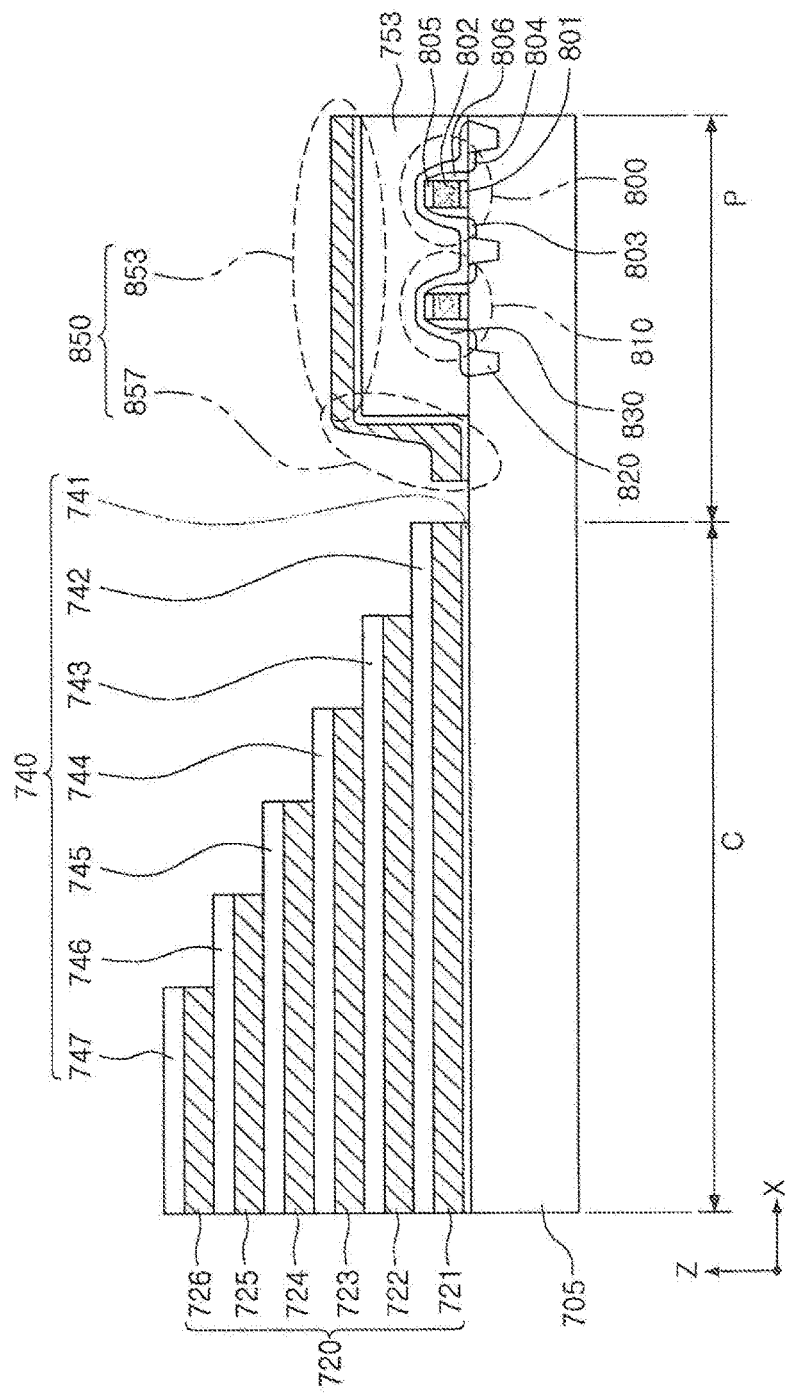

Referring to FIG. 13E, portions of the first insulating layer 741 and the first sacrificial layer 721 may remain on upper and side surfaces of the first interlayer insulating layer 753. Etching conditions for forming the plurality of pad areas, such as etch times, may be adjusted to allow portions of the first insulating layer 741 and the first sacrificial layer 721 to remain on the upper and side surfaces of the first interlayer insulating layer 753. The first sacrificial layer 721 may include silicon nitride, and accordingly serve to prevent mobile charges from flowing into the horizontal transistors 800 and 810. That is, the portions of the first sacrificial layer 721 remaining on the upper and side surfaces of the first interlayer insulating layer 753 may be provided as a first blocking layer 853 and a second blocking layer 857, respectively.

Referring to FIG. 13E, the blocking layer 850 may include the first and second blocking layers 853 and 857, and may be formed by retaining the portions of first sacrificial layer 721 in the peripheral cell region P. The first and second blocking layers 853 and 857 are illustrated as being connected to each other in FIG. 13E. However, the first and second blocking layers 853 and 857 may be separated each other at a corner of the first interlayer insulating layer 753 depending on the etching conditions for forming the plurality of pad areas. In addition, the blocking layer 850 may be separated from the plurality of sacrificial layers 720 and insulating layers 740 remaining in the cell region C to provide the pad areas.

Each of the first and second blocking layers 853 and 857 is illustrated as having a single layer in FIG. 13E. However, each of the first and second blocking layers 853 and 857 may have a plurality of layers depending on the etching conditions for forming the plurality of pad areas. That is, the first and second sacrificial layers 721 and 722, or more of the sacrificial layers 720 may remain on the upper and side surfaces of the first interlayer insulating layer 753 to be provided as the first and second blocking layer 853 and 857. The blocking layer 50 may be formed by adjusting process conditions for forming the pad areas to intentionally retain a portion of the sacrificial layers 720 or may be naturally formed in, such a manner that the portion of the sacrificial layers 720 remains on the upper and side surfaces of the first interlayer insulating layer 753 during the process of forming the pad areas.

Figure 13F:
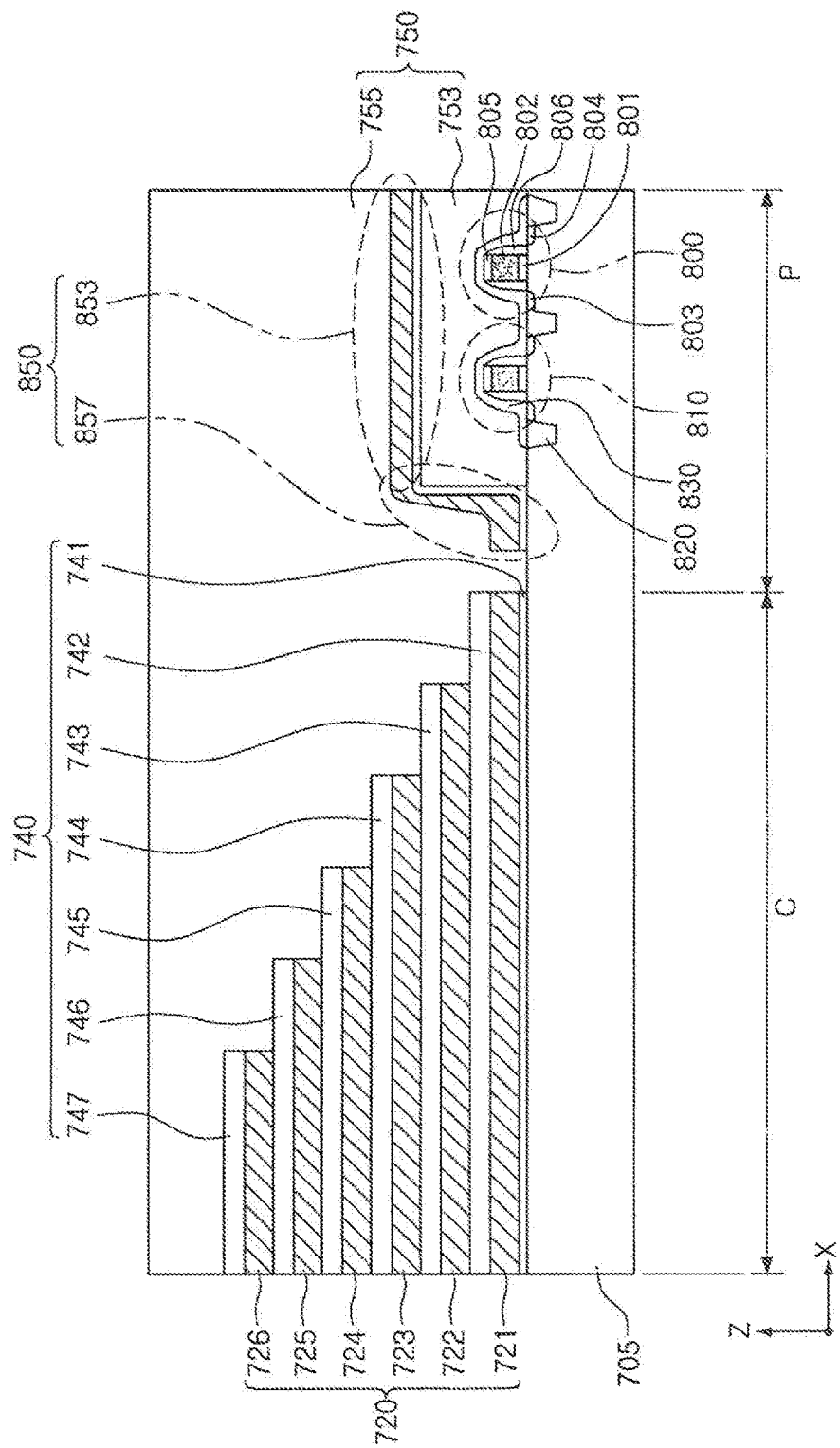

After the blocking layer 850 is formed, a second interlayer insulating layer 755 may be formed on the substrate 705. Referring to FIG. 13F, the second interlayer insulating layer 755 may be formed throughout the cell region C and the peripheral circuit region P, and may cover an upper surface of the uppermost insulating layer 747, The second interlayer insulating layer 755 may be formed of a TEOS oxide layer to reduce process time.

After the pad areas and the interlayer insulating layer 750 are formed as illustrated in FIG. 13F, a channel area 710, a plurality of gate electrode layers 730, a blocking layer 762, a charge storage layer 764, a tunneling layer 766, and contact plugs 770 and 840 may be formed by a method similar to that described with reference to FIGS. 9H to 9M.

Figure 14:
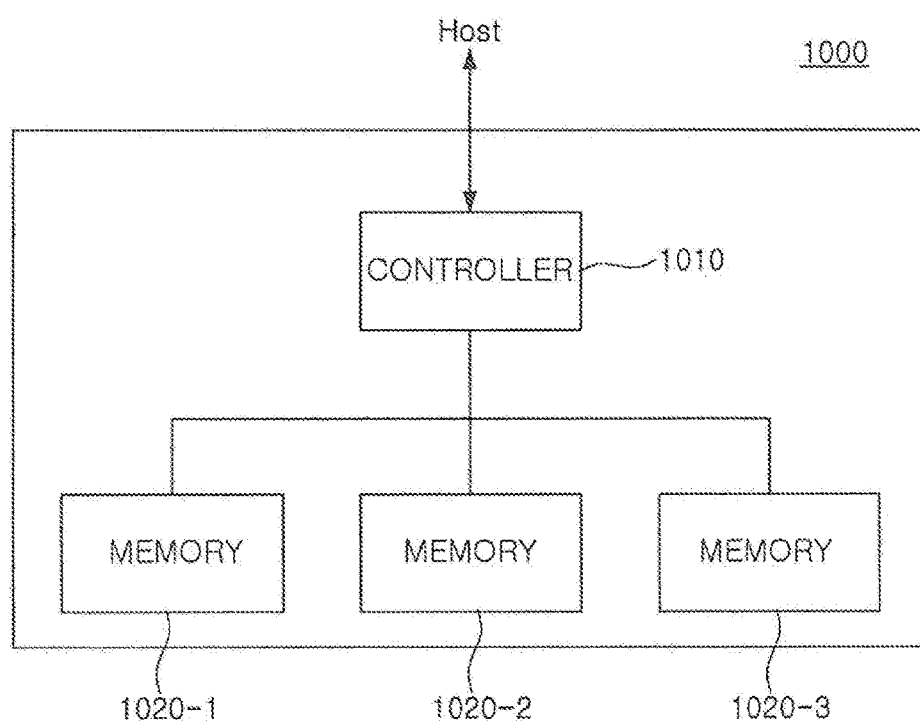
FIGS. 14 and 15 are block diagrams illustrating electronic apparatuses including memory devices according to an exemplary embodiment of the present inventive concept.

FIG. 14 is a block diagram illustrating a storage apparatus including a memory device according to an exemplary embodiment of the present inventive concept.

Referring to FIG. 14, a storage apparatus 1000 according to an exemplary embodiment of the present inventive concept may include a controller 1010 communicating with a host HOST, and memories 1020-1, 1020-2, and 1020-3 storing data Each of the memories 1020-1, 1020-2, and 1020-3 may include a memory device 100, 300, 500, or 700 according to the above-described various exemplary embodiments of the present inventive concept.

The host HOST communicating with the controller 1010 may be a variety of electronic apparatuses in which the storage apparatus 1000 is installed, for example, a smartphone, a digital camera, a desktop PC, a laptop computer, or a media player. The controller 1010 may receive a request for data reading or writing from the host HOST to generate a command CMD for writing data to the memories 1020-1, 1020-2, and 1020-3 or reading data from the memories 1020-1, 1020-2, and 1020-3.

As illustrated in FIG. 14, one or more memories 1020-1, 1020-2, and 1020-3 may be connected to the controller 1010 in parallel in the storage apparatus 1000. By connecting the plurality of memories 1020-1, 1020-2, and 1020-3 to the controller 1010 in parallel, the storage apparatus 1000 having a large capacity, such as a solid state drive (SSD) may be implemented.

Figure 15:
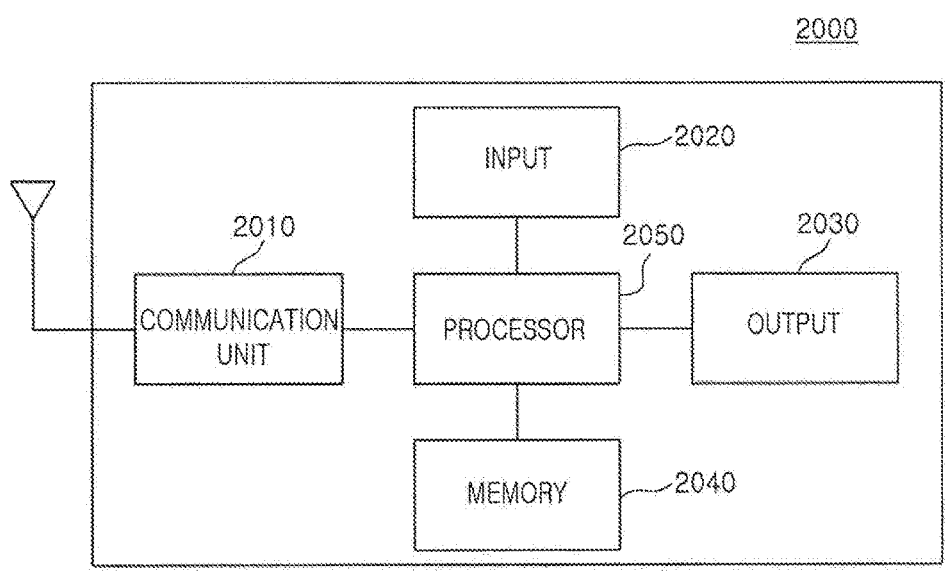

FIG. 15 is a block diagram illustrating an electronic apparatus including a memory device according to an exemplary embodiment of the present inventive concept.

Referring to FIG. 15, an electronic apparatus 2000 according to an exemplary embodiment of the present inventive concept may include a communication unit 2010, an input 2020, an output 2030, a memory 2040, and a processor 2050.

The communication unit 2010 may include a wired/wireless communications module, such as a wireless Internet module, a short-range communications module, a GPS module, or a mobile communications module. The wired/wireless communications module included in the communication unit 2010 may be connected to an external communications network by a variety of communications standards to transmit and receive data.

The input 2020 is a module supplied for a user to control an operation of the electronic apparatus 2000, and includes a mechanical switch, a touch screen, a voice recognition module, or the like. In addition, the input 2020 may include a trackball, a laser pointer mouse, or a finger mouse, and further include a variety of sensor modules in which a user can input data.

The output 2030 may output information processed by the electronic apparatus 2000 in an audio or video form, The memory 2040 may store a program for processing or controlling of the processor 2050, data, or the like. The memory 2040 may include one or more of the memory device 100, 300, 500, or 700 according to the above-described various exemplary embodiments of the present inventive concept. The processor 2050 may write data or read data by transmitting a command to the memory 2040 according to a required operation.

The memory 2040 may be embedded in the electronic apparatus 2000 or communicate with the processor 2050 through a separate interface. Then the memory 2040 communicates with the processor 2050 through the separate interface, the processor 2050 may write data to or read data from the memory 2040 by a variety of interface standards, such as SD, SDHC, SDXC, MICRO SD, or USB.

The processor 2050 may control operations of each unit included in the electronic apparatus 2000. The processor 2050 may perform controlling or processing operations related to voice calls, video calls, or data communication, or controlling or processing operations for multimedia playback and management. In addition, the processor 2050 may process an input transmitted through the input 2020 from a user, and output a result thereof through the output 2030. Further, the processor 2050 may write data required to control operations of the electronic apparatus 2000 to the memory 2040, or read the data from the memory 2040, as described above.

As set forth above, according to the exemplary embodiments of the present inventive concept, a memory device may simplify a process of forming an interlayer insulating layer as well as prevent generation of voids between gate electrodes of the plurality of circuit devices by forming a first interlayer insulating layer covering a plurality of circuit devices in a peripheral circuit region and then forming an blocking layer on an upper surface of the first interlayer insulating layer While exemplary embodiments have been shown and described above, it will be apparent to those skilled in the art that modifications and variations could be made without departing from the scope of the invention as defined by the appended claims.

What is claimed is:

1. A memory device, comprising:
a substrate comprising a cell region and a peripheral circuit region adjacent to the cell region;
a plurality of gate electrode layers and a plurality of insulating layers stacked on the substrate in the cell region;
a plurality of circuit devices on the substrate in the peripheral circuit region;
a first interlayer insulating layer on the plurality of circuit devices in the peripheral circuit region;
a blocking layer covering an upper surface and a side surface of the first interlayer insulating layer; and
a second interlayer insulating layer over an upper surface of the blocking layer,
wherein the second interlayer insulating layer is disposed on the substrate in the cell region and the peripheral circuit region and at least a portion of the second interlayer insulating layer is beside a side surface of the blocking layer between the cell region and the peripheral circuit region, and
wherein the second interlayer insulating layer is provided as a single continuous layer.

2. The memory device of claim 1, wherein the blocking layer is disposed only in the peripheral circuit region.

3. The memory device of claim 1, wherein the at least a portion of the second interlayer insulating layer is disposed at the same height as at least a portion of the first interlayer insulating layer, in a direction perpendicular to an upper surface of the substrate.

4. The memory device of claim 1, wherein a lower surface of the at least a portion of the second interlayer insulating layer is disposed lower than an upper surface of the first interlayer insulating layer.

5. The memory device of claim 4, wherein the lower surface of the at least a portion of the second interlayer insulating layer is disposed lower than a lower surface of a second portion of the second interlayer insulating layer on the plurality of circuit devices.

6. The memory device claim 1, wherein at least a portion of the blocking layer extends along a direction perpendicular to an upper surface of the substrate, between the first interlayer insulating layer and the second interlayer insulating layer.

7. The memory device of claim 1, wherein the blocking layer comprises a first blocking layer covering the upper surface of the first interlayer insulating layer, a second blocking layer extending from the first blocking layer and covering the side surface of the first interlayer insulating layer, and a third blocking layer extending from the second blocking layer toward the cell region, and
wherein the second blocking layer entirely covers the side surface of the first interlayer insulating layer.

8. The memory device of claim 1, wherein the blocking layer comprises a first blocking layer covering the upper surface of the first interlayer insulating layer, a second blocking layer extending from the first blocking layer and covering the side surface of the first interlayer insulating layer, and a third blocking layer extending from the second blocking layer toward the cell region, and
wherein a lower surface of the third blocking layer is lower than an upper surface of gate electrodes of the plurality of circuit devices.

9. The memory device of claim 1, wherein the blocking layer comprises a first blocking layer covering the upper surface of the first interlayer insulating layer, a second blocking layer extending from the first blocking layer and covering the side surface of the first interlayer insulating layer, and a third blocking layer extending from the second blocking layer toward the cell region, and wherein the blocking layer is provided as a single continuous layer.

10. A memory device, comprising:
a plurality of gate electrode layers and a plurality of insulating layers stacked on a substrate in a cell region;
a plurality of circuit devices on the substrate in a peripheral circuit region adjacent to the cell region;
a first interlayer insulating layer covering the plurality of circuit devices in the peripheral circuit region;
a blocking layer covering an upper surface and a side surface of the first interlayer insulating layer, the blocking layer comprising a first blocking layer covering the upper surface of the first interlayer insulating layer, a second blocking layer extending from the first blocking layer and covering the side surface of the first interlayer insulating layer, and a third blocking layer extending from the second blocking layer toward the cell region; and
a second interlayer insulating layer on the substrate in the cell region and in the peripheral circuit region,
wherein the second interlayer insulating layer comprises a first portion above the plurality of circuit devices, and a second portion between the cell region and the peripheral circuit region,
wherein a lower surface of the first portion of the second interlayer insulating layer is disposed higher than a lower surface of the second portion of the second interlayer insulating layer, and
wherein the blocking layer is provided as a single continuous layer.

11. The memory device of claim 10,
wherein a side surface of the third blocking layer is disposed substantially at the same level as a side surface of a lowermost gate electrode layer among the plurality of gate electrode layers.

12. The memory device of claim 10,
wherein the second portion of the second interlayer insulating layer is beside the second blocking layer and the third blocking layer.

13. The memory device of claim 10, wherein the lower surface of the second portion of the second interlayer insulating layer is contact with an upper surface of the substrate.

14. The memory device of claim 10, wherein a thickness of the second portion of the second interlayer insulating layer is greater than a thickness of the first portion of the second interlayer insulating layer, in a direction perpendicular to an upper surface of the substrate.

15. The memory device of claim 10, wherein the second interlayer insulating layer is provided as a single continuous layer.

16. The memory device of claim 10, wherein the upper surface of the first interlayer insulating layer is a curved surface corresponding to gate electrodes of the plurality of circuit devices.

17. A memory device, comprising:
a plurality of gate electrode layers and a plurality of insulating layers stacked on a substrate in a cell region;
a plurality of circuit devices on the substrate in a peripheral circuit region adjacent to the cell region;
a first interlayer insulating layer covering the plurality of circuit devices in the peripheral circuit region;
a blocking layer in the peripheral circuit region, wherein the blocking layer comprises a first blocking layer covering an upper surface of the first interlayer insulating layer, a second blocking layer extending from the first blocking layer and covering a side surface of the first interlayer insulating layer, and a third blocking layer extending from the second blocking layer toward the cell region; and
a second interlayer insulating layer covering a side surface of the third blocking layer facing the cell region, wherein the second interlayer insulating layer is disposed on the substrate in the cell region and in the peripheral circuit region,
wherein the second blocking layer is disposed between the first interlayer insulating layer and the second interlayer insulating layer, in a direction parallel to an upper surface of the substrate, and
wherein the blocking layer is provided as a single continuous layer.

18. The memory device of claim 17, wherein at least a portion of the second interlayer insulating layer is disposed below the upper surface of the first interlayer insulating layer in a direction perpendicular to the upper surface of the substrate.

19. The memory device of claim 17, wherein the second interlayer insulating layer is provided as a single continuous layer.

20. The memory device of claim 17, wherein the upper surface of the first interlayer insulating layer is a curved surface corresponding to gate electrodes of the plurality of circuit devices.

* * * * *